United States Patent
Komagata et al.

(10) Patent No.: US 10,734,487 B2
(45) Date of Patent: Aug. 4, 2020

(54) SEMICONDUCTOR DEVICE AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Hiroki Komagata, Atsugi (JP); Naoki Okuno, Sagamihara (JP); Yutaka Okazaki, Isehara (JP); Hiroshi Fujiki, Kudamatsu (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/247,631

(22) Filed: Jan. 15, 2019

(65) Prior Publication Data

US 2019/0229192 A1   Jul. 25, 2019

(30) Foreign Application Priority Data

Jan. 19, 2018   (JP) ................. 2018-006870

(51) Int. Cl.
*H01L 27/12* (2006.01)
*H01L 29/20* (2006.01)
(Continued)

(52) U.S. Cl.
CPC ...... *H01L 29/2006* (2013.01); *H01L 29/1079* (2013.01); *H01L 29/221* (2013.01);
(Continued)

(58) Field of Classification Search
None
See application file for complete search history.

(56) References Cited

U.S. PATENT DOCUMENTS 9,666,698 B2   5/2017   Yamazaki
9,960,261 B2   5/2018   Yamazaki
(Continued)

FOREIGN PATENT DOCUMENTS

JP   2016-181696 A   10/2016
WO   WO-2019/048984   3/2019

OTHER PUBLICATIONS

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics), Apr. 1, 2014, vol. 53, No. 4S, pp. 04ED18-1-04ED18-10.

(Continued)

*Primary Examiner* — Benjamin P Sandvik
(74) *Attorney, Agent, or Firm* — Robinson Intellectual Property Law Office; Eric J. Robinson

(57) ABSTRACT

A semiconductor device with a high on-state current is provided. The semiconductor device includes a first insulator over a substrate, an oxide over the first insulator, a second insulator over the oxide, a conductor overlapping with the oxide with the second insulator therebetween, a third insulator in contact with a top surface of the oxide, a fourth insulator in contact with a top surface of the third insulator, a side surface of the second insulator, and a side surface of the conductor, and a fifth insulator in contact with a side surface of the fourth insulator, a side surface of the third insulator, and the top surface of the oxide. The third insulator has a lower oxygen permeability than the fourth insulator.

15 Claims, 23 Drawing Sheets

(51) Int. Cl.
H01L 29/423 (2006.01)
H01L 29/786 (2006.01)
H01L 29/221 (2006.01)
H01L 29/10 (2006.01)
H01L 29/66 (2006.01)
H01L 29/778 (2006.01)
H01L 29/24 (2006.01)

(52) U.S. Cl.
CPC .. *H01L 29/42364* (2013.01); *H01L 29/42384* (2013.01); *H01L 29/66969* (2013.01); *H01L 29/7869* (2013.01); *H01L 29/78609* (2013.01); *H01L 29/78648* (2013.01); *H01L 29/78693* (2013.01); *H01L 29/24* (2013.01); *H01L 29/7782* (2013.01)

(56) References Cited

U.S. PATENT DOCUMENTS

| 2015/0041803 | A1 | 2/2015 | Endo et al. |
| 2015/0263174 | A1* | 9/2015 | Yamazaki ......... H01L 29/78696 257/43 |
| 2016/0218224 | A1 | 7/2016 | Ota et al. |
| 2016/0372606 | A1 | 12/2016 | Ito et al. |
| 2017/0053947 | A1* | 2/2017 | Makita .............. H01L 29/78606 |

OTHER PUBLICATIONS

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015. pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

\* cited by examiner

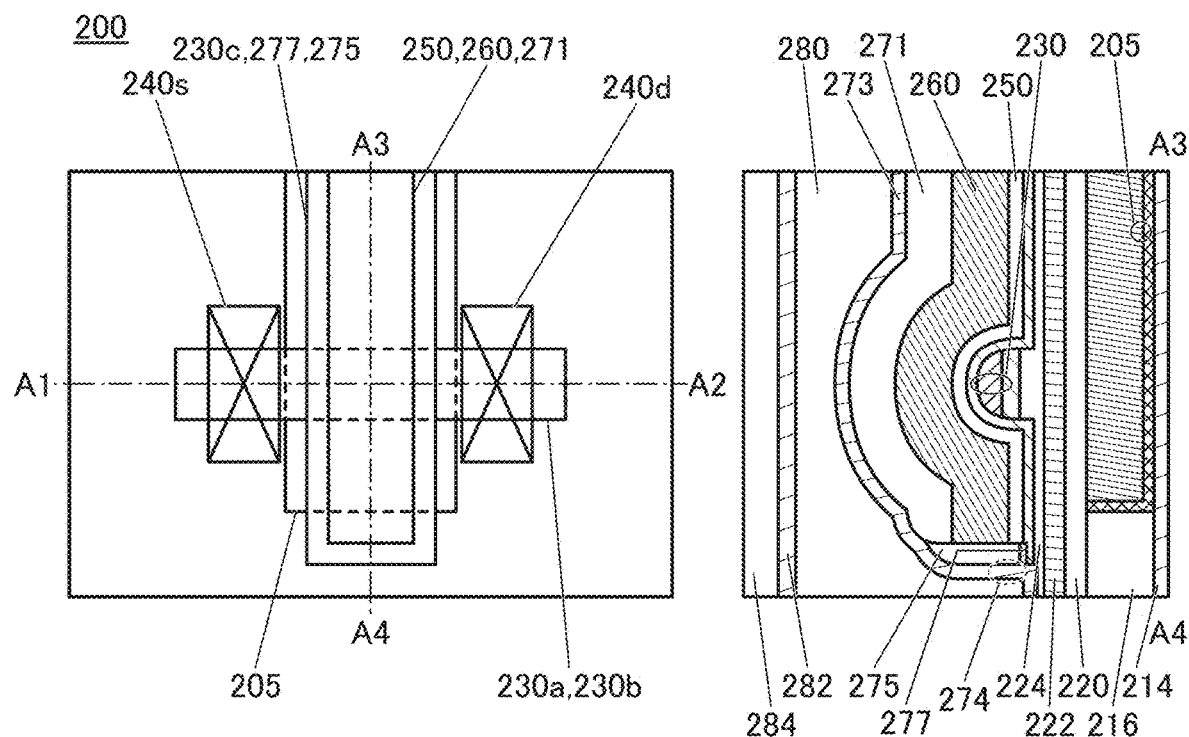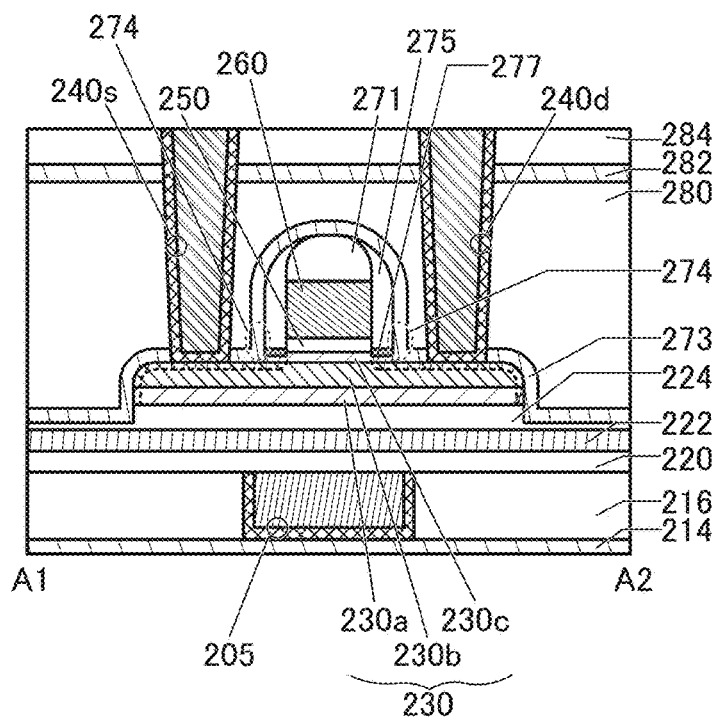

FIG. 19A
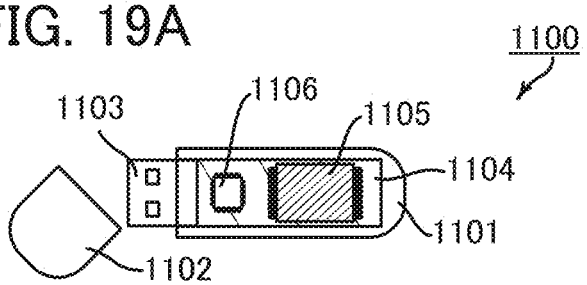
FIG. 19B
FIG. 19C
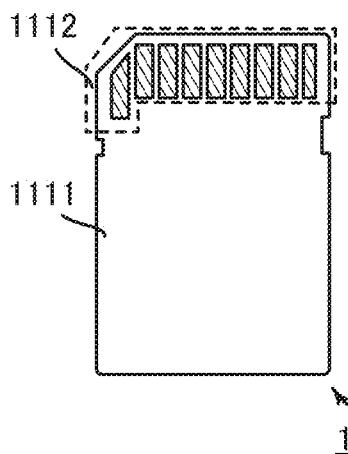
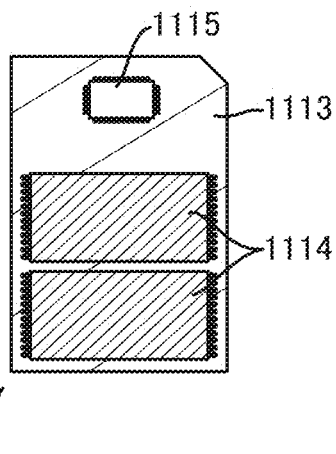
FIG. 19D
FIG. 19E
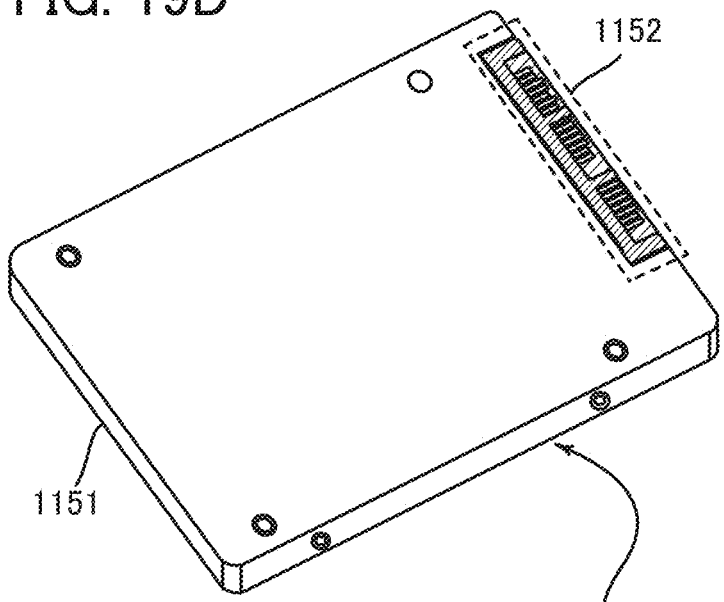
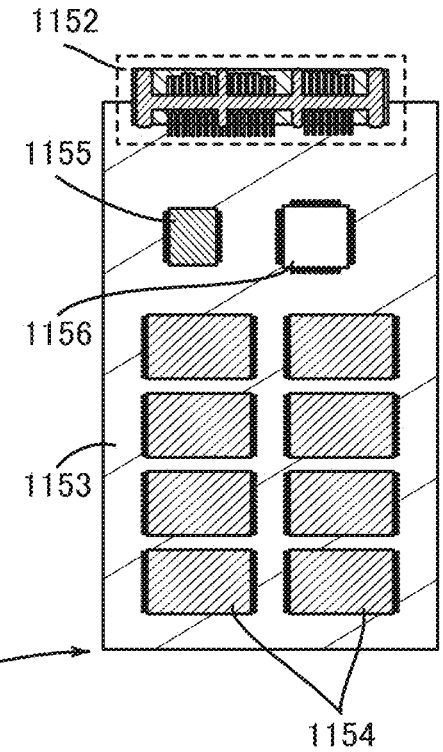

FIG. 20A
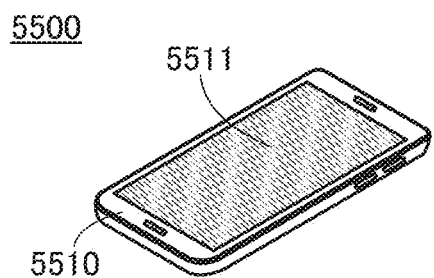
FIG. 20B
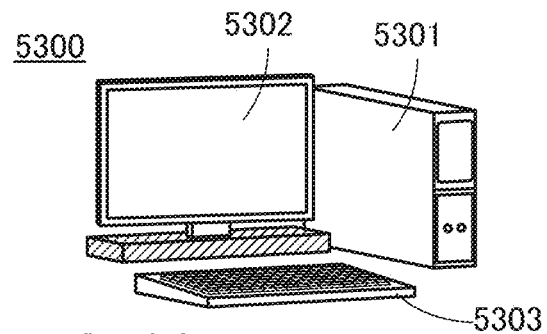
FIG. 20C
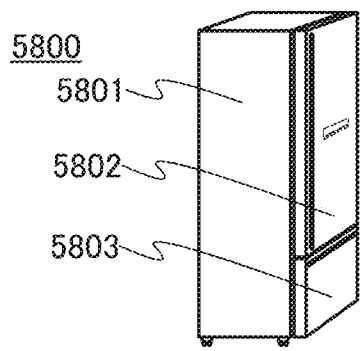
FIG. 20D
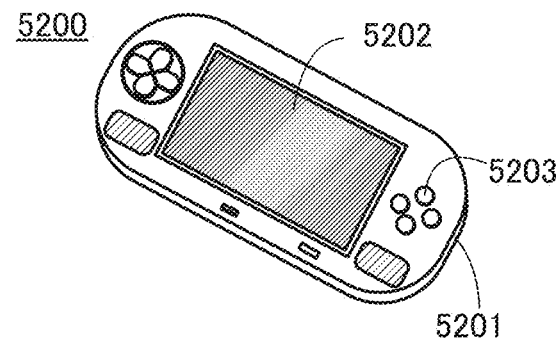
FIG. 20E1
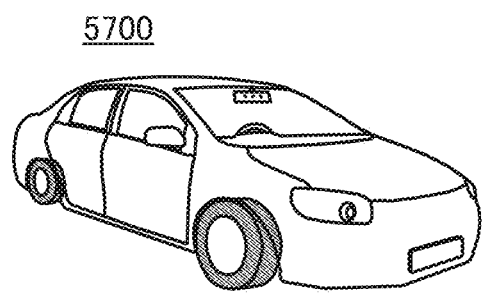
FIG. 20E2
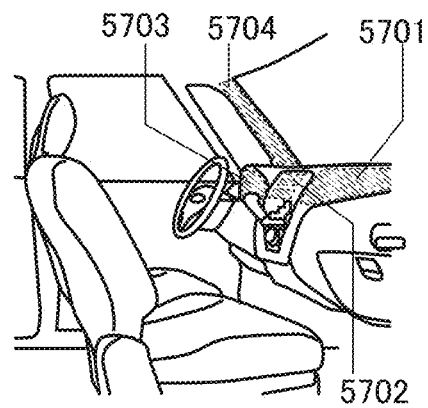
FIG. 20F
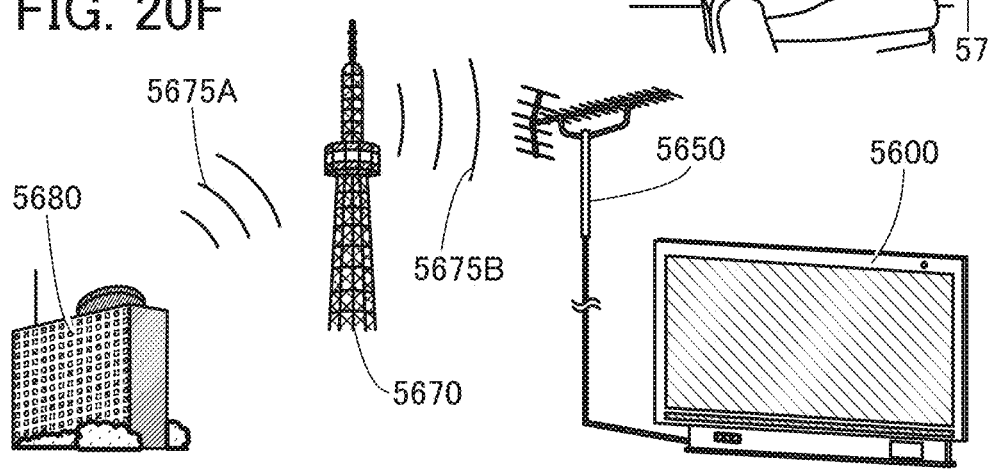

SEMICONDUCTOR DEVICE AND METHOD FOR MANUFACTURING SEMICONDUCTOR DEVICE

BACKGROUND OF THE INVENTION

1. Field of the Invention

One embodiment of the present invention relates to a semiconductor device and a manufacturing method thereof. Another embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of the semiconductor device. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

2. Description of the Related Art

As semiconductor thin films applicable to the transistors, silicon-based semiconductor materials have been widely used, but oxide semiconductors have been attracting attention as alternative materials. Examples of oxide semiconductors include not only single-component metal oxides, such as indium oxide and zinc oxide, but also multi-component metal oxides. Among the multi-component metal oxides, in particular, an In—Ga—Zn oxide (hereinafter also referred to as IGZO) has been actively studied.

From the studies on IGZO, in an oxide semiconductor, a c-axis aligned crystalline (CAAC) structure and a nanocrystalline (nc) structure, which are not single crystal nor amorphous, have been found (see Non-Patent Documents 1 to 3). In Non-Patent Documents 1 and 2, a technique for forming a transistor using an oxide semiconductor having a CAAC structure is disclosed. Moreover, Non-Patent Documents 4 and 5 disclose that a fine crystal is included even in an oxide semiconductor which has lower crystallinity than an oxide semiconductor having the CAAC structure or the nc structure.

In addition, a transistor which includes IGZO as an active layer has an extremely low off-state current (see Non-Patent Document 6), and an LSI and a display utilizing the characteristics have been reported (see Non-Patent Documents 7 and 8).

REFERENCES

Non-Patent Documents

[Non-Patent Document 1] S. Yamazaki et al., "SID Symposium Digest of Technical Papers", 2012, volume 43, issue 1, pp. 183-186.

[Non-Patent Document 2] S. Yamazaki et al., "Japanese Journal of Applied Physics", 2014, volume 53, Number 4S, pp. 04ED18-1-04ED18-10.

[Non-Patent Document 3] S. Ito et al., "The Proceedings of AM-FPD'13 Digest of Technical Papers", 2013, pp. 151-154.

[Non-Patent Document 4] S. Yamazaki et al., "ECS Journal of Solid State Science and Technology", 2014, volume 3, issue 9, pp. Q3012-Q3022.

[Non-Patent Document 5] S. Yamazaki, "ECS Transactions", 2014, volume 64, issue 10, pp. 155-164.

[Non-Patent Document 6] K. Kato et al., "Japanese Journal of Applied Physics", 2012, volume 51, pp. 021201-1-021201-7.

[Non-Patent Document 7] S. Matsuda et al., "2015 Symposium on VLSI Technology Digest of Technical Papers", 2015, pp. T216-T217.

[Non-Patent Document 8] S. Amano et al., "SID Symposium Digest of Technical Papers", 2010, volume 41, issue 1, pp. 626-629.

SUMMARY OF THE INVENTION

An object of one embodiment of the present invention is to provide a semiconductor device with a high on-state current. Another object of one embodiment of the present invention is to provide a semiconductor device with a favorable S-value. Another object of one embodiment of the present invention is to provide a semiconductor device with high frequency characteristics. Another object of one embodiment of the present invention is to provide a highly reliable semiconductor device. Another object of one embodiment of the present invention is to provide a semiconductor device that can be miniaturized or highly integrated. Another object of one embodiment of the present invention is to provide a semiconductor device with favorable electrical characteristics. Another object of one embodiment of the present invention is to provide a semiconductor device that can be manufactured with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device with low power consumption. Another object of one embodiment of the present invention is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first insulator over a substrate; an oxide over the first insulator; a second insulator over the oxide; a conductor overlapping with the oxide with the second insulator therebetween; a third insulator in contact with a top surface of the oxide; a fourth insulator in contact with a top surface of the third insulator, a side surface of the second insulator, and a side surface of the conductor; and a fifth insulator in contact with a side surface of the fourth insulator, a side surface of the third insulator, and the top surface of the oxide. The third insulator has a lower oxygen permeability than the fourth insulator.

In the above structure, the third insulator is preferably thinner than the second insulator. In the above structure, the third insulator is preferably thinner than the fifth insulator. In the above structure, at least part of a region of the oxide that overlaps with the third insulator has a higher carrier density than a region of the oxide that overlaps with the conductor.

In the above structure, the fifth insulator preferably includes a first region and a second region. It is preferable that the first region have a higher oxygen permeability than the second region and be in contact with the fourth insulator. In the above structure, the first region may be formed to face the second insulator with the fourth insulator therebetween. In the above structure, the fifth insulator in the first region may be thinner than the fifth insulator in the second region. In the above structure, the first region may have a lower density than the second region. In the above structure, the first region may include an opening reaching the third insulator. In the above structure, the fifth insulator may be split with the first region therebetween.

In the above structure, the third insulator and the fifth insulator may contain aluminum oxide. In the above structure, the oxide may contain In, an element M (M is Al, Ga, Y, or Sn), and Zn.

Another embodiment of the present invention is a manufacturing method of the semiconductor including the steps of: forming a first insulator over a substrate; forming an oxide over the first insulator; forming a second insulator over the oxide; forming a conductor over the second insulator; forming a third insulator over the oxide and a fourth insulator over the conductor at the same time by a sputtering method; forming a fifth insulator to cover the third insulator and the fourth insulator; anisotropically etching the third insulator, the fourth insulator, and the fifth insulator to form a sixth insulator over the oxide and a seventh insulator over the sixth insulator; and forming an eighth insulator over the seventh insulator and the oxide. The sixth insulator has a lower oxygen permeability than the seventh insulator.

In the above method, the third insulator may be formed using a target containing aluminum oxide.

According to one embodiment of the present invention, a semiconductor device with a high on-state current can be provided. According to one embodiment of the present invention, a semiconductor device with a favorable S-value can be provided. According to one embodiment of the present invention, a semiconductor device with high frequency characteristics can be provided. According to one embodiment of the present invention, a highly reliable semiconductor device can be provided. According to one embodiment of the present invention, a semiconductor device that can be miniaturized or highly integrated can be provided. According to one embodiment of the present invention, a semiconductor device with favorable electrical characteristics can be provided. According to one embodiment of the present invention, a semiconductor device that can be manufactured with high productivity can be provided.

According to one embodiment of the present invention, a semiconductor device capable of retaining data for a long time can be provided. According to one embodiment of the present invention, a semiconductor device capable of high-speed data writing can be provided. According to one embodiment of the present invention, a semiconductor device with high design flexibility can be provided. According to one embodiment of the present invention, a semiconductor device with low power consumption can be provided.

According to one embodiment of the present invention, a novel semiconductor device can be provided.

Note that the descriptions of these effects do not disturb the existence of other effects. In one embodiment of the present invention, there is no need to achieve all the effects. Other effects will be apparent from and can be derived from the description of the specification, the drawings, the claims, and the like.

BRIEF DESCRIPTION OF THE DRAWINGS

In the accompanying drawings:

FIGS. 1A to 1C are a top view and cross-sectional views illustrating a semiconductor device of one embodiment of the present invention;

FIGS. 19A to 19E are schematic views of memory devices of one embodiment of the present invention;

FIGS. 20A to 20D, FIGS. 20E1 and 20E2, and FIG. 20F each illustrate an electronic device of one embodiment of the present invention;

DETAILED DESCRIPTION OF THE INVENTION

Figure 2A:
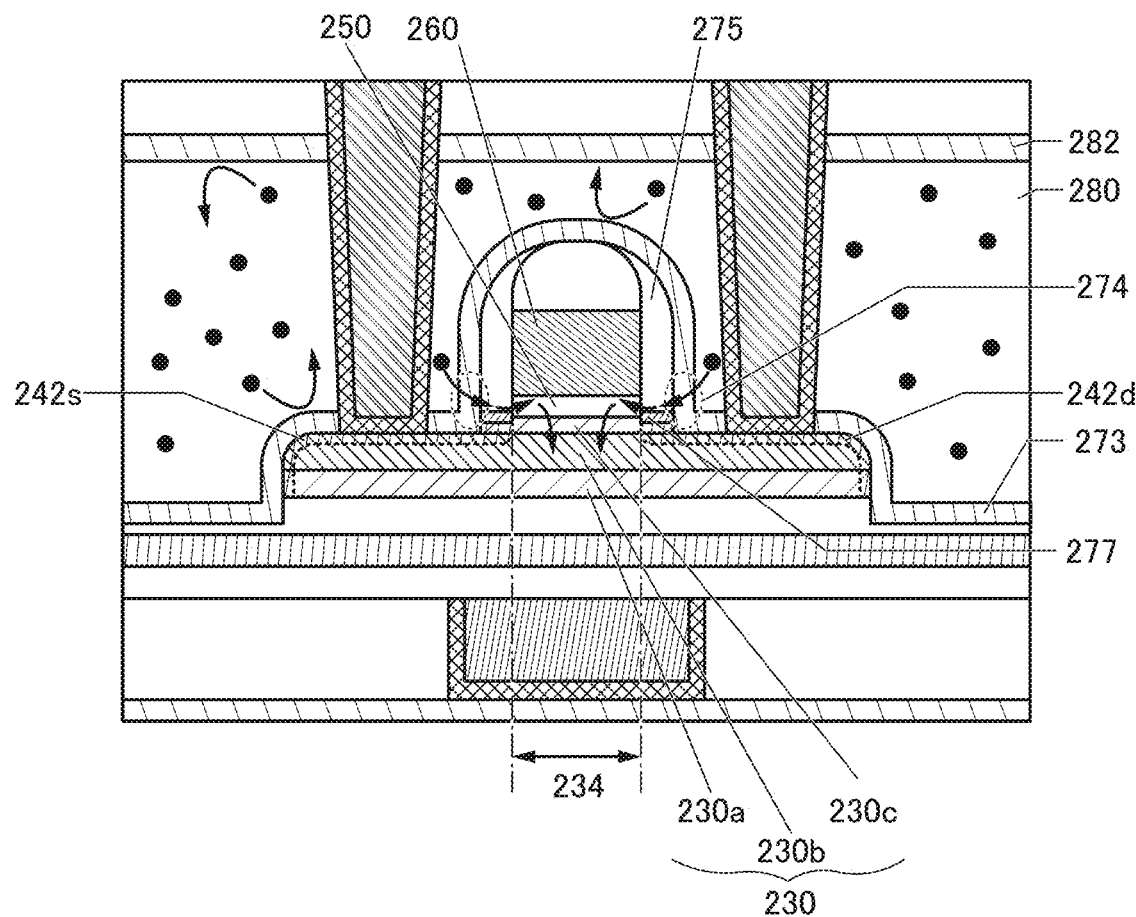
FIGS. 2A to 2C are cross-sectional views each illustrating a semiconductor device of one embodiment of the present invention.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which is not illustrated in some cases for easy understanding. In the drawings, the same portions or portions having similar functions are denoted by the same reference numerals in different drawings, and explanation thereof will not be repeated in some cases. The same hatching pattern is applied to portions having similar functions, and the portions are not denoted by specific reference numerals in some cases.

Especially in a top view (also referred to as a "plan view"), a perspective view, or the like, some components might not be illustrated for easy understanding of the invention. In addition, some hidden lines and the like might not be shown.

Note that the ordinal numbers such as "first" and "second" in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those used for specifying one embodiment of the present invention.

In this specification and the like, terms for describing arrangement, such as "over", "above", "under", and "below", are used for convenience in describing a positional relation between components with reference to drawings. Furthermore, the positional relationship between components changes as appropriate in accordance with the direction in which each component is described. Thus, the positional relation is not limited to that described with a term used in this specification and can be explained with other terms as appropriate depending on the situation.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

In this specification, in the case where an atomic ratio of elements of an oxide, a metal oxide, a compound, or the like is shown, the vicinity of the atomic ratio is included in some cases, unless otherwise specified. Here, the vicinity of the atomic ratio includes 50% or more and 150% or less of the proportion of each element. For example, in the case of the atomic ratio of [A]:[B]=2:1, the vicinity of the proportion of [A] includes 1 or more and 3 or less, and the vicinity of the proportion of [B] includes 0.5 or more and 1.5 or less. The vicinity of the atomic ratio also includes 80% or more and 120% or less of the proportion of each element. For example, in the case of the atomic ratio of [A]:[B]=2:1, the vicinity of the proportion of [A] includes 1.6 or more and 2.4 or less and the vicinity of the proportion of [B] includes 0.8 or more and 1.2 or less. The vicinity of the atomic ratio also includes 90% or more and 110% or less of the proportion of each element. For example, in the case of the atomic ratio of [A]:[B]=2:1, the vicinity of the proportion of [A] includes 1.8 or more and 2.2 or less and the vicinity of the proportion of [B] includes 0.9 or more and 1.1 or less.

Furthermore, functions of a source and a drain might be switched when a transistor of opposite polarity is employed or a direction of current flow is changed in circuit operation, for example. Therefore, the terms "source" and "drain" can be switched in some cases in this specification and the like.

Note that in this specification and the like, depending on the transistor structure, a channel width in a region where a channel is actually formed (hereinafter also referred to as an "effective channel width") is different from a channel width shown in a top view of a transistor (hereinafter also referred to as an "apparent channel width") in some cases. For example, in a transistor having a gate electrode covering the side surface of a semiconductor, an effective channel width is greater than an apparent channel width, and its influence cannot be ignored in some cases. For example, in a miniaturized transistor having a gate electrode covering the side surface of a semiconductor, the proportion of a channel formation region formed in the side surface of a semiconductor is increased. In that case, an effective channel width is greater than an apparent channel width.

In such a case, an effective channel width is difficult to estimate by measuring in some cases. For example, to estimate an effective channel width from a design value, it is necessary to assume that the shape of a semiconductor is a known one. Accordingly, in the case where the shape of a semiconductor is not known exactly, it is difficult to measure an effective channel width accurately.

In this specification, the simple term "channel width" denotes the apparent channel width in some cases. In other cases, the simple term "channel width" denotes an effective channel width. Note that the values of a channel length, a channel width, an effective channel width, an apparent channel width, and the like can be determined by analyzing a cross-sectional TEM image and the like.

Note that an impurity in a semiconductor refers to, for example, elements other than the main components of the semiconductor. For example, an element with a concentration lower than 0.1 atomic % can be regarded as an impurity. When an impurity is contained, the density of states (DOS)

in a semiconductor may be increased, or the crystallinity may be decreased. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. In the case of an oxide semiconductor, entry of impurities may lead to formation of oxygen vacancies, for example. When the semiconductor is silicon, examples of an impurity which changes the characteristics of the semiconductor include oxygen, Group 1 elements except hydrogen, Group 2 elements, Group 13 elements, and Group 15 elements.

Note that in this specification and the like, silicon oxynitride means a substance that contains more oxygen than nitrogen, and silicon nitride oxide means a substance that contains more nitrogen than oxygen.

In addition, in this specification and the like, the term "insulator" can be replaced with an insulating film or an insulating layer. Moreover, the term "conductor" can be replaced with a conductive film or a conductive layer. Furthermore, the term "semiconductor" can be replaced with a semiconductor film or a semiconductor layer.

In this specification and the like, the term "parallel" indicates that the angle formed between two straight lines is greater than or equal to −10° and less than or equal to 10°. Thus, the case where the angle is greater than or equal to −5° and less than or equal to 5° is also included. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°. Thus, the case where the angle is greater than or equal to 85° and less than or equal to 95° is also included. In addition, the term "substantially perpendicular" indicates that the angle formed between two straight lines is greater than or equal to 60° and less than or equal to 120°.

Note that in this specification, a barrier film refers to a film having a function of inhibiting the passage of oxygen and impurities such as water or hydrogen. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is called an oxide semiconductor in some cases. In other words, an OS FET or an OS transistor is a transistor including an oxide or an oxide semiconductor.

In this specification and the like, the term "normally off" means that current per micrometer of channel width flowing in a transistor when potential is not applied to a gate or the gate is supplied with a ground potential is lower than or equal to $1 \times 10^{-20}$ A at room temperature, lower than or equal to $1 \times 10^{-18}$ A at 85° C., or lower than or equal to $1 \times 10^{-16}$ A at 125° C.

Embodiment 1

An example of a semiconductor device including a transistor 200 of one embodiment of the present invention will be described below with reference to FIGS. 1A to 1C, FIGS. 2A to 2C, FIGS. 3A to 3C, FIGS. 4A to 4C, FIGS. 5A to 5C, FIGS. 6A to 6C, FIGS. 7A to 7C, FIGS. 8A to 8C, FIGS. 9A to 9C, FIGS. 10A to 10C, FIGS. 11A to 11C, FIGS. 12A to 12C, and FIGS. 13A to 13C.

<Structure Example of Semiconductor Device>

FIGS. 1A to 1C are a top view and cross-sectional views of the transistor 200 of one embodiment of the present invention and the periphery of the transistor 200.

FIG. 1A is a top view of the semiconductor device including the transistor 200. FIGS. 1B and 1C are cross-sectional views of the semiconductor device. FIG. 1B is a cross-sectional view taken along dashed-dotted line A1-A2 in FIG. 1A, which corresponds to a cross-sectional view in the channel length direction of the transistor 200. FIG. 1C is a cross-sectional view taken along dashed-dotted line A3-A4 in FIG. 1A, which corresponds to a cross-sectional view in the channel width direction of the transistor 200. Note that for simplification of the drawing, some components are not illustrated in the top view in FIG. 1A.

[Transistor 200]

As illustrated in FIGS. 1A to 1C, the transistor 200 includes: an insulator 224 over a substrate (not illustrated); an oxide 230 over the insulator 224; an insulator 250 over the oxide 230; a conductor 260 overlapping with the oxide 230 with the insulator 250 therebetween; an insulator 277 in contact with a top surface of the oxide 230; an insulator 275 in contact with a top surface of the insulator 277, a side surface of the insulator 250, and a side surface of the conductor 260; and an insulator 273 in contact with a side surface of the insulator 275, a side surface of the insulator 277, and the top surface of the oxide 230. Here, the insulator 277 has a lower oxygen permeability than the insulator 275. The transistor 200 preferably includes an insulator 271 over the conductor 260. The insulator 275 can also be referred to as a sidewall.

As illustrated in FIGS. 1A to 1C, an insulator 280 functioning as an interlayer film is preferably positioned over the insulator 273. It is also preferable that an insulator 282 be positioned over the insulator 280 and an insulator 284 be positioned over the insulator 282.

It is preferable that the transistor 200 include an insulator 214 over the substrate (not illustrated); a conductor 205 over the insulator 214; an insulator 216 positioned over the insulator 214 and in contact with a side surface of the conductor 205; an insulator 220 over the insulator 216 and the conductor 205; and an insulator 222 over the insulator 220. In that case, the insulator 220 is preferably provided to be in contact with the top surface of the conductor 205 and the top surface of the insulator 216. The insulator 224 is preferably provided over the insulator 222.

The insulators 222, 277, 273, and 282 preferably have a function of inhibiting diffusion of hydrogen (e.g., hydrogen atoms and hydrogen molecules). For example, the insulators 222, 277, 273, and 282 preferably have a lower hydrogen permeability than the insulators 224, 250, 275, and 280. The insulators 222, 277, 273, and 282 each preferably have a function of inhibiting diffusion of oxygen (e.g., oxygen atoms and oxygen molecules). For example, the insulators 222, 277, 273, and 282 preferably have a lower oxygen permeability than the insulators 224, 250, 275, and 280.

Furthermore, a conductor 240 (a conductor 240s and a conductor 240d) functioning as a plug, which is electrically connected to the transistor 200, is preferably provided. A first conductor of the conductor 240 may be provided in contact with an inner wall of an opening in the insulators 273, 280, 282, and 284, and a second conductor of the conductor 240 may be provided inside the first conductor of the conductor 240. Here, the top surface of the conductor 240 can be substantially level with the top surface of the insulator 284. Although the first conductor of the conductor 240 and the second conductor of the conductor 240 are stacked in the transistor 200, the present invention is not limited thereto. For example, the conductor 240 may have a single-layer structure or a stacked-layer structure of three or more layers. In the case where a stacked-layer structure is used, the layers may be distinguished by numbers corresponding to the formation order.

In the transistor 200 in FIGS. 1A to 1C, the oxide 230 is a stacked film including an oxide 230a in contact with a top surface of the insulator 224, an oxide 230b in contact with a top surface of the oxide 230a, and an oxide 230c in contact with a top surface of the oxide 230b. Although the transistor 200 in FIGS. 1A to 1C has a structure in which the oxides 230a, 230b, and 230c are stacked, the present invention is not limited thereto. For example, the transistor 200 may have a single-layer structure of the oxide 230b, a two-layer structure of the oxide 230b and the oxide 230a or 230c, or a stacked-layer structure of four or more layers. Each of the oxides 230a, 230b, and 230c may have a stacked-layer structure of two or more layers. For example, the oxide 230c may have a two-layer structure.

In the transistor 200, the oxide 230 (the oxide 230a, the oxide 230b, and the oxide 230c), which includes a channel formation region, is preferably formed using a metal oxide functioning as an oxide semiconductor (hereinafter also referred to as an oxide semiconductor). For example, the metal oxide to be the channel formation region of the oxide 230 has a band gap greater than or equal to 2 eV, preferably greater than or equal to 2.5 eV. With the use of a metal oxide having such a wide gap, leakage current in a non-conduction state (off-state current) of a transistor can be extremely small. With the use of such a transistor, a semiconductor device with low power consumption can be provided.

As the oxide 230, for example, a metal oxide such as an In-M-Zn oxide (M is one or more of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Alternatively, an indium oxide, a zinc oxide, an In—Ga oxide, an In—Zn oxide, a Ga—Zn oxide, or a gallium oxide may be used as the oxide 230.

When containing a metal element and impurities such as hydrogen and nitrogen, the oxide 230 might have increased carrier density to have reduced resistance. Furthermore, when the oxygen concentration of the oxide 230 decreases, the oxide 230 might have increased carrier density to have reduced resistance. For example, a region of the oxide 230 that is in contact with the conductor 240, the insulator 277, or the insulator 273 is partly reduced in resistance in some cases due to oxygen vacancies caused by damage during deposition. Furthermore, impurities such as hydrogen, nitrogen, or a metal element are added to the region during the deposition of the conductor 240, the insulator 277, or the insulator 273, whereby the region is partly reduced in resistance in some cases.

Here, an enlarged view of part of FIG. 1B is illustrated in FIG. 2A. In FIG. 2A and the like, black circles indicate oxygen and arrows indicate movement of oxygen.

As illustrated in FIG. 2A, the conductor 240, the insulator 277, or the insulator 273 is provided over and in contact with the oxide 230, and a region 242 (a region 242s and a region 242d) is provided as a low-resistance region at and in the vicinity of the interface between the oxide 230 and the conductor 240, the insulator 277, or the insulator 273. The region 242 functions as a source region and a drain region of the transistor 200. A region 234 of the oxide 230 that overlaps with the conductor 260 functions as the channel formation region of the transistor 200.

The region 242 functioning as the source region and the drain region has an increased carrier concentration due to a low oxygen concentration or a metal element and impurities such as hydrogen and nitrogen contained therein, and thus has a reduced resistance. In other words, the region 242 has higher carrier density and lower resistance than the region 234 functioning as the channel formation region. Thus, the concentration of at least one of a metal element and the impurities such as hydrogen and nitrogen in the region 242 is preferably higher than that in the region 234.

Note that in FIG. 2A, the region 242 is formed in the vicinity of the interface between the oxide 230 and the conductor 240, the insulator 277, or the insulator 273; however, one embodiment of the present invention is not limited thereto. For example, the region may be expanded in a direction substantially perpendicular to the top surface of the oxide 230. Although the boundaries between the regions are illustrated as being substantially perpendicular to the top surface of the oxide 230 in FIG. 2A, this embodiment is not limited thereto. For example, the region 242 may project to the conductor 260 side in the vicinity of the surface of the oxide 230b, and the region 242 may recede to the conductor 240s or 240d side in the vicinity of the bottom surface of the oxide 230b.

In the oxide 230, the boundaries between the regions are difficult to clearly observe in some cases. The concentration of a metal element and an impurity element such as hydrogen or nitrogen, which is detected in each region, may be gradually changed (such a change is also referred to as gradation) not only between the regions but also in each region. That is, the region closer to the channel formation region preferably has a lower concentration of a metal element and an impurity element such as hydrogen or nitrogen.

A transistor formed using an oxide semiconductor is likely to have its electrical characteristics changed by impurities and oxygen vacancies in a channel formation region of the oxide semiconductor, which might adversely affect the reliability in some cases. Moreover, if the channel formation region of the oxide semiconductor includes oxygen vacancies, the transistor tends to have normally-on characteristics. Thus, oxygen vacancies in the region 234 where a channel is formed are preferably reduced as much as possible.

In order to inhibit a transistor from becoming normally on, an insulator including a region containing oxygen, which is released by heating, is provided in contact with the oxide 230, and the oxygen contained in the insulator may be diffused into the oxide 230 by heat treatment. In this specification, oxygen that is released by heating is referred to as excess oxygen in some cases. For example, oxygen may be added to the insulator 280, and excess oxygen contained in the insulator 280 may be diffused by heat treatment. Thus, oxygen is supplied to the oxide 230 and the oxygen can reduce oxygen vacancies in the oxide 230, so that the transistor can be inhibited from becoming normally on.

On the other hand, when excess oxygen is supplied to the oxide 230, the structure of the excess oxygen in the oxide 230 might be changed by the stress such as a voltage or a high temperature. Thus, the transistor including the oxide 230 might have unstable electrical characteristics or lower reliability.

In this embodiment, oxygen contained in the insulator 275 is diffused into the oxide 230 through the insulator 250 to be supplied thereto. Accordingly, the amount of oxygen supplied to the oxide 230 is controlled to inhibit excessive supply of oxygen to the oxide 230. Thus, oxygen vacancies in the region 234 of the oxide 230 can be reduced, so that the transistor 200 can be inhibited from becoming normally on, leading to an improvement in reliability.

Since the insulator 277 is provided in contact with the bottom surface of the insulator 275 as described above, oxygen contained in the insulator 275 is diffused into the oxide 230 not directly but through the insulator 250 as illustrated in FIG. 2A. This inhibits oxygen from being diffused directly into the region of the region 242 that overlaps with the insulator 275 and the insulator 277, and the region 242 from being excessively oxidized. As a result, at least part of the region of the region 242 that overlaps with the insulator 275 and the insulator 277 has a higher carrier density than the region 234. In other words, while oxygen is supplied to the region 234, the region 242 with a high carrier density can be kept in a region of the oxide 230 that overlaps with the insulator 275 and the insulator 277.

With such a structure, an offset region is prevented from being formed between the channel formation region and the source region or the drain region in the oxide 230, so that an effective channel length can be inhibited from being longer than the width of the conductor 260. Accordingly, the transistor 200 can have a higher on-state current, a favorable S-value, and higher frequency characteristics.

Furthermore, a region 274 with high oxygen permeability is preferably included in at least part of the insulator 273 that is in contact with the insulator 275. The region 274 has higher oxygen permeability than the other regions of the insulator 273 (e.g., regions of the insulator 273 that are in contact with the oxide 230).

As illustrated in the FIG. 2A, the region 274 is preferably in contact with the side surface of the insulator 275. With such a structure, a sufficient amount of oxygen can be supplied to the insulator 275 from the insulator 280 containing oxygen, which is released by heating, through the region 274. For example, the region 274 is preferably formed to face the insulator 250 with the insulator 275 therebetween. In that case, the region 274 can be regarded as a region of the insulator 273 that faces the insulator 250 with the insulator 275 therebetween. Accordingly, the distance between the region 274 and the side surface of the insulator 250 can be shortened, so that oxygen diffused from the region 274 into the insulator 250 is less likely to be absorbed by the conductor 260.

As described above, since the insulator 273 is less likely to transmit oxygen, oxygen contained in the insulator 280 cannot directly enter the insulator 271, the insulator 275, the conductor 260, the insulator 250, and the top surface or the side surface of the oxide 230. Since the insulator 282 is also less likely to transmit oxygen, upward diffusion of oxygen contained in the insulator 280 is inhibited. Thus, as illustrated in FIG. 2A, oxygen contained in the insulator 280 is diffused into the insulator 275 and the insulator 250 through the region 274 of the insulator 273, which is more likely to transmit oxygen than the other regions, and then diffused into the oxide 230. In this manner, an appropriate amount of oxygen can be supplied to the region 234 functioning as the channel formation region. Thus, oxygen vacancies in the region 234 of the oxide 230 can be reduced, so that the transistor 200 can be inhibited from becoming normally on, leading to an improvement in reliability.

Figure 2B:
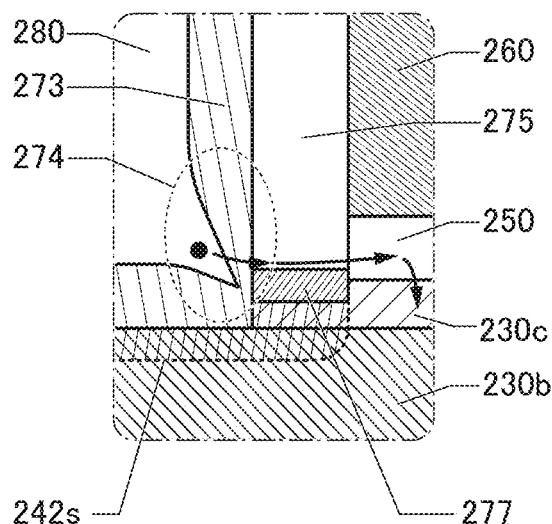

A specific shape of the region 274 is described below. For example, as illustrated in FIG. 2B, the region 274 is sometimes formed as a depressed portion in which the insulator 273 is locally thinner than the other region. In that case, the thinnest portion in the region 274 is preferably thinner than a portion of the insulator 273 that is in contact with the oxide 230.

Figure 2C:
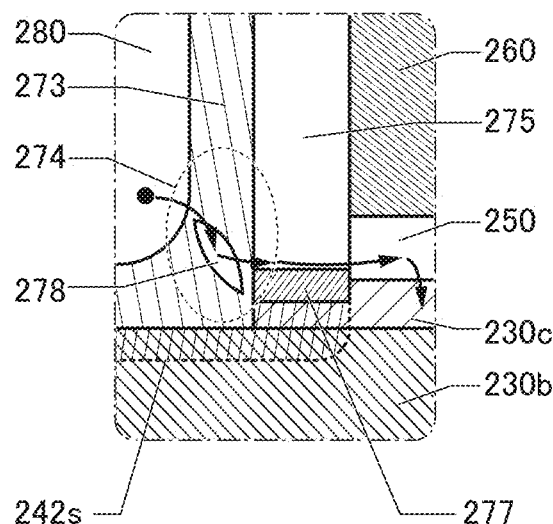

In another case, for example, as illustrated in FIG. 2C, a hole 278 is formed in the region 274 and the density of the region 274 is lower than that of the other region of the insulator 273. In that case, the density of the region 274 is preferably lower than that of a region where the insulator 273 is in contact with the oxide 230.

Figure 3A:
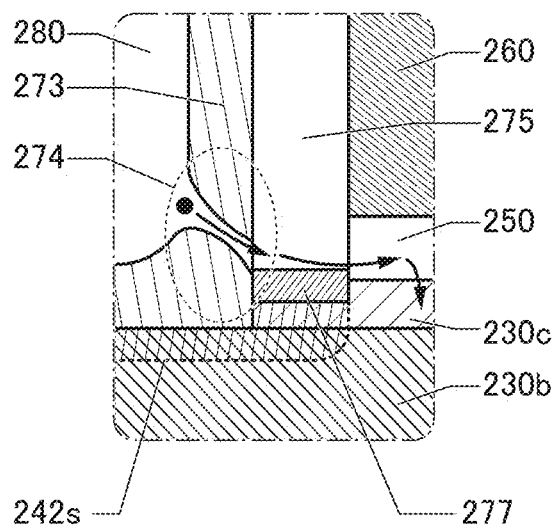
FIGS. 3A and 3B are cross-sectional views each illustrating a semiconductor device of one embodiment of the present invention.
Figure 3B:
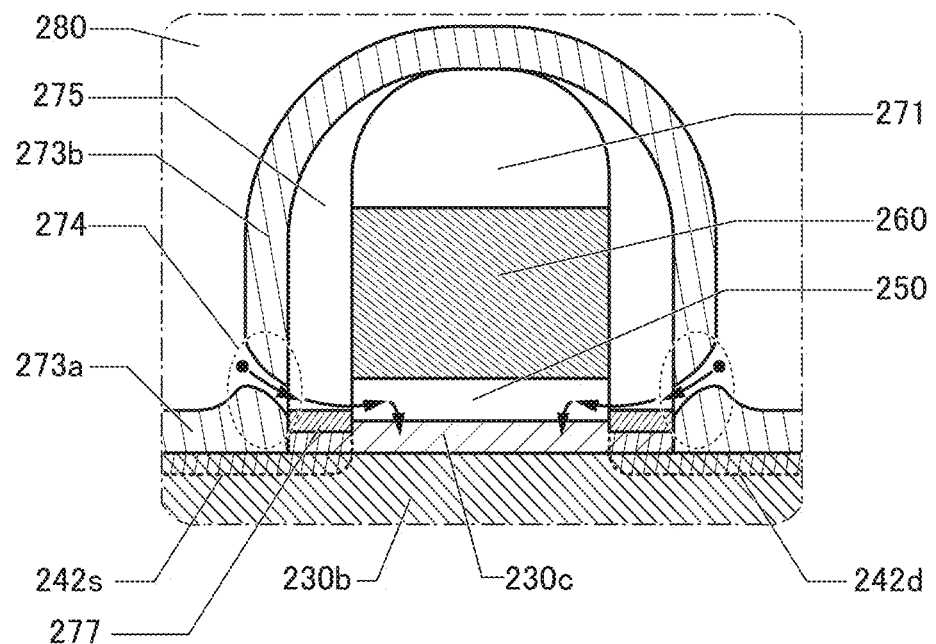

Alternatively, as illustrated in FIG. 3A, an opening reaching the insulator 275 may be formed in the region 274. In that case, the insulator 280 is preferably in contact with the insulator 275 through the opening. When a wide opening is formed, the insulator 273 is split into a lower insulator 273a and an upper insulator 273b with the region 274 therebetween, as illustrated in FIG. 3B.

The region 274 may be formed as a poor coverage portion of the insulator 273 in the vicinity of the step portion formed of the oxide 230, the insulator 277, and the insulator 275. However, without being limited thereto, the region 274 illustrated in FIGS. 2B and 2C and FIGS. 3A and 3B may be formed by processing after formation of the insulator 273. For example, the opening reaching the insulator 275 may be formed by performing a lithography process on the insulator 273.

In FIG. 2A and the like, the excess oxygen contained in the insulator 280 is supplied to the insulator 275 through the region 274; however, the present invention is not limited thereto. For example, when the insulator 275 contains a sufficient amount of oxygen, the region 274 is not necessarily provided in the insulator 273.

Accordingly, a semiconductor device including a transistor with a high on-state current can be provided. Alternatively, a semiconductor device including a transistor with a low off-state current can be provided. Alternatively, a semiconductor device that has small variation in electrical characteristics, i.e., stable electrical characteristics, and has high reliability can be provided.

The structure of the semiconductor device including the transistor 200 of one embodiment of the present invention will be described in detail below.

The conductor 205 is positioned to overlap with the oxide 230 and the conductor 260. Moreover, the conductor 205 is preferably provided over the insulator 214. The conductor 205 is preferably provided to be embedded in the insulator 216. Here, the conductor 205 preferably has favorable planarity. For example, the average surface roughness (Ra) of the top surface of the conductor 205 is less than or equal to 1 nm, preferably less than or equal to 0.5 nm, and further preferably less than or equal to 0.3 nm. This allows improving the planarity of the insulator 224 formed over the conductor 205 and increasing the crystallinity of the oxides 230a, 230b, and 230c.

Here, the conductor 260 functions as a first gate (also referred to as a top gate) electrode in some cases. The conductor 205 functions as a second gate (also referred to as a bottom gate) electrode in some cases.

For example, when different potentials are applied to the first gate electrode and the second gate electrode of the transistor, the threshold voltage of the transistor can be controlled. For example, when a negative potential is applied to the second gate electrode, the threshold voltage of the transistor can be higher than 0 V, and the off-state current can be reduced. That is, when a negative potential is applied to the second gate electrode, a drain current when the potential applied to the first gate electrode is 0 V can be reduced.

Here, as described in this embodiment, when an offset region is not formed between the channel formation region and the source region or the drain region of the oxide 230, an increase in S-value of the transistor 200 when a negative potential is applied to the second gate electrode can be inhibited. As a result, the transistor 200 can have increased switching speed and excellent frequency characteristics.

Note that as illustrated in FIG. 2A, the conductor 205 is preferably larger than the region 234 of the oxide 230. As illustrated in FIG. 1C, it is particularly preferable that the conductor 205 extend beyond the end portion of the region 234 of the oxide 230 that intersects with the channel width direction. That is, the conductor 205 and the conductor 260 preferably overlap with each other with the insulator positioned therebetween in an outer region of the side surface of the oxide 230 in the channel width direction.

With such a structure, the channel formation region of the region 234 can be electrically surrounded by the electric field of the conductor 260 functioning as the first gate electrode and the electric field of the conductor 205 functioning as the second gate electrode.

As illustrated in FIG. 1C, the conductor 205 is extended to have a function of a wiring. However, without limitation to the structure, a conductor functioning as a wiring may be provided under the conductor 205.

In the conductor 205, it is preferable that a first conductor be formed in contact with an inner wall of an opening in the insulator 216 and a second conductor be formed inside the first conductor. Here, the top surfaces of the first and second conductors can be substantially level with the top surface of the insulator 216. Although the first conductor and the second conductor of the conductor 205 are stacked in the transistor 200, the present invention is not limited thereto. For example, the conductor 205 may have a single-layer structure or a stacked-layer structure of three or more layers.

The first conductor of the conductor 205 is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, a conductive material through which the above impurities are less likely to pass. Alternatively, the first conductor of the conductor 205 is preferably formed using a conductive material having a function of inhibiting diffusion of oxygen (e.g., oxygen atoms or oxygen molecules), that is, a conductive material through which the oxygen is less likely to pass. Note that in this specification, a function of inhibiting diffusion of impurities or oxygen means a function of inhibiting diffusion of any one or all of the above impurities and the above oxygen.

When the first conductor of the conductor 205 has a function of inhibiting diffusion of oxygen, the second conductor of the conductor 205 can be inhibited from having a lowered conductivity due to oxidation. As a conductive material having a function of inhibiting diffusion of oxygen, for example, tantalum, tantalum nitride, ruthenium, ruthenium oxide, or the like is preferably used. Thus, the first conductor of the conductor 205 may be a single layer or a stacked layer of the above conductive materials. Thus, impurities such as hydrogen or water can be inhibited from being diffused into the transistor 200 side through the conductor 205.

A conductive material containing tungsten, copper, or aluminum as its main component is preferably used for the second conductor of the conductor 205. Note that the second conductor of the conductor 205 is a single layer in the drawing but may have a stacked-layer structure, for example, a stacked layer of any of the above conductive materials and titanium or titanium nitride.

The insulator 214 preferably functions as a barrier insulating film for inhibiting impurities such as water or hydrogen from entering the transistor 200 from the substrate side. Accordingly, the insulator 214 is preferably formed using an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, an insulating material through which the above impurities are less likely to pass. Alternatively, the insulator 214 is preferably formed using an insulating material having a function of inhibiting diffusion of oxygen (e.g., oxygen atoms or oxygen molecules), that is, an insulating material through which the oxygen is less likely to pass.

For example, aluminum oxide, silicon nitride, or the like is preferably used for the insulator 214. Accordingly, impurities such as hydrogen or water can be inhibited from being diffused into the transistor 200 side from the substrate side through the insulator 214. In addition, oxygen contained in the insulator 224 and the like can be inhibited from being diffused into the substrate side from the transistor 200 side through the insulator 214.

The permittivity of each of the insulators 216, 280, and 284 functioning as an interlayer film is preferably lower than that of the insulator 214. In the case where a material having a low permittivity is used for an interlayer film, the parasitic capacitance between wirings can be reduced. For example, for the insulators 216, 280, and 284, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like may be used as appropriate.

The insulators 220, 222, and 224 each function as a gate insulator.

Here, it is preferable that the insulator 224 in contact with the oxide 230 release oxygen by heating. For example, silicon oxide, silicon oxynitride, or the like may be used for the insulator 224 as appropriate. When such an insulator containing oxygen is provided in contact with the oxide 230, oxygen vacancies in the oxide 230 can be reduced, leading to an improvement in reliability of the transistor 200.

As illustrated in FIG. 1C, the insulator 224 in a region that does not overlap with the oxide 230b is preferably thinner than the insulator 224 in the other region. With such a structure, the lower end portion of the conductor 260 can be positioned lower, and thus, the electric field of the conductor 260 functioning as the first gate electrode is easily applied to the side surface of the oxide 230. Accordingly, the transistor 200 can have higher on-state current and higher frequency characteristics. Alternatively, the insulator 224 may have an island shape to overlap with the oxide 230b and the oxide 230a.

The insulator 222 as well as the insulator 214 and the like preferably functions as a barrier insulating film that inhibits impurities such as water or hydrogen from entering the transistor 200 from the substrate side. For example, the insulator 222 preferably has a lower hydrogen permeability than the insulator 224. When the insulator 224, the oxide 230, the insulator 250, and the like are surrounded by the insulator 222 and the insulator 273, impurities such as water or hydrogen can be inhibited from entering the transistor 200 from outside.

Furthermore, the insulator 222 preferably has a function of inhibiting diffusion of oxygen (e.g., oxygen atoms and oxygen molecules). That is, the above oxygen is less likely to pass through the insulator 222. For example, the insulator 222 preferably has a lower oxygen permeability than the insulator 224. When the insulator 222 has a function of inhibiting diffusion of oxygen, diffusion of oxygen contained in the oxide 230 to the substrate side can be inhibited. Furthermore, the conductor 205 can be inhibited from reacting with oxygen in the insulator 224 or the oxide 230.

As the insulator 222, an insulator containing an oxide of one or both of aluminum and hafnium that is an insulating material is preferably used. For the insulator containing an oxide of one or both of aluminum and hafnium, aluminum oxide, hafnium oxide, an oxide containing aluminum and hafnium (hafnium aluminate), or the like is preferably used. The insulator 222 formed of such a material functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

The insulator 222 may have a single-layer structure or a stacked-layer structure using an insulator containing what is called a high-k material such as aluminum oxide, hafnium oxide, tantalum oxide, zirconium oxide, lead zirconate titanate (PZT), strontium titanate ($SrTiO_3$), or (Ba,Sr)$TiO_3$ (BST). With miniaturization and high integration of a transistor, a problem such as generation of leakage current may arise because of a thin gate insulator. When a high-k material is used for an insulator functioning as the gate insulator, a gate potential at the time of operating the transistor can be reduced while the physical thickness of the gate insulator is kept.

It is preferable that the insulator 220 be thermally stable. For example, silicon oxide and silicon oxynitride are suitable because of their thermal stability.

Furthermore, combination of an insulator which is a high-k material and silicon oxide or silicon oxynitride enables the insulator 220 to have a stacked-layer structure with thermal stability and a high dielectric constant.

Note that the insulators 220, 222, and 224 may each have a stacked-layer structure of two or more layers. In that case, the stacked layers are not necessarily formed of the same material and may be formed of different materials.

The oxide 230 includes the oxide 230a, the oxide 230b over the oxide 230a, and the oxide 230c over the oxide 230b. Here, in a top view, the side surface of the oxide 230c is aligned with the side surfaces of the insulator 275 and the insulator 277. When the oxide 230a is provided under the oxide 230b, impurities can be inhibited from being diffused into the oxide 230b from the components formed below the oxide 230a. When the oxide 230c is provided over the oxide 230b, impurities can be inhibited from being diffused into the oxide 230b from the components formed above the oxide 230c.

The oxide 230 preferably has a stacked-layer structure of oxides which differ in the atomic ratio of metal elements. Specifically, the atomic ratio of the element M to constituent elements in the metal oxide used as the oxide 230a is preferably greater than that in the metal oxide used as the oxide 230b. Moreover, the atomic ratio of the element M to In in the metal oxide used as the oxide 230a is preferably greater than that in the metal oxide used as the oxide 230b. Moreover, the atomic ratio of In to the element M in the metal oxide used as the oxide 230b is preferably greater than that in the metal oxide used as the oxide 230a. The oxide 230c can be formed using a metal oxide which can be used as the oxide 230a or 230b.

The energy of the conduction band minimum of each of the oxides 230a and 230c is preferably higher than that of the oxide 230b. In other words, the electron affinity of each of the oxides 230a and 230c is preferably smaller than that of the oxide 230b.

Here, the energy level of the conduction band minimum is gradually varied at a junction portion of each of the oxides 230a, 230b, and 230c. In other words, the energy level of the conduction band minimum at a junction portion of each of the oxides 230a, 230b, and 230c is continuously varied or continuously connected. To vary the energy level gradually, the density of defect states in a mixed layer formed at the interface between the oxides 230a and 230b and the interface between the oxides 230b and 230c is decreased.

Specifically, when the oxides 230a and 230b or the oxides 230b and 230c contain the same element (as a main component) in addition to oxygen, a mixed layer with a low density of defect states can be formed. For example, in the case where the oxide 230b is an In—Ga—Zn oxide, it is preferable to use an In—Ga—Zn oxide, a Ga—Zn oxide, gallium oxide, or the like as each of the oxides 230a and 230c. The oxide 230c may have a stacked-layer structure. For example, the oxide 230c has a stacked-layer structure of an In—Ga—Zn oxide and a Ga—Zn oxide over the In—Ga—Zn oxide, or a stacked-layer structure of an In—Ga—Zn oxide and a gallium oxide over the In—Ga—Zn oxide. In other words, the oxide 230c may have a stacked-layer structure of an In—Ga—Zn oxide and an oxide that does not contain In.

Specifically, as the oxide 230a, a metal oxide having an atomic ratio of In:Ga:Zn=1:3:4 or In:Ga:Zn=1:1:0.5 can be used. As the oxide 230b, a metal oxide having an atomic ratio of In:Ga:Zn=4:2:3 or In:Ga:Zn=3:1:2 can be used. As the oxide 230c, a metal oxide having an atomic ratio of In:Ga:Zn=1:3:4, In:Ga:Zn=4:2:3, Ga:Zn=2:1, or Ga:Zn=2:5 can be used. Furthermore, as a specific example of the oxide 230c having a stacked-layer structure, a stacked-layer structure of a layer having an atomic ratio of In:Ga:Zn=4:2:3 and a layer having an atomic ratio of Ga:Zn=2:1, a stacked-layer structure of a layer having an atomic ratio of In:Ga:Zn=4:2:3 and a layer having an atomic ratio of Ga:Zn=2:5, or a stacked-layer structure of a layer having an atomic ratio of In:Ga:Zn=4:2:3 and a gallium oxide can be given.

At this time, the oxide 230b serves as a main carrier path. When the oxides 230a and 230c have the above structure, the density of defect states at the interface between the oxides 230a and 230b and the interface between the oxides 230b and 230c can be made low. Thus, the influence of interface scattering on carrier conduction is small, and the transistor 200 can have a high on-state current and high frequency characteristics. Note that in the case where the oxide 230c has a stacked-layer structure, not only the density of defect state at the interface between the oxides 230b and 230c would be made low, but also the constituent element of the oxide 230c would be inhibited from being diffused into the insulator 250 side. More specifically, since the oxide 230c has a stacked-layer structure in which the oxide in the upper layer does not contain In, In can be inhibited from being diffused into the insulator 250 side. Since the insulator 250 functions as a gate insulator, the transistor has characteristics defects when In is diffused into the insulator 250. Thus, when the oxide 230c has a stacked-layer structure, a highly reliable semiconductor device can be provided.

The oxide 230 includes the region 234 and the region 242 with a reduced resistance. When the transistor 200 is turned on, the region 242 functions as the source region and the drain region. At least part of the region 234 functions as a channel formation region. Thus, by appropriate selection of the areas of the regions, a transistor having electrical characteristics necessary for the circuit design can be easily provided.

The insulator 250 functions as a gate insulator. The insulator 250 is preferably positioned in contact with the top surface of the oxide 230c. In addition, the excess oxygen in the insulator 280 is diffused into the region 274 of the insulator 273, the insulator 275, and the insulator 250, and then supplied to the oxide 230. Thus, an insulator having a function of diffusing oxygen is preferably used as the insulator 250. For the insulator 250, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide can be used. In particular, silicon oxide and silicon oxynitride, which have thermal stability, are preferable.

A metal oxide may be provided between the insulator 250 and the conductor 260. The metal oxide preferably has a function of inhibiting diffusion of oxygen. Provision of the metal oxide that inhibits diffusion of oxygen inhibits diffusion of oxygen from the insulator 250 to the conductor 260. That is, reduction in the amount of oxygen supplied to the oxide 230 can be inhibited. Moreover, oxidation of the conductor 260 due to oxygen from the insulator 250 can be inhibited.

Note that the metal oxide may function as part of the first gate. For example, an oxide semiconductor that can be used as the oxide 230 can be used as the metal oxide. In that case, when the conductor 260 is formed by a sputtering method, the metal oxide can have a reduced electric resistance and become a conductor. Such a conductor can be referred to as an oxide conductor (OC) electrode.

Note that the metal oxide functions as the part of the gate insulator in some cases. Therefore, when silicon oxide, silicon oxynitride, or the like is used for the insulator 250, a metal oxide that is a high-k material with a high dielectric constant is preferably used as the metal oxide. Such a stacked-layer structure can be thermally stable and can have a high dielectric constant. Accordingly, a gate potential that is applied during operation of the transistor can be reduced while the physical thickness of the gate insulator is kept. In addition, the equivalent oxide thickness (EOT) of an insulator functioning as the gate insulator can be reduced. Specifically, a metal oxide containing one or more of hafnium, aluminum, gallium, yttrium, zirconium, tungsten, titanium, tantalum, nickel, germanium, magnesium, and the like can be used.

The conductor 260 functioning as the first gate electrode is preferably formed using a conductive material containing tungsten, copper, or aluminum as its main component. The conductor 260 functions as a wiring and thus is preferably a conductor having high conductivity. For example, a conductive material containing tungsten, copper, or aluminum as its main component can be used.

Furthermore, the conductor 260 may have a stacked-layer structure. In that case, a conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom may be used as a lower layer of the conductor 260. Alternatively, a conductor having a function of inhibiting diffusion of oxygen (e.g., oxygen atoms and oxygen molecules), that is, a conductor through which the oxygen is less likely to pass is preferably used.

When the conductor having a function of inhibiting diffusion of oxygen is used as the lower layer of the conductor 260, the conductor 260 can be inhibited from being oxidized and reduced in resistance. For the conductor having a function of inhibiting diffusion of oxygen, for example, titanium, titanium nitride, tantalum, tantalum nitride, ruthenium, ruthenium oxide, or the like is preferably used.

The insulator 271 functioning as a hard mask may be provided over the conductor 260. By provision of the insulator 271, the conductor 260 can be processed to have the side surface that is substantially perpendicular to the surface of the substrate. Specifically, an angle formed by the side surface of the conductor 260 and a surface of the substrate can be greater than or equal to 75° and less than or equal to 100°, preferably greater than or equal to 80° and less than or equal to 95°. When the conductor 260 is processed into such a shape, the insulator 275 that is subsequently formed can be formed into a desired shape.

The insulator 271 may be formed using an insulating material having a function of inhibiting the passage of oxygen and impurities such as water or hydrogen so that the insulator 271 also functions as a barrier film. The insulator 271 may have a stacked-layer structure. In that case, an insulator functioning as a barrier film may be positioned as a layer of the insulator 271 on the conductor 260 side. The insulator functioning as a barrier film is preferably formed using an insulating material having a function of inhibiting the passage of oxygen and impurities such as water or hydrogen. For example, aluminum oxide or hafnium oxide is preferably used.

The insulator 277 is positioned in contact with the top surface of the oxide 230c and the side surface of the insulator 250. The insulator 277 preferably has a function of inhibiting diffusion of oxygen (e.g., oxygen atoms and oxygen molecules). That is, it is preferable that the above oxygen be less likely to pass through the insulator 277. For example, the insulator 277 preferably has a lower oxygen permeability than the insulator 275. An insulator containing an oxide of one or both of aluminum and hafnium is preferably formed as the insulator 277, for example. As the insulator containing an oxide of one or both of aluminum and hafnium, aluminum oxide, hafnium oxide, an oxide containing aluminum and hafnium (hafnium aluminate), or the like is preferably used. In particular, hafnium aluminate has higher heat resistance than a hafnium oxide film and thus is less likely to be crystallized by heat treatment in a later step. Therefore, it is preferable to use hafnium aluminate.

As described above, oxygen contained in the insulator 275 is diffused into the insulator 250. Here, when the side surface of the insulator 250 is fully covered with the insulator 277, oxygen cannot be diffused from the insulator 275 to the insulator 250. Therefore, the insulator 277 is preferably thinner than the insulator 250. However, when the insulator 277 is too thin, even the insulator 277 formed using any of the above materials transmits oxygen.

The insulator 277 is preferably formed by a method providing low step coverage. For example, the insulator 277 may be formed by a sputtering method. Forming the insulator 277 by a method providing low step coverage causes disconnection, whereby the side surface of the insulator 250 can be prevented from being fully covered with the insulator 277. Furthermore, the insulator 277 is preferably thinner than the insulator 273 to reduce the step coverage with the insulator 277 and cause disconnection. For this reason, the thickness of the insulator 277 is greater than or equal to 1 nm and less than or equal to 20 nm, preferably greater than or equal to 1 nm and less than or equal to 5 nm, for example. Note that although part of the insulator 277 is formed in contact with part of the side surfaces of the insulator 271, the conductor 260, and the insulator 250 in some cases, it is acceptable as long as at least part of the side surface of the insulator 250 is in contact with the insulator 275.

The insulator 275 is preferably provided in contact with the top surface of the insulator 277 and the side surfaces of the insulator 250, the conductor 260, and the insulator 271. In addition, the excess oxygen in the insulator 280 is diffused into the region 274 of the insulator 273, the insulator 275, and the insulator 250, and then supplied to the oxide 230. Thus, the insulator 275 needs to be in contact with the insulator 273 in the region 274 and at least part of the side surface of the insulator 250.

As the insulator 275, an insulator having a function of diffusing oxygen is preferably used. For example, the insulator 275 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable.

The upper portion of the insulator 275 is preferably curved. In that case, the insulator 273 can be formed in contact with the insulator 275 with good coverage except in the region 274. Thus, diffusion of impurities such as hydrogen into the conductor 260, the insulator 250, and the oxide 230 can be inhibited, so that an appropriate amount of oxygen can be supplied to the oxide 230.

The insulator 273 is preferably in contact with the top surface of the insulator 224, the top surface and the side surface of the oxide 230, the side surface of the insulator 277, the side surface of the insulator 275, and the top surface of the insulator 271. At least part of the insulator 273 includes the region 274 in contact with the insulator 275. Note that in FIG. 1B and the like, the insulator 273 includes the region 274 in contact with both the side surface of the insulator 275 on the A1 side and the side surface of the insulator 275 on the A2 side; however, the insulator 273 is not limited thereto as long as at least part of it includes the region 274.

For example, the insulator 273 preferably has a function of inhibiting diffusion of oxygen (e.g., oxygen atoms and oxygen molecules). That is, it is preferable that the above oxygen be less likely to pass through the insulator 273. For example, the insulator 273 preferably has a lower oxygen permeability than the insulator 250. As the insulator 273, an insulator containing an oxide of one or both of aluminum and hafnium is preferably formed, for example. As the insulator containing an oxide of one or both of aluminum and hafnium, aluminum oxide, hafnium oxide, an oxide containing aluminum and hafnium (hafnium aluminate), or the like is preferably used. In particular, hafnium aluminate has higher heat resistance than a hafnium oxide film and thus is less likely to be crystallized by heat treatment in a later step. Therefore, it is preferable to use hafnium aluminate.

For example, an oxide containing one or more of hafnium, aluminum, gallium, yttrium, zirconium, tungsten, titanium, tantalum, nickel, germanium, magnesium, and the like can be used as the insulator 273. Alternatively, a nitride such as silicon nitride or silicon nitride oxide can be used. A stack including any of the above oxide or nitride may be used.

With the insulator 273, oxygen added to the insulator 280 can be inhibited from directly entering the conductor 260, the insulator 250, and the oxide 230, and the oxygen can be diffused into the oxide 230 through the region 274. That is, the path through which oxygen is diffused from the insulator 280 into the oxide 230 can be limited to the region 274. Thus, excess oxygen in the insulator 280 can be inhibited from diffusing into the oxide 230 more than necessary.

The insulator 280 functioning as the interlayer film is preferably positioned over the insulator 273. The insulator 280 preferably contains a reduced concentration of impurities such as water or hydrogen.

Here, the insulator 280 preferably includes a region containing oxygen that is released by heating. That is, an excess oxygen region is preferably formed in the insulator 280. When such an insulator containing excess oxygen is provided in the vicinity of the transistor 200 with the insulator 273 including the region 274 therebetween, oxygen vacancies in the oxide 230 can be reduced, leading to an improvement in reliability of the transistor 200.

As the insulator including an excess oxygen region, specifically, an oxide material that releases part of oxygen by heating is preferably used. An oxide that releases oxygen by heating is an oxide film in which the release amount of oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in thermal desorption spectroscopy (TDS) analysis. In the TDS analysis, the film surface temperature is preferably higher than or equal to 100° C. and lower than or equal to 700° C., or higher than or equal to 100° C. and lower than or equal to 400° C.

Specifically, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen, can be used. In particular, silicon oxide and silicon oxynitride, which have thermal stability, are preferable.

In the case where the insulator 280 includes an excess oxygen region, the insulator 282 preferably has a function of inhibiting diffusion of oxygen (e.g., oxygen atoms or oxygen molecules). That is, it is preferable that the above oxygen be less likely to pass through the insulator 282. For example, the insulator 282 preferably has a lower oxygen permeability than the insulator 250.

When the insulator 282 that inhibits diffusion of oxygen is provided over the insulator 280, diffusion of excess oxygen to the insulator 284 side is inhibited. That is, reduction in the amount of excess oxygen that is supplied to the oxide 230 can be inhibited. Thus, excess oxygen can be efficiently supplied to the oxide 230.

When the insulator 282 is formed by a sputtering method, a region containing oxygen that is released by heating can be provided in the insulator 280. Therefore, oxygen can be supplied from the region to the oxide 230 through the insulator 250.

The insulator 284 functioning as an interlayer film is preferably provided over the insulator 282. An insulator similar to the insulator 216 can be provided as the insulator 284.

The conductors 240s and 240d are provided in the openings formed in the insulators 284, 282, 280, and 273. The conductors 240s and 240d are provided to face each other with the conductor 260 therebetween. Note that the top surfaces of the conductors 240s and 240d may be level with the top surface of the insulator 284.

The conductor 240s is in contact with the region 242s functioning as one of the source region and the drain region of the transistor 200, and the conductor 240d is in contact with the region 242d functioning as the other of the source region and the drain region of the transistor 200. Thus, the conductor 240s can function as one of a source electrode and a drain electrode, and the conductor 240d can function as the other of the source electrode and the drain electrode.

The conductor 240s is formed in contact with the inner wall of the opening in the insulators 284, 282, 280, and 273. The region 242s of the oxide 230 is positioned on at least part of a bottom portion of the opening, and thus the conductor 240s is in contact with the region 242s. Similarly, the conductor 240d is formed in contact with the inner wall of the opening in the insulators 284, 282, 280, and 273. The region 242d of the oxide 230 is positioned on at least part of a bottom portion of the opening, and thus the conductor 240d is in contact with the region 242d.

Here, the conductor 240s and the conductor 240d preferably overlap with the side surface of the oxide 230. It is particularly preferable that the conductors 240s and 240d overlap with one or both of the side surface of the oxide 230 on the A3 side and the side surface of the oxide 230 on the A4 side, which intersect with the channel width direction of the oxide 230. Alternatively, the conductors 240s and 240d may overlap with the side surface of the oxide 230 on the A1 side (the A2 side), which intersects with the channel length direction of the oxide 230. Thus, with the structure in which the conductors 240s and 240d overlap with the regions 242 to be the source region and the drain region and the side surface of the oxide 230, the contact area of a contact portion between the conductors 240s and 240d and the transistor 200 can be increased without increasing the projected area of the contact portion, so that the contact resistance between the conductors 240s and 240d and the transistor 200 can be reduced. Accordingly, miniaturization of the source electrode and the drain electrode of the transistor can be achieved and, in addition, the on-state current can be increased.

The conductors 240s and 240d are each preferably formed using a conductive material containing tungsten, copper, or aluminum as its main component. The conductors 240s and 240d may have a stacked-layer structure.

Furthermore, in the case where the conductor 240 has a stacked-layer structure, the above-described conductor having a function of inhibiting diffusion of impurities such as water or hydrogen is preferably used as a conductor in contact with the insulators 284, 282, 280, and 273. For example, tantalum, tantalum nitride, titanium, titanium nitride, ruthenium, ruthenium oxide, or the like is preferably used. The conductor having a function of inhibiting diffusion of impurities such as water or hydrogen may be a single layer or a stacked layer. With the use of the conductive material, impurities such as hydrogen or water can be inhibited from entering the oxide 230 through the conductors 240s and 240d from a layer above the insulator 280.

Although not illustrated, conductors functioning as wirings may be provided in contact with the top surfaces of the conductors 240s and 240d. The conductor functioning as a wiring is preferably formed using a conductive material containing tungsten, copper, or aluminum as its main component. The conductor may have a stacked-layer structure, for example, a stacked layer of any of the above conductive materials and titanium or titanium nitride. Note that like the conductor 205 or the like, the conductor may be formed to be embedded in an opening provided in an insulator.

<Materials for Semiconductor Device>

Materials that can be used for a semiconductor device are described below.

<<Substrate>>

As a substrate over which the transistor 200 is formed, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. Any of the above semiconductor substrates that includes an insulator region, e.g., a silicon on insulator (SOI) substrate, can also be used. Examples of the conductor substrate include a graphite substrate, a metal substrate, an alloy substrate, and a conductive resin substrate. A substrate containing a nitride of a metal, a substrate including an oxide of a metal, or the like can also be used. An insulator substrate provided with a conductor or a semiconductor, a semiconductor substrate provided with a conductor or an insulator, a conductor substrate provided with a semiconductor or an insulator, or the like may be used. Alternatively, any of these substrates over which an element is provided may be used. Examples of the element provided over the substrate include a capacitor, a resistor, a switching element, a light-emitting element, and a memory element.

<<Insulator>>

Examples of an insulator include an insulating oxide, an insulating nitride, an insulating oxynitride, an insulating nitride oxide, an insulating metal oxide, an insulating metal oxynitride, and an insulating metal nitride oxide.

With miniaturization and high integration of a transistor, for example, a problem such as generation of leakage current may arise because of a thin gate insulator. When a material having a high dielectric constant such as high-k material is used for an insulator functioning as the gate insulator, driving voltage of the transistor can be reduced while the physical thickness of the gate insulator is kept. By contrast, when a material having a low dielectric constant is used for the insulator functioning as an interlayer film, the parasitic capacitance between wirings can be reduced. Accordingly, a material is preferably selected depending on the function of an insulator.

As examples of the insulator having a high dielectric constant, gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

As examples of the insulator having a low dielectric constant, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

In particular, silicon oxide and silicon oxynitride are thermally stable. Accordingly, a stacked-layer structure which is thermally stable and has a low dielectric constant can be obtained by combining silicon oxide or silicon oxynitride with a resin, for example. Examples of the resin include polyester, polyolefin, polyamide (e.g., nylon and aramid), polyimide, polycarbonate, and acrylic. Furthermore, a combination of silicon oxide or silicon oxynitride with an insulator having a high dielectric constant allows the stacked-layer structure to be thermally stable and have a high dielectric constant, for example.

Note that when the transistor including an oxide semiconductor is surrounded by an insulator having a function of inhibiting the passage of oxygen and impurities such as hydrogen, the electrical characteristics of the transistor can be stabilized.

The insulator having a function of inhibiting the passage of oxygen and impurities such as hydrogen can have, for example, a single-layer structure or a stacked-layer structure of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For example, a metal oxide containing one or more of hafnium, aluminum, gallium, yttrium, zirconium, tungsten, titanium, tantalum, nickel, germanium, magnesium, and the like can be used as the insulators 273, 277, and 222.

In particular, aluminum oxide has a high barrier property, so that even a thin aluminum oxide film having a thickness of greater than or equal to 0.5 nm and less than or equal to 3.0 nm can inhibit diffusion of hydrogen and nitrogen. Although hafnium oxide has lower barrier property than aluminum oxide, hafnium oxide having a large thickness can have a high barrier property. Therefore, the appropriate addition amount of hydrogen and nitrogen can be appropriately adjusted by adjustment of the thickness of hafnium oxide.

The insulator 220 is preferably formed using silicon oxide or silicon oxynitride, which is thermally stable, for example. When the gate insulator has a stacked-layer structure of a thermally stable film and a film with a high dielectric constant, the equivalent oxide thickness (EOT) of the gate insulator can be reduced while the physical thickness of the gate insulator is kept.

With the above stacked-layer structure, on-state current can be increased without a reduction in the influence of the electric field applied from the gate electrode. Since the distance between the gate electrode and the channel formation region is kept by the physical thickness of the gate insulator, leakage current between the gate electrode and the channel formation region can be inhibited.

The insulator 216, the insulator 271, and the insulator 284 preferably include an insulator having a low dielectric constant. For example, the insulator preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Because silicon oxide and silicon oxynitride have thermal stability, a combination of silicon oxide or silicon oxynitride with a resin allows the stacked-layer structure to be thermally stable and have a low dielectric constant. Examples of the resin include polyester, polyolefin, polyamide (e.g., nylon and aramid), polyimide, polycarbonate, and acrylic.

For example, an insulator having a function of inhibiting the passage of oxygen and impurities such as hydrogen may be used as each of the insulators 214, 222, 277, 273, and 282. For example, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; or silicon nitride oxide can be used.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Alternatively, a semiconductor having a high electric conductivity typified by polycrystalline silicon containing an impurity element such as phosphorus, or silicide such as nickel silicide may be used.

Conductive layers formed using any of the above materials may be stacked. For example, a stacked-layer structure combining a material containing any of the above-described metal elements and a conductive material containing oxygen may be used. Alternatively, a stacked-layer structure combining a material containing any of the above-described metal elements and a conductive material containing nitrogen may be used. Further alternatively, a stacked-layer structure combining a material containing any of the above-described metal elements, a conductive material containing oxygen, and a conductive material containing nitrogen may be used.

When an oxide is used for the channel formation region of the transistor, a stacked-layer structure formed using a material containing any of the above-described metal elements and a conductive material containing oxygen is preferably used for the conductor functioning as the gate electrode. In that case, the conductive material containing oxygen is preferably formed on the channel formation region side, in which case oxygen released from the conductive material is easily supplied to the channel formation region.

It is particularly preferable to use, for the conductor functioning as the gate electrode, a conductive material containing oxygen and a metal element contained in a metal oxide in which a channel is formed. A conductive material containing any of the above metal elements and nitrogen may also be used. For example, a conductive material containing nitrogen, such as titanium nitride or tantalum nitride, may be used. An indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon is added may be used. An indium gallium zinc oxide containing nitrogen may also be used. With the use of such a material, hydrogen contained in the metal oxide in which a channel is formed can be captured in some cases. Alternatively, hydrogen entering from an external insulator or the like can be captured in some cases.

<<Metal Oxide>>

As the oxide 230, a metal oxide functioning as an oxide semiconductor is preferably used. A metal oxide that can be used as the oxide 230 of one embodiment of the present invention will be described below.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor is an In-M-Zn oxide that contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also referred to as a metal oxide in some cases. Moreover, a metal oxide containing nitrogen may be referred to as a metal oxynitride.

Oxide semiconductors are classified into a single-crystal oxide semiconductor and a non-single-crystal oxide semiconductor. Examples of a non-single-crystal oxide semiconductor include a polycrystalline oxide semiconductor and an amorphous oxide semiconductor.

As an oxide semiconductor used for a semiconductor of a transistor, a thin film having high crystallinity is preferably used. With the thin film, the stability or the reliability of the transistor can be improved. As the thin film, for example, a thin film of a single-crystal oxide semiconductor or a thin film of a polycrystalline oxide semiconductor can be used. However, to form the thin film of a single-crystal oxide semiconductor or the thin film of a polycrystalline oxide semiconductor over a substrate, a high-temperature process or a laser heating process is needed. Thus, the manufacturing cost is increased, and moreover, the throughput is decreased.

Non-Patent Documents 1 and 2 have reported that, in 2009, an In—Ga—Zn oxide having a CAAC structure (referred to as CAAC-IGZO) was found. It has been reported that CAAC-IGZO has c-axis alignment, a grain boundary is not clearly observed in CAAC-IGZO, and CAAC-IGZO can be formed over a substrate at low temperatures. It has also been reported that a transistor including CAAC-IGZO has excellent electrical characteristics and high reliability.

In addition, in 2013, an In—Ga—Zn oxide having an nc structure (referred to as nc-IGZO) was found (see Non-Patent Document 3). It has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Documents 4 and 5 have shown a change in average crystal size due to electron beam irradiation to thin films of the above-described CAAC-IGZO, the above-described nc-IGZO, and IGZO having low crystallinity. In the thin film of IGZO having low crystallinity, crystalline IGZO with a crystal size of approximately 1 nm was observed even before the electron beam irradiation. Thus, it has been reported that a completely amorphous structure was not observed in IGZO. In addition, it has been shown that the thin films of CAAC-IGZO and nc-IGZO each have higher stability to electron beam irradiation than the thin film of IGZO having low crystallinity. Thus, a semiconductor of a transistor is preferably formed using the thin film of CAAC-IGZO or the thin film of nc-IGZO.

Non-Patent Document 6 discloses that a transistor including an oxide semiconductor has an extremely low leakage current in an off state; specifically, the off-state current per micrometer in the channel width of the transistor is of the order of yA/μm ($10^{-24}$ A/μm). For example, a CPU and the like with low power consumption utilizing the characteristic of a low leakage current of a transistor including an oxide semiconductor have been disclosed (see Non-Patent Document 7).

Furthermore, application of a transistor including an oxide semiconductor to a display device that utilizes the characteristic of a low leakage current of the transistor has been reported (see Non-Patent Document 8). In the display device, a displayed image is changed several tens of times per second. The number of times an image is changed per second is called a refresh rate. The refresh rate is also referred to as driving frequency. Such high-speed screen change that is hard to be recognized by human eyes is considered as a cause of eyestrain. Thus, it has been proposed that the refresh rate of the display device is lowered to reduce the number of image rewriting operations. Moreover, driving with a lowered refresh rate enables the power consumption of the display device to be reduced. Here, such a driving method is referred to as idling stop (IDS) driving.

The discovery of the CAAC structure and the nc structure has contributed to an improvement in electrical characteristics and reliability of a transistor including an oxide semiconductor having the CAAC structure or the nc structure, a reduction in manufacturing cost, and an improvement in throughput. Furthermore, applications of the transistor to a display device and an LSI with the use of the low leakage current of the transistor have been studied.

[Composition of Metal Oxide]

Described below is the composition of a cloud-aligned composite oxide semiconductor (CAC-OS) applicable to a transistor disclosed in one embodiment of the present invention.

In this specification and the like, "c-axis aligned crystal (CAAC)" or "cloud-aligned composite (CAC)" might be stated. Note that CAAC refers to an example of a crystal structure, and CAC refers to an example of a function or a material composition.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the aforementioned conducting function and the insulating regions have the aforementioned insulating function. In some cases, the conductive regions and the insulating regions in the material are separated at the nanoparticle level. In some cases, the conductive regions and the insulating regions are unevenly distributed in the material. The conductive regions are sometimes observed to be coupled in a cloud-like manner with their boundaries blurred.

In the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC metal oxide is used in a channel formation region of a transistor, high current drive capability in the on state of the transistor, that is, high on-state current and high field-effect mobility, can be obtained.

In other words, the CAC-OS or the CAC metal oxide can be referred to as a matrix composite or a metal matrix composite.

[Structure of Metal Oxide]

Oxide semiconductors are classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that a clear crystal grain boundary cannot be observed even in the vicinity of distortion in the CAAC-OS. That is, a lattice arrangement is distorted and thus formation of a grain boundary is inhibited. This is probably because the CAAC-OS can tolerate distortion owing to a low density of arrangement of oxygen atoms in the a-b plane direction, an interatomic bond distance changed by substitution of a metal element, and the like.

The CAAC-OS tends to have a layered crystal structure (also referred to as a stacked-layer structure) in which a layer containing indium and oxygen (hereinafter, an In layer) and a layer containing the element M, zinc, and oxygen (hereinafter, an (M, Zn) layer) are stacked. Note that indium and the element M can be replaced with each other, and when the element M of the (M, Zn) layer is replaced with indium, the layer can be referred to as an (In, M, Zn) layer. When indium of the In layer is replaced with the element M, the layer can be referred to as an (In, M) layer.

The CAAC-OS is an oxide semiconductor with high crystallinity. On the other hand, in the CAAC-OS, a clear grain boundary cannot be observed; thus, a reduction in electron mobility due to the grain boundary is less likely to occur. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has lower crystallinity than the nc-OS and the CAAC-OS.

An oxide semiconductor can have any of various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Oxide Semiconductor]

Next, the case where the oxide semiconductor is used for a transistor is described.

When the oxide semiconductor is used for a transistor, the transistor can have high field-effect mobility. In addition, the transistor can have high reliability.

An oxide semiconductor with a low carrier density is preferably used for the transistor. In order to reduce the carrier density of the oxide semiconductor, the concentration of impurities in the oxide semiconductor is reduced so that the density of defect states can be reduced. In this specification and the like, a state with a low concentration of impurities and a low density of defect states is referred to as a highly purified intrinsic or substantially highly purified intrinsic state. For example, an oxide semiconductor whose carrier density is lower than $8\times10^{11}/cm^3$, preferably lower than $1\times10^{11}/cm^3$, further preferably lower than $1\times10^{10}/cm^3$, and greater than or equal to $1\times10^{-9}/cm^3$ is used.

A highly purified intrinsic or substantially highly purified intrinsic oxide semiconductor film has a low density of defect states and accordingly has a low density of trap states in some cases.

Charges trapped by the trap states in the oxide semiconductor take a long time to be released and may behave like fixed charges. Thus, a transistor whose channel formation region is formed in an oxide semiconductor having a high density of trap states has unstable electrical characteristics in some cases.

In order to obtain stable electrical characteristics of the transistor, it is effective to reduce the concentration of impurities in the oxide semiconductor. In order to reduce the concentration of impurities in the oxide semiconductor, the concentration of impurities in a film which is adjacent to the oxide semiconductor is preferably reduced. As examples of the impurities, hydrogen, nitrogen, alkali metal, alkaline earth metal, iron, nickel, silicon, and the like are given.

[Impurities]

Here, the influence of impurities in the oxide semiconductor is described.

When silicon or carbon, which is one of Group 14 elements, is contained in the oxide semiconductor, defect states are formed. Thus, the concentration of silicon or carbon in the oxide semiconductor and in the vicinity of an interface with the oxide semiconductor (measured by secondary ion mass spectrometry (SIMS)) is set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated, in some cases. Thus, a transistor including an oxide semiconductor that contains alkali metal or alkaline earth metal tends to have normally-on characteristics. Therefore, it is preferable to reduce the concentration of alkali metal or alkaline earth metal in the oxide semiconductor. Specifically, the concentration of alkali metal or alkaline earth metal in the oxide semiconductor measured by SIMS is set lower than or equal to $1\times10^{18}$ atoms/cm$^3$, and preferably lower than or equal to $2\times10^{16}$ atoms/cm$^3$.

When the oxide semiconductor contains nitrogen, the oxide semiconductor easily becomes n-type by generation of electrons serving as carriers and an increase in carrier density. Thus, a transistor including an oxide semiconductor that contains nitrogen as the semiconductor tends to have normally-on characteristics. For this reason, nitrogen in the oxide semiconductor is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom generates an electron functioning as a carrier. Thus, a transistor including an oxide semiconductor which contains hydrogen tends to have normally-on characteristics. Accordingly, it is preferable that hydrogen in the oxide semiconductor be reduced as much as possible. Specifically, the hydrogen concentration in the oxide semiconductor measured by SIMS is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurity concentration is used for a channel formation region of a transistor, the transistor can have stable electrical characteristics.

[Effect of Vacuum Baking]

Here, a weak Zn—O bond in the metal oxide and an example of a method for reducing the number of oxygen atoms and zinc atoms which form the weak bond will be described.

In a transistor including a metal oxide, oxygen vacancies are given as an example of a defect which leads to poor electrical characteristics of the transistor. For example, the threshold voltage of a transistor including a metal oxide which includes oxygen vacancies tends to shift in the negative direction, and thus the transistor tends to have normally-on characteristics. This is because a donor caused by oxygen vacancies in the metal oxide is generated and the carrier concentration increases. The transistor having normally-on characteristics causes various problems where a malfunction is likely to occur when the transistor is in operation and power consumption is increased when the transistor is not in operation, for example.

Furthermore, there are problems where thermal budget in the step of forming the connection wiring in fabricating a module causes degradation of the electrical characteristics of the transistor, such as variation in the threshold voltage and an increase in parasitic resistance, and an increase in variation in the electrical characteristics due to such degradation. Such problems directly lead to a decrease in manufacturing yield, and thus are highly needed to be addressed. Further, the electrical characteristics of the transistor are degraded through a stress test, which can evaluate a change in transistor characteristics by long-term use (i.e., a change over time) in a short time. The degradation of the electrical characteristics is presumably caused by oxygen vacancies in the metal oxide due to high temperature treatment performed in the manufacturing process or electrical stress applied during the stress test.

In the metal oxide, there is an oxygen atom which weakly bonds to a metal atom and thus is likely to form an oxygen vacancy. In particular, in the case where the metal oxide is an In—Ga—Zn oxide, a zinc atom and an oxygen atom are likely to form a weak bond (also referred to as a weak Zn—O bond). Here, the weak Zn—O bond means a bond generated between a zinc atom and an oxygen atom, which is weak enough to be broken by high temperature treatment performed in the manufacturing process or electrical stress applied during the stress test. When the weak Zn—O bond exists in the metal oxide, the bond is broken by heat or current stress, so that an oxygen vacancy is formed. The formation of the oxygen vacancy decreases the stability of the transistor, for example, resistance to heat and stress is decreased.

The bond between a zinc atom and an oxygen atom bonded to many zinc atoms is the weak Zn—O bond in some cases. A zinc atom bonds to an oxygen atom more weakly than a gallium atom does. Thus, an oxygen atom bonded to many zinc atoms is likely to form a vacancy. That is, the bond between a zinc atom and an oxygen atom is probably weaker than the bond between an oxygen atom and other metal.

It is supposed that the weak Zn—O bond is likely to be formed when impurities exist in the metal oxide. Examples of the impurities in the metal oxide include a water molecule and hydrogen. When a water molecule or a hydrogen atom exists in the metal oxide, the hydrogen atom bonds to an oxygen atom in the metal oxide (such a bond is also referred to as an OH bond) in some cases. In the case where the In—Ga—Zn oxide is a single crystal, an oxygen atom in the metal oxide is bonded to four metal atoms in the metal oxide. However, an oxygen atom bonded to the hydrogen atom is bonded to two or three metal atoms in some cases. When the number of metal atoms bonded to the oxygen atom is decreased, the oxygen atom is likely to form an oxygen vacancy. Note that when a zinc atom is bonded to an oxygen atom which forms an OH bond, the bond between the oxygen atom and the zinc atom is probably weak.

Note that the weak Zn—O bond is sometimes formed in a distortion where a plurality of nanocrystals are connected. Although the shape of nanocrystals is basically a hexagon, a pentagonal lattice arrangement, a heptagonal lattice arrangement, or the like is included in the distortion in some cases. It is supposed that the weak Zn—O bond is formed in the distortion because the bond distances between atoms are not uniform therein.

It is also supposed that the weak Zn—O bond is likely to be formed in the case where the metal oxide has low crystallinity. In the case where the metal oxide has high crystallinity, a zinc atom contained in the metal oxide is bonded to four or five oxygen atoms. However, when the crystallinity of the metal oxide becomes lower, the number of oxygen atoms bonded to a zinc atom tends to decrease. When the number of oxygen atoms bonded to a zinc atom decreases, the zinc atom easily forms a vacancy. That is, a bond between the zinc atom and the oxygen atom is presumably weaker than that in a single crystal.

The number of oxygen atoms and zinc atoms which form the weak Zn—O bonds is reduced, whereby formation of oxygen vacancies due to the thermal budget or the current stress can be inhibited, leading to an improvement in stability of a transistor. Note that in the case where only the number of oxygen atoms that form the weak Zn—O bonds is reduced and the number of zinc atoms that form the weak Zn—O bonds is not reduced, a weak Zn—O bond is formed again in some cases when an oxygen atom is supplied to the vicinity of the zinc atom. Therefore, it is preferable to reduce the number of zinc atoms and oxygen atoms that form the weak Zn—O bonds.

As a method for reducing the number of oxygen atoms and zinc atoms which form the weak Zn—O bonds, for example, a method in which vacuum baking is performed after the formation of a metal oxide can be given. Note that the vacuum baking is heat treatment performed under a vacuum atmosphere. A vacuum atmosphere is kept by evacuation with a turbo-molecular pump or the like. The pressure in the treatment chamber is preferably lower than or equal to $1 \times 10^{-2}$ Pa, further preferably lower than or equal to $1 \times 10^{-3}$ Pa. The substrate temperature in the heat treatment is higher than or equal to 300° C., preferably higher than or equal to 400° C.

Performing the vacuum baking can reduce the number of oxygen atoms and zinc atoms which form the weak Zn—O bonds. Furthermore, since the metal oxide is heated by vacuum baking, atoms in the metal oxide are rearranged after the number of oxygen atoms and zinc atoms which form the weak Zn—O bonds is reduced, so that the number of oxygen atoms each bonded to four metal atoms is increased. Accordingly, the number of oxygen atoms and zinc atoms which form the weak Zn—O bonds can be reduced, and a weak Zn—O bond can be inhibited from being formed again.

Furthermore, when impurities exist in the metal oxide, performing the vacuum baking can release water molecules or hydrogen in the metal oxide, so that the number of OH bonds can be reduced. When the number of OH bonds in the metal oxide is reduced, the proportion of the oxygen atoms each bonded to four metal atoms is increased. Furthermore, atoms in the metal oxide are rearranged when water molecules or hydrogen is released, so that the number of the oxygen atoms each bonded to four metal atoms is increased. Thus, a weak Zn—O bond can be inhibited from being formed again.

As described above, when vacuum baking is performed after the metal oxide is formed, the number of oxygen atoms and zinc atoms which form weak Zn—O bonds can be reduced. Thus, stability of the transistor can be improved through the step. Furthermore, an improvement in stability of the transistor increases the number of choices of materials and formation methods.

<Manufacturing Method of Semiconductor Device>

Next, a manufacturing method of a semiconductor device including the transistor 200 of the present invention will be described with reference to FIGS. 4A to 4C to FIGS. 11A to 11C. FIG. 4A, FIG. 5A, FIG. 6A, FIG. 7A, FIG. 8A, FIG. 9A, FIG. 10A, and FIG. 11A are top views. FIG. 4B, FIG. 5B, FIG. 6B, FIG. 7B, FIG. 8B, FIG. 9B, FIG. 10B, and FIG. 11B are cross-sectional views taken along dashed-dotted lines A1-A2 in FIG. 4A, FIG. 5A, FIG. 6A, FIG. 7A, FIG. 8A, FIG. 9A, FIG. 10A, and FIG. 11A. FIG. 4C, FIG. 5C, FIG. 6C, FIG. 7C, FIG. 8C, FIG. 9C, FIG. 10C, and FIG. 11C are cross-sectional views taken along dashed-dotted lines A3-A4 in FIG. 4A, FIG. 5A, FIG. 6A, FIG. 7A, FIG. 8A, FIG. 9A, FIG. 10A, and FIG. 11A. Note that in the top views of FIG. 4A, FIG. 5A, FIG. 6A, FIG. 7A, FIG. 8A, FIG. 9A, FIG. 10A, and FIG. 11A, some components are not illustrated for simplification of the drawings.

First, a substrate (not illustrated) is prepared, and the insulator 214 is formed over the substrate. The insulator 214 can be formed by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method, depending on a source gas.

A PECVD method enables a high-quality film to be obtained at a relatively low temperature. A thermal CVD method does not use plasma and thus causes less plasma damage to an object. For example, a wiring, an electrode, an element (e.g., a transistor or a capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. Furthermore, a film with few defects can be obtained by a thermal CVD method because plasma damage during film formation is not caused.

An ALD method also causes less plasma damage to an object. Thus, a film with few defects can be obtained. Note that a precursor used in an ALD method sometimes contains impurities such as carbon. Thus, a film formed by an ALD method may contain impurities such as carbon in a larger amount than a film formed by another deposition method. Note that impurities can be quantified by X-ray photoelectron spectroscopy (XPS).

Unlike in the film formation method in which particles ejected from a target or the like are deposited, a film is formed by reaction at a surface of an object in a CVD method and an ALD method. Thus, a CVD method and an ALD method can provide good step coverage almost regardless of the shape of an object. In particular, an ALD method enables excellent step coverage and excellent thickness uniformity and can be suitably used to cover a surface of an opening with a high aspect ratio, for example. Note that an ALD method has a relatively low film formation rate; thus, in some cases, an ALD method is preferably combined with another film formation method with a high film formation rate, such as a CVD method.

When a CVD method or an ALD method is used, the composition of a film to be formed can be controlled with the flow rate ratio of the source gases. For example, by a CVD method or an ALD method, a film with a certain composition can be formed depending on the flow rate ratio of the source gases. Moreover, by a CVD method or an ALD method, by changing the flow rate ratio of the source gases during the film formation, a film whose composition is continuously changed can be formed. In the case where a film is formed while the flow rate ratio of the source gases is changed, as compared to the case where a film is formed using a plurality of deposition chambers, time taken for the deposition can be reduced because time taken for transfer and pressure adjustment is omitted. Hence, semiconductors can be manufactured with high productivity in some cases.

In this embodiment, aluminum oxide is formed as the insulator 214 by a sputtering method. The insulator 214 may have a multilayer structure. For example, the multilayer structure may be formed in such a manner that aluminum oxide is formed by a sputtering method and another aluminum oxide is formed over the aluminum oxide by an ALD method. Alternatively, the multilayer structure may be formed in such a manner that aluminum oxide is formed by an ALD method and another aluminum oxide is formed over the aluminum oxide by a sputtering method.

Next, the insulator 216 is formed over the insulator 214. The insulator 216 can be formed by a sputtering method, a CVD method, an MBE method, a PLD method, an ALD method, or the like. In this embodiment, silicon oxynitride is formed as the insulator 216 by a CVD method.

Next, an opening reaching the insulator 214 is formed in the insulator 216. Examples of the opening include a groove and a slit. A region where the opening is formed may be referred to as an opening portion. The opening may be formed by a wet etching method; however, a dry etching method is suitable for microfabrication. The insulator 214 is preferably an insulator that functions as an etching stopper film used in forming the opening by etching the insulator 216. For example, in the case where a silicon oxide film is used as the insulator 216 in which the opening is to be formed, the insulator 214 is preferably formed using a silicon nitride film, an aluminum oxide film, or a hafnium oxide film as an insulating film functioning as an etching stopper film.

After the formation of the opening, a conductive film to be the first conductor of the conductor 205 is formed. The conductive film preferably includes a conductor having a function of inhibiting the passage of oxygen. For example, tantalum nitride, tungsten nitride, or titanium nitride can be used. Alternatively, a stacked-layer film of the conductor and tantalum, tungsten, titanium, molybdenum, aluminum, copper, or a molybdenum-tungsten alloy can be used. The conductive film to be the first conductor of the conductor 205 can be formed by a sputtering method, a CVD method, an MBE method, a PLD method, an ALD method, or the like.

In this embodiment, as the conductive film to be the first conductor of the conductor 205, tantalum nitride or a stacked film of tantalum nitride and titanium nitride formed over the tantalum nitride is formed by a sputtering method.

Next, a conductive film to be the second conductor of the conductor 205 is formed over the conductive film to be the first conductor of the conductor 205. The conductive film to be the second conductor of the conductor 205 can be formed by a sputtering method, a CVD method, an MBE method, a PLD method, an ALD method, or the like. In this embodiment, the conductive film to be the second conductor of the conductor 205 is formed in such a manner that titanium nitride is formed by a CVD method and tungsten is formed over the titanium nitride by a CVD method.

Next, by CMP treatment, the conductive film to be the first conductor of the conductor 205 and the conductive film to be the second conductor of the conductor 205 are partly removed to expose the insulator 216. As a result, the conductive film to be the first conductor of the conductor 205 and the conductive film to be the second conductor of the conductor 205 remain only in the opening. Thus, the conductor 205 including the first and second conductors, which has a flat top surface, can be formed (see FIGS. 4A to 4C). Note that the insulator 216 is partly removed by the CMP treatment in some cases.

Note that the manufacturing method of the insulator 216 and the conductor 205 is not limited to the above. For example, the conductor 205 and the insulator 216 may be formed in such a manner that the conductor 205 is patterned, the insulator 216 is formed thereover, and the surface of the conductor 205 is exposed by CMP treatment.

Next, the insulator 220 is formed over the insulator 216 and the conductor 205. The insulator 220 can be formed by a sputtering method, a CVD method, an MBE method, a PLD method, an ALD method, or the like. In this embodiment, as the insulator 220, silicon oxynitride is formed by a CVD method.

Then, the insulator 222 is formed over the insulator 220. An insulator containing an oxide of one or both of aluminum and hafnium is preferably formed as the insulator 222. As the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, diffusion of hydrogen and water contained in a structure body provided around the transistor 200 into the transistor 200 through the insulator 222 is inhibited, and accordingly oxygen vacancies are less likely to be generated in the oxide 230.

The insulator 222 can be formed by a sputtering method, a CVD method, an MBE method, a PLD method, an ALD method, or the like.

Subsequently, heat treatment is preferably performed. The heat treatment is performed at a temperature higher than or equal to 250° C. and lower than or equal to 650° C., preferably higher than or equal to 300° C. and lower than or equal to 500° C., and further preferably higher than or equal to 320° C. and lower than or equal to 450° C. The heat treatment is performed in a nitrogen atmosphere, an inert gas atmosphere, or an atmosphere containing an oxidizing gas at higher than or equal to 10 ppm, higher than or equal to 1%, or higher than or equal to 10%. The heat treatment may be performed under a reduced pressure. Alternatively, the heat treatment may be performed in such a manner that heat treatment is performed in nitrogen or an inert gas atmosphere, and then another heat treatment is performed in an atmosphere containing an oxidizing gas at higher than or equal to 10 ppm, higher than or equal to 1%, or higher than or equal to 10%, in order to compensate for released oxygen.

In this embodiment, the heat treatment is performed in such a manner that treatment at 400° C. in a nitrogen atmosphere is performed for one hour after the insulator 222 is formed, and then treatment at 400° C. in an oxygen atmosphere is successively performed for one hour. By the above heat treatment, impurities such as hydrogen and water contained in the insulator 222 can be removed, for example. The heat treatment can also be performed after the formation of the insulator 224, or the like.

Then, the insulator 224 is formed over the insulator 222. The insulator 224 can be formed by a sputtering method, a CVD method, an MBE method, a PLD method, an ALD method, or the like. In this embodiment, as the insulator 224, silicon oxynitride is formed by a CVD method.

The heat treatment can also be performed after the formation of the insulator 220 and after the formation of the insulator 222. Although the heat treatment can be performed under the above-described conditions for the heat treatment, heat treatment after the formation of the insulator 220 is preferably performed in an atmosphere containing nitrogen.

Here, in order to form an excess oxygen region in the insulator 224, plasma treatment using oxygen may be performed under a reduced pressure. The plasma treatment using oxygen is preferably performed with an apparatus including a power source for generating high-density plasma using microwaves, for example. Alternatively, a power source for applying a radio frequency (RF) to a substrate side may be provided. The use of high-density plasma enables high-density oxygen radicals to be generated, and application of the RF to the substrate side allows oxygen radicals generated by the high-density plasma to be efficiently introduced into the insulator 224. After plasma treatment using an inert gas with the apparatus, plasma treatment using oxygen may be performed to compensate for released oxygen. Note that impurities such as hydrogen and water contained in the insulator 224 can be removed by selecting the conditions of the plasma treatment appropriately. In that case, the heat treatment is not necessarily performed.

Next, an oxide film to be the oxide 230a and an oxide film to be the oxide 230b are sequentially formed over the insulator 224. Note that the oxide films are preferably formed successively without exposure to the air. When the oxide films are formed without exposure to the air, impurities or moisture from the air can be prevented from being attached to the oxide film to be the oxide 230a and the oxide film to be the oxide 230b, so that an interface between the oxide film to be the oxide 230a and the oxide film to be the oxide 230b and the vicinity of the interface can be kept clean. Furthermore, the insulator 220, the insulator 222, the insulator 224, the oxide film to be the oxide 230a, and the oxide film to be the oxide 230b may be formed without exposure to the air. In that case, a multi-chamber deposition apparatus is preferably used.

The oxide film to be the oxide 230a and the oxide film to be the oxide 230b can be formed by a sputtering method, a CVD method, an MBE method, a PLD method, an ALD method, or the like.

In the case where the oxide film to be the oxide 230a and the oxide film to be the oxide 230b are formed by a sputtering method, for example, oxygen or a mixed gas of oxygen and a rare gas is used as a sputtering gas. An increase in the proportion of oxygen contained in the sputtering gas can increase the amount of excess oxygen contained in the oxide film to be formed. In the case where the above oxide films are formed by a sputtering method, the above In-M-Zn oxide target can be used.

Part of oxygen contained in the sputtering gas is supplied to the insulator 224 in some cases, particularly at the formation of the oxide film to be the oxide 230a. Therefore, the proportion of oxygen contained in the sputtering gas used for the formation of the oxide film to be the oxide 230a is preferably higher than or equal to 70%, further preferably higher than or equal to 80%, and still further preferably 100%.

In the case where the oxide film to be the oxide 230b is formed by a sputtering method, when the proportion of oxygen contained in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor in a channel formation region can have relatively high field-effect mobility. Further, when the formation is performed while the substrate is being heated, the crystallinity of the oxide film can be improved. However, one embodiment of the present invention is not limited thereto. In the case where the oxide film to be the oxide 230b is formed by a sputtering method and the proportion of oxygen contained in the sputtering gas is higher than 30% and lower than or equal to 100%, preferably higher than or equal to 70% and lower than or equal to 100%, an oxygen-excess oxide semiconductor is formed. A transistor including an oxygen-excess oxide semiconductor in a channel formation region can have relatively high reliability.

In this embodiment, the oxide film to be the oxide 230a is formed using a target having an atomic ratio of In:Ga:Zn=1:3:4 by a sputtering method. The oxide film to be the oxide 230b is formed using a target having an atomic ratio of In:Ga:Zn=4:2:4.1 by a sputtering method. Note that each of the oxide films is preferably formed by appropriate selection of film formation conditions and an atomic ratio to have characteristics required for the oxide 230.

Next, heat treatment may be performed. For the heat treatment, the above conditions for the heat treatment can be used. By the heat treatment, impurities such as water or hydrogen contained in the oxide film to be the oxide 230a and the oxide film to be the oxide 230b can be removed, for example. In this embodiment, treatment is performed at 400° C. in a nitrogen atmosphere for one hour, and successively another treatment is performed at 400° C. in an oxygen atmosphere for one hour.

Figure 4A:
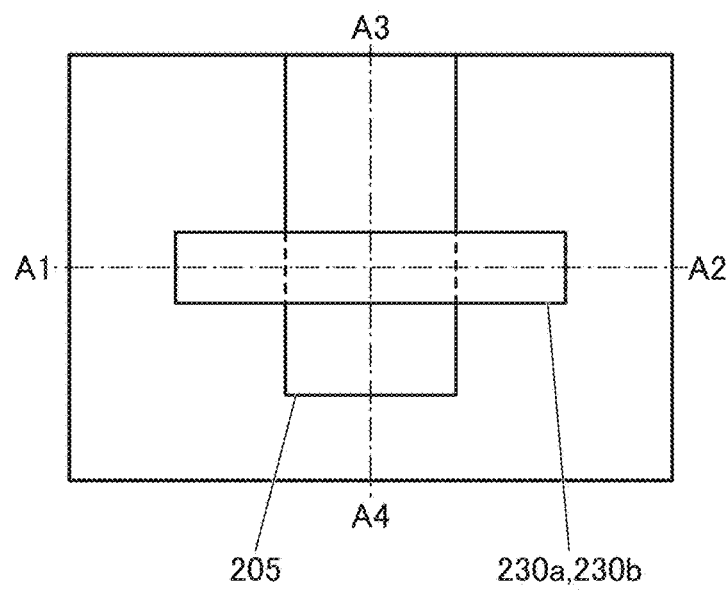
FIGS. 4A to 4C are a top view and cross-sectional views illustrating a manufacturing method of a semiconductor device of one embodiment of the present invention.
Figure 4C:
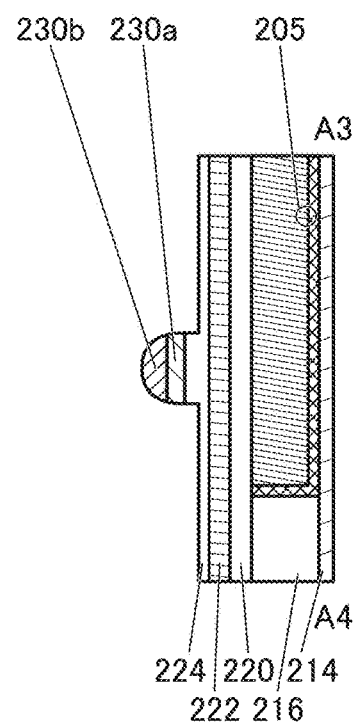
Figure 4B:
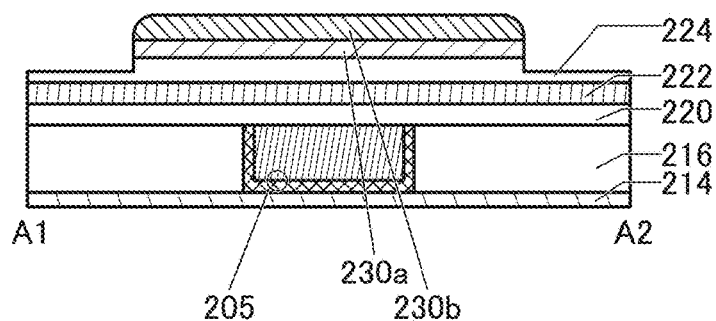

Next, the oxide film to be the oxide 230a and the oxide film to be the oxide 230b are processed into island shapes to form the oxide 230a and the oxide 230b (see FIGS. 4A to 4C).

The oxide 230a and the oxide 230b are formed to overlap with the conductor 205 at least partly. It is preferable that side surfaces of the oxides 230a and 230b be substantially perpendicular to a top surface of the insulator 222. When the side surfaces of the oxides 230a and 230b are substantially perpendicular to the top surface of the insulator 222, the plurality of transistors 200 can be provided in a smaller area and at a higher density. Note that an angle formed by the side surfaces of the oxides 230a and 230b and the top surface of the insulator 222 may be an acute angle. In that case, the angle formed by the side surfaces of the oxides 230a and 230b and the top surface of the insulator 222 is preferably larger.

The oxide 230 has a curved surface between the side surfaces of the oxides 230a and 230b and the top surface of the oxide 230b. That is, an end portion of the side surface and an end portion of the top surface are preferably curved (hereinafter such a curved shape is also referred to as a rounded shape). A radius of curvature of the curved surface at the end portion of the oxide 230b is greater than or equal to 3 nm and less than or equal to 10 nm, preferably greater than or equal to 5 nm and less than or equal to 6 nm. When the end portions are not angular, the coverage with films formed later in the film formation process can be improved.

Note that the oxide film can be processed by a lithography method. The processing can be performed by a dry etching method or a wet etching method. A dry etching method is suitable for microfabrication.

In a lithography method, first, a resist is exposed to light through a mask. Next, a region exposed to light is removed or left using a developing solution, so that a resist mask is formed. Then, etching through the resist mask is conducted. As a result, a conductor, a semiconductor, an insulator, or the like can be processed into a desired shape. The resist mask is formed by, for example, exposure of the resist to KrF excimer laser light, ArF excimer laser light, or extreme ultraviolet (EUV) light. A liquid immersion technique may be employed in which a portion between a substrate and a projection lens is filled with a liquid (e.g., water) to perform light exposure. An electron beam or an ion beam may be used instead of the above-mentioned light. Note that a mask for the exposure of the resist to light is unnecessary in the case of using an electron beam or an ion beam because direct writing is performed on the resist. To remove the resist mask, dry etching treatment such as ashing or wet etching treatment can be used. Alternatively, wet etching treatment can be performed after dry etching treatment. Further alternatively, dry etching treatment can be performed after wet etching treatment.

A hard mask formed of an insulator or a conductor may be used instead of the resist mask. In the case where a hard mask is used, a hard mask with a desired shape can be formed in the following manner: an insulating film or a conductive film that is the material of the hard mask is formed over the oxide film to be the oxide 230b, a resist mask is formed thereover, and then the material of the hard mask is etched. The oxide film to be the oxide 230a and the oxide film to be the oxide 230b may be etched either after or without removing the resist mask. In the latter case, the resist mask is removed during the etching in some cases. The hard mask may be removed by etching after the etching of the oxide films. The hard mask does not need to be removed in the case where the hard mask material does not affect the following process or can be utilized in the following process.

As a dry etching apparatus, a capacitively coupled plasma (CCP) etching apparatus including parallel plate electrodes can be used. The capacitively coupled plasma etching apparatus including parallel plate electrodes may have a structure in which high-frequency power is applied to one of the parallel plate electrodes. Alternatively, different high-frequency powers may be applied to one of the parallel plate electrodes. Further alternatively, high-frequency powers with the same frequency may be applied to the parallel plate electrodes. Still further alternatively, high-frequency powers with different frequencies may be applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

By the above etching treatment, a region of the insulator 224 that does not overlap with the oxide 230b can be thinner than the other region. Alternatively, the insulator 224 may be provided to overlap with the oxide 230a and the oxide 230b to have an island shape.

In some cases, the treatment such as dry etching causes the attachment or diffusion of impurities due to an etching gas or the like to a surface or an inside of the oxide 230a, the oxide 230b, or the like. Examples of the impurities include fluorine and chlorine.

In order to remove the impurities, cleaning is performed. Examples of the cleaning method include wet cleaning using a cleaning solution or the like, plasma treatment using plasma, cleaning by heat treatment, and any of these cleaning methods may be used in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed. In this embodiment, the ultrasonic cleaning using pure water or carbonated water is performed.

Next, heat treatment is preferably performed. The heat treatment may be performed at a temperature higher than or equal to 100° C. and lower than or equal to 400° C., for example, at 200° C. Alternatively, the heat treatment is preferably performed at the same temperature as the formation of the oxide film 230C. Note that the formation temperature is not limited to the substrate temperature during the deposition, and includes the set temperature of the deposition apparatus. For example, in the case where the oxide film 230C is formed at 300° C., the heat treatment is preferably set to 300° C. The heat treatment is preferably performed under reduced pressure, for example, may be performed in a vacuum atmosphere. A vacuum atmosphere is kept by evacuation with a turbo-molecular pump and the like. In the vacuum atmosphere, the pressure in the treatment chamber is set to lower than or equal to $1\times10^{-2}$ Pa, preferably lower than or equal to $1\times10^{-3}$ Pa.

Figure 5A:
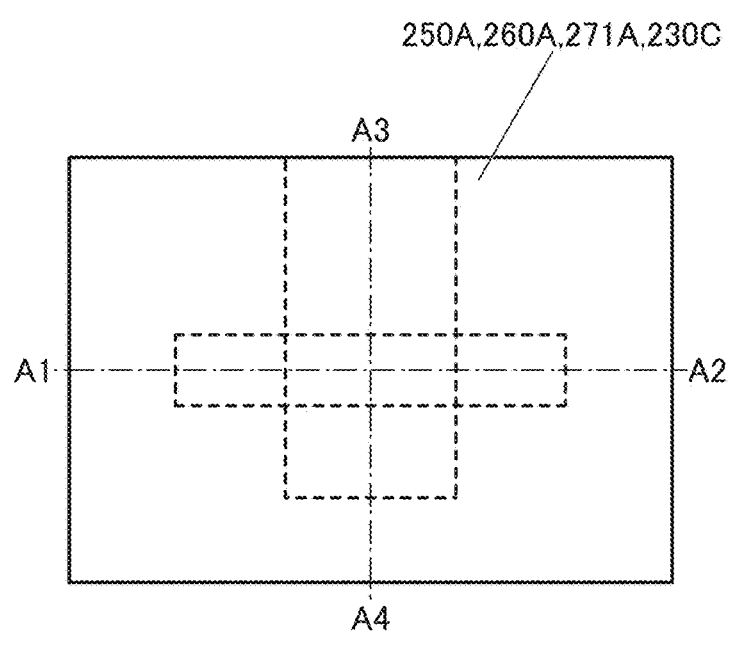
FIGS. 5A to 5C are a top view and cross-sectional views illustrating a manufacturing method of a semiconductor device of one embodiment of the present invention.
Figure 5C:
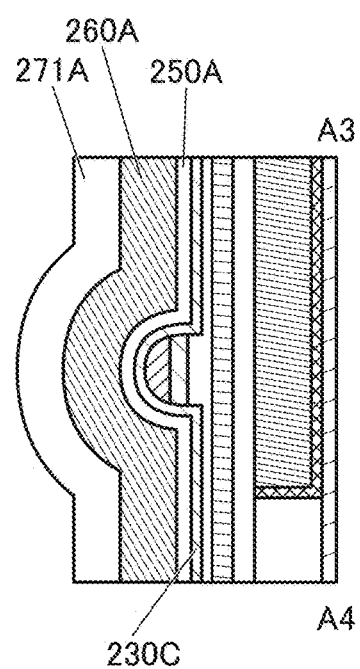
Figure 5B:
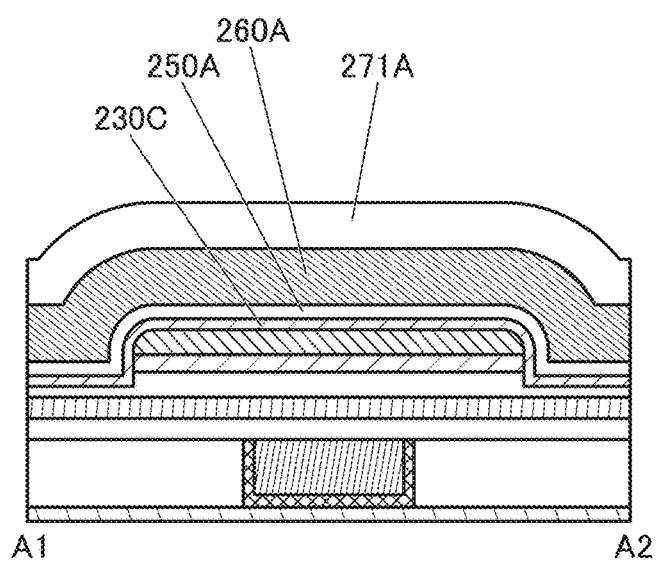

Next, the oxide film 230C to be the oxide 230c is formed over the insulator 224, the oxide 230a, and the oxide 230b (see FIGS. 5A to 5C).

The oxide film 230C can be formed by a sputtering method, a CVD method, an MBE method, a PLD method, an ALD method, or the like. The oxide film 230C may be formed by a method similar to that of the oxide film to be the oxide 230a and the oxide film to be the oxide 230b in accordance with characteristics required for the oxide 230c. In this embodiment, the oxide film 230C is formed using a target having an atomic ratio of In:Ga:Zn=4:2:4.1 by a sputtering method.

Next, an insulating film 250A, a conductive film 260A, and an insulating film 271A are formed in this order over the oxide film 230C (see FIGS. 5A to 5C). Note that the oxide film 230C, the insulating film 250A, the conductive film 260A, and the insulating film 271A may be formed without exposure to the air. In that case, a multi-chamber deposition apparatus is preferably used.

First, the insulating film 250A is formed. The insulating film 250A can be formed by a sputtering method, a CVD method, an MBE method, a PLD method, an ALD method, or the like. As the insulating film 250A, a silicon oxynitride film is preferably formed by a CVD method. The formation temperature of the insulating film 250A is preferably higher than or equal to 350° C. and lower than 450° C., particularly preferably approximately 400° C. When the insulating film 250A is formed at 400° C., an insulator having few impurities can be formed.

Note that oxygen is excited by microwaves to generate high-density oxygen plasma, and the insulating film 250A is exposed to the oxygen plasma, whereby oxygen can be supplied to the insulating film 250A.

Furthermore, heat treatment may be performed. For the heat treatment, the conditions for the above heat treatment can be used. The heat treatment can reduce the moisture concentration and the hydrogen concentration in the insulating film 250A.

Note that a metal oxide film may be formed over the insulating film 250A. As the metal oxide film, an In—Ga—Zn oxide is formed by a sputtering method. The metal oxide film is formed by a sputtering method preferably in an atmosphere containing an oxygen gas. Formation of the metal oxide film in an atmosphere containing an oxygen gas can form an excess oxygen region in the insulating film 250A. The excess oxygen added to the insulating film 250A can compensate for the oxygen vacancy in the oxide 230 when supplied thereto.

Next, the conductive film 260A is formed. The conductive film 260A may have a stacked-layer structure of a first conductive film and a second conductive film. The first and second conductive films can be formed by a sputtering method, a CVD method, an MBE method, a PLD method, an ALD method, or the like. For example, a titanium nitride film is formed as the first conductive film and tungsten is formed as the second conductive film.

Note that an insulating film functioning as a barrier film may be formed over the conductive film 260A. The insulating film can be formed by a sputtering method, a CVD method, an MBE method, a PLD method, an ALD method, or the like. The insulating film, which functions as a barrier film, is formed using an insulating material having a function of inhibiting the passage of oxygen and impurities such as water or hydrogen. For example, aluminum oxide or hafnium oxide is preferably used. In that case, oxidation of the conductor 260 can be inhibited. This can inhibit entry of impurities such as water or hydrogen into the oxide 230 through the conductor 260 and the insulator 250.

Then, the insulating film 271A is formed. The insulating film 271A can be formed by a sputtering method, a CVD method, an MBE method, a PLD method, an ALD method, or the like. Here, the insulating film 271A is preferably thicker than an insulating film 275A to be formed in a later step. In that case, when the insulator 275 is formed in a later step, the insulator 271 can remain easily over the conductor 260.

Next, the insulating film 271A is etched to form the insulator 271. The insulator 271 can function as a hard mask when the conductor 260 and the insulator 250 are formed. Provision of the insulator 271 enables the side surfaces of the insulator 250 and the conductor 260 to be formed substantially perpendicular to the top surface of the substrate.

Figure 6A:
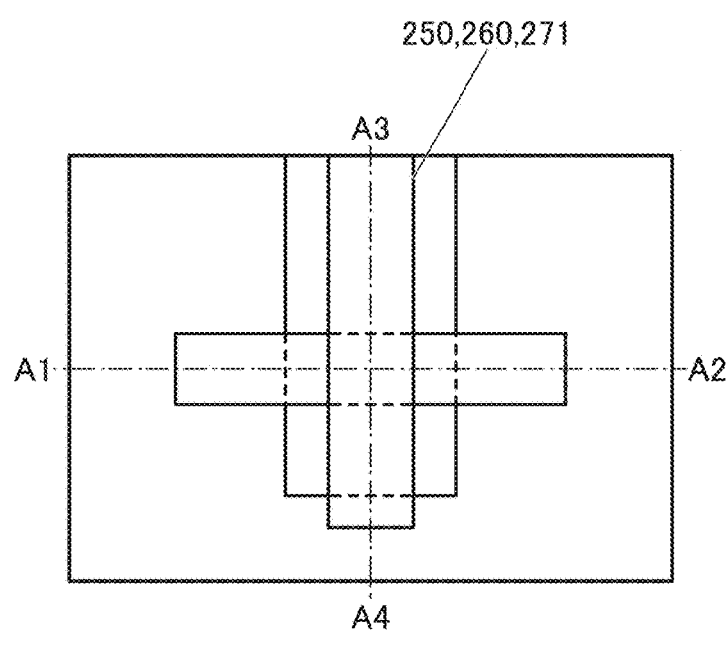
FIGS. 6A to 6C are a top view and cross-sectional views illustrating a manufacturing method of a semiconductor device of one embodiment of the present invention.
Figure 6C:
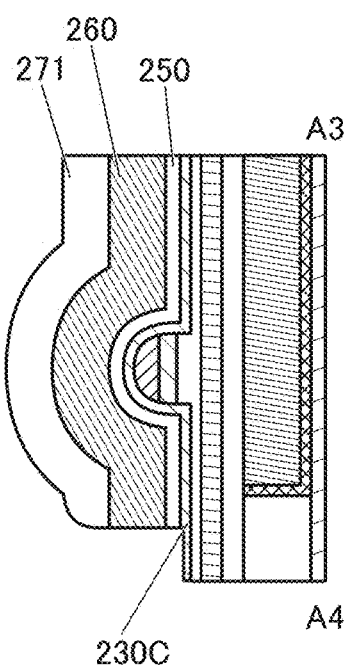
Figure 6B:
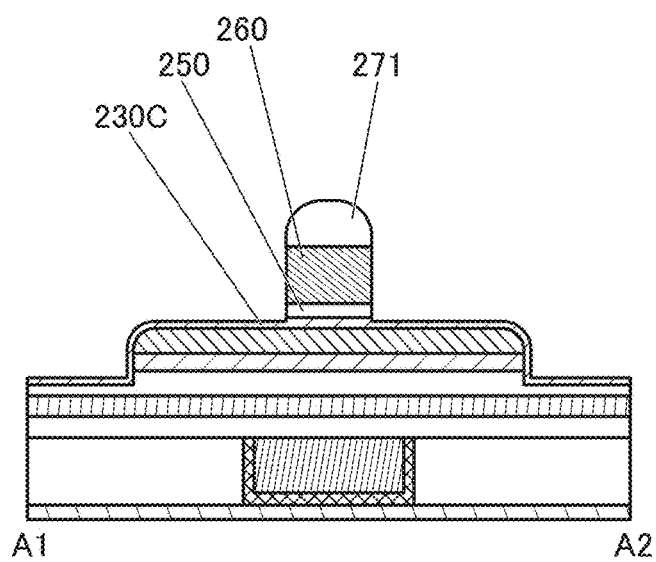

Next, the insulating film 250A and the conductive film 260A are etched using the insulator 271 as a mask to form the insulator 250 and the conductor 260 (see FIGS. 6A to 6C). Here, a region of the oxide film 230C which does not overlap with the insulator 250 and the conductor 260 is thinner than the other regions in some cases. Alternatively, the oxide film 230C may be formed to overlap with the insulator 250 and the conductor 260 to have an island shape.

The insulator 250 and the conductor 260 are formed to overlap with the conductor 205 and the oxide 230 at least partly.

The side surfaces of the insulator 250 and the conductor 260 are preferably on the same surface.

The surface shared by the side surfaces of the insulator 250 and the conductor 260 are preferably perpendicular to the top surface of the substrate. Note that in the cross section, the angle formed by the side surfaces of the insulator 250 and the conductor 260 and the top surface of the oxide 230 may be an acute angle. In that case, the angle formed by the side surfaces of the insulator 250 and the conductor 260 and the top surface of the oxide 230 is preferably as large as possible.

After the processing, the following process may be performed without removal of the hard mask (the insulator 271).

Figure 7A:
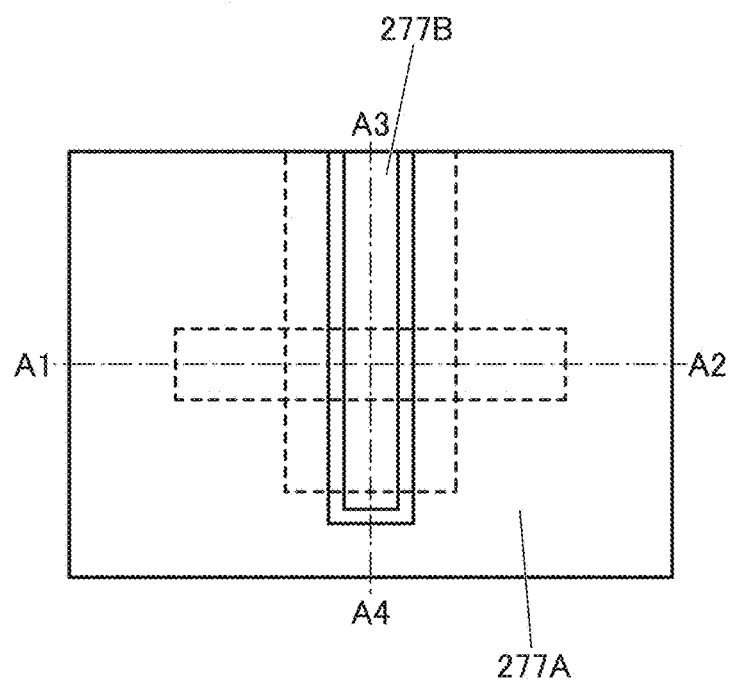
FIGS. 7A to 7C are a top view and cross-sectional views illustrating a manufacturing method of a semiconductor device of one embodiment of the present invention.
Figure 7C:
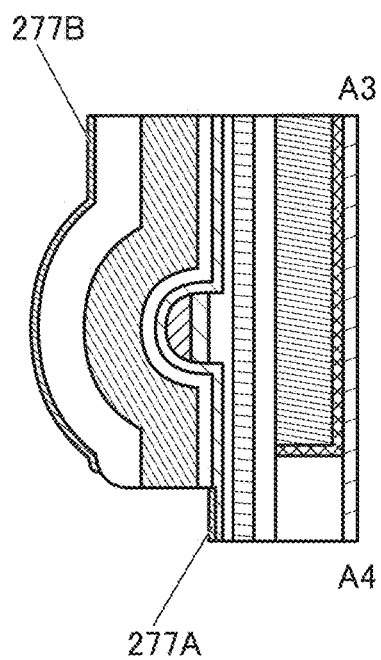
Figure 7B:
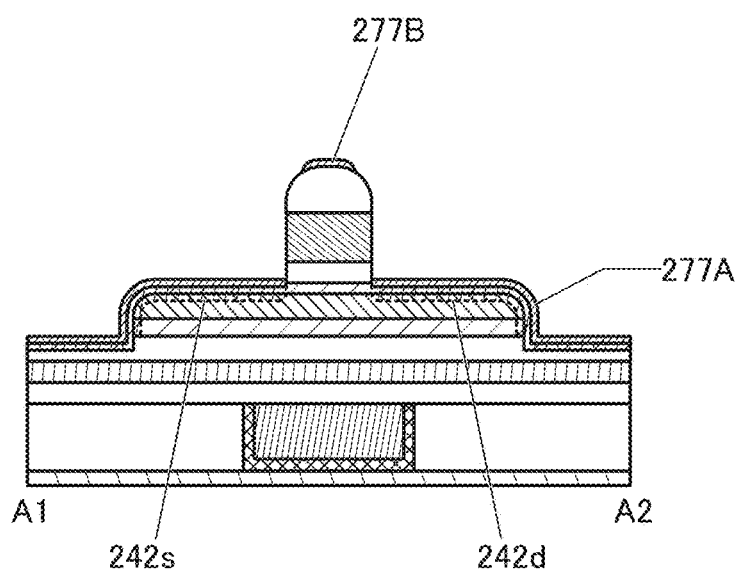

Next, an insulator 277A is formed over the insulator 224 and the oxide film 230C, and concurrently, an insulator 277B is formed over the insulator 271 (see FIGS. 7A to 7C). The insulator 277A and the insulator 277B are preferably formed by a method providing low step coverage, for example, a sputtering method using a target containing aluminum oxide. It is also preferable that the insulator 277 be thinner than the insulator 273. When the formation is performed in such a manner, disconnection is generated in the step formed by the oxide 230, the insulator 250, the conductor 260, and the insulator 271, and accordingly the insulator 277A over the oxide film 230C and the insulator 277B over the insulator 271 can be formed at the same time. Moreover, the insulator 277A can be prevented from being formed to cover the side surface of the insulator 250.

Furthermore, when the insulator 277A is formed by a sputtering method, oxygen vacancies are generated in the oxide 230 and the region 242 with high carrier density can be formed in a self-aligned manner. By addition of a metal element and impurity elements such as hydrogen to the oxide 230b and the oxide film 230C at the same time as the formation of the insulator 277A, the carrier density can be further increased. Furthermore, by heat treatment described later, the impurity elements such as a metal element or hydrogen added to the vicinity of the surface of the oxide 230 can be diffused to form the region 242.

Figure 8A:
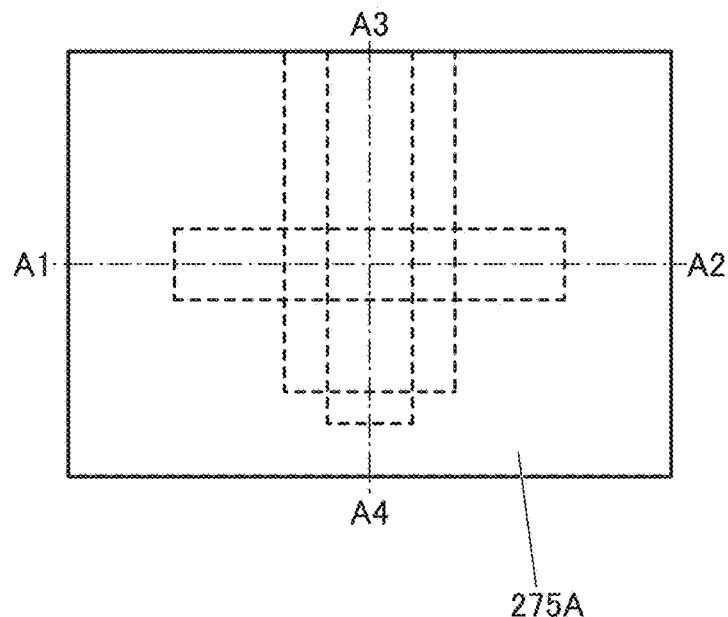
FIGS. 8A to 8C are a top view and cross-sectional views illustrating a manufacturing method of a semiconductor device of one embodiment of the present invention.
Figure 8C:
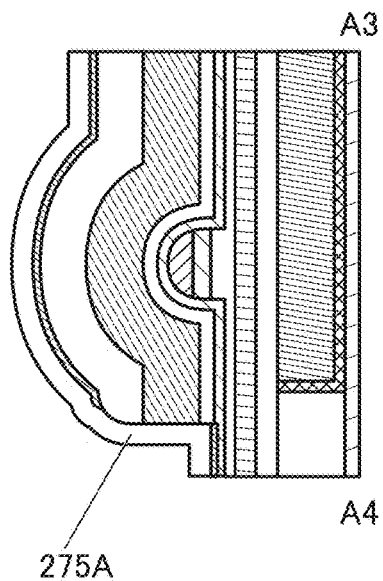
Figure 8B:
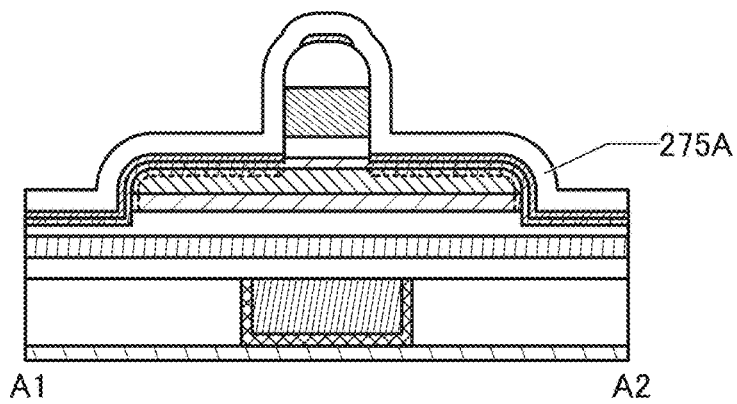

Next, the insulating film 275A is formed to cover the insulator 277A, the insulator 250, the conductor 260, the insulator 271, and the insulator 277B (see FIGS. 8A to 8C). The insulating film 275A can be formed by a sputtering method, a CVD method, an MBE method, a PLD method, an ALD method, or the like. As the insulating film 275A, a silicon oxynitride film is preferably formed by a PECVD method. When the insulating film 275A is formed over the insulator 277A having a small thickness by this method, a metal element and impurity elements such as hydrogen, or nitrogen can be diffused into the oxide 230b and the oxide film 230C to increase the carrier density of the region 242.

The insulating film 275A preferably includes an insulator having a low dielectric constant. For example, the insulating film 275A preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide, silicon oxynitride, silicon nitride oxide, and porous silicon oxide are preferable because an excess oxygen region can be easily formed in the insulator 275 in a later step. In addition, silicon oxide and silicon oxynitride are preferable because of their thermal stability.

Figure 9A:
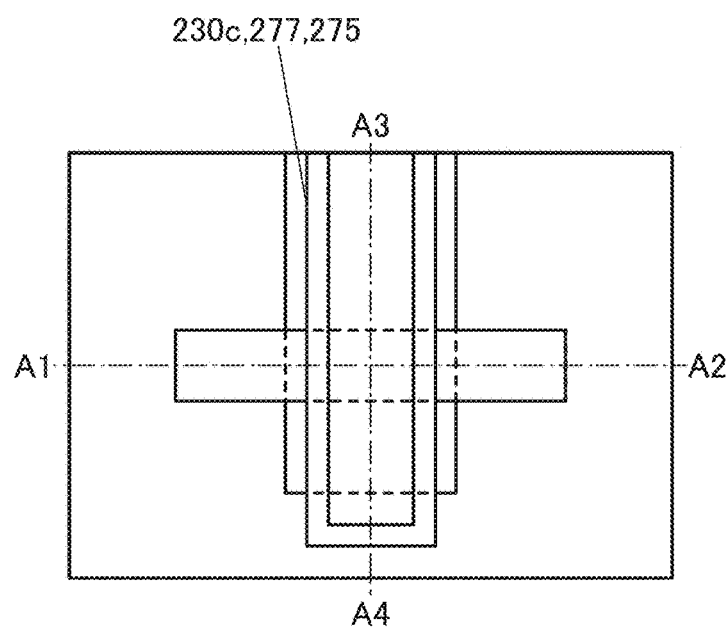
FIGS. 9A to 9C are a top view and cross-sectional views illustrating a manufacturing method of a semiconductor device of one embodiment of the present invention.
Figure 9C:
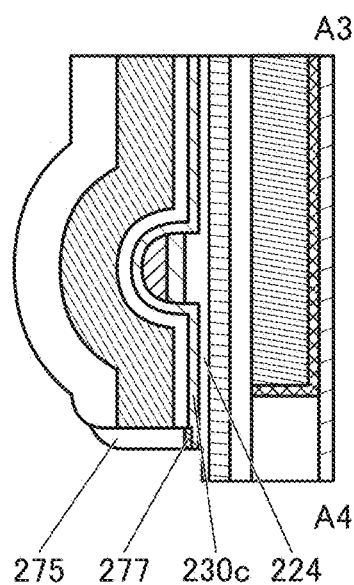
Figure 9B:
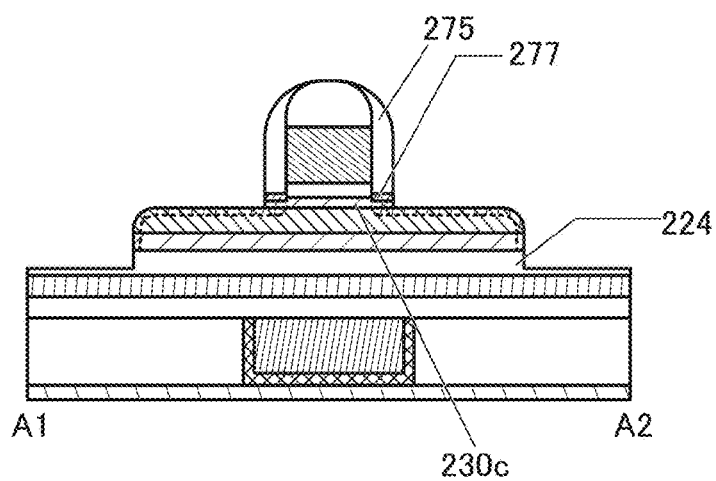

Next, an anisotropic etching is performed on the insulating film 275A, the insulator 277A, and the insulator 277B, whereby the insulator 277 in contact with the top surface of the oxide 230c and the side surface of the insulator 250 and the insulator 275 in contact with the top surface of the insulator 277, the side surface of the insulator 250, the side surface of the conductor 260, and a side surface of the insulator 271 are formed (see FIGS. 9A to 9C). Dry etching is preferably performed as the anisotropic etching. Thus, the insulating film 275A, the insulator 277A, and the insulator 277B which are in regions on the plane substantially parallel to the substrate can be removed, whereby the insulator 275 and the insulator 277 under the insulator 275 can be formed in a self-aligned manner. Note that in this step, the insulator 224 may be processed into an island shape. In that case, the insulator 222 can be used as an etching stopper film.

Figure 10A:
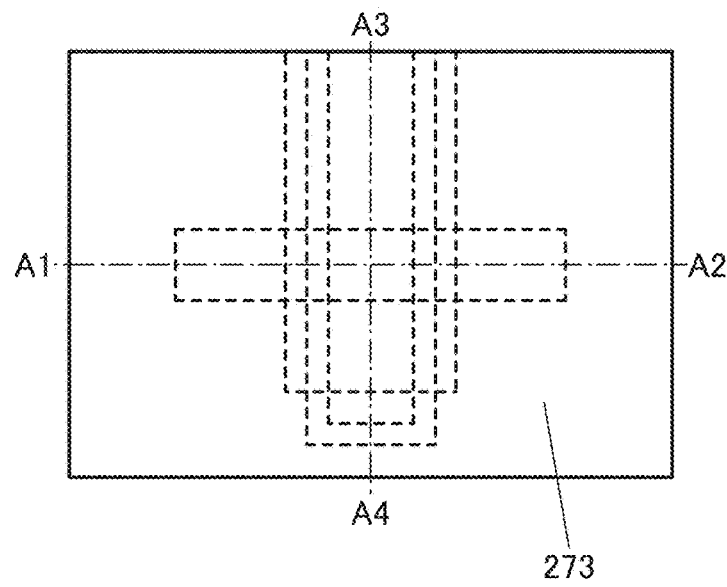
FIGS. 10A to 10C are a top view and cross-sectional views illustrating a manufacturing method of a semiconductor device of one embodiment of the present invention.
Figure 10C:
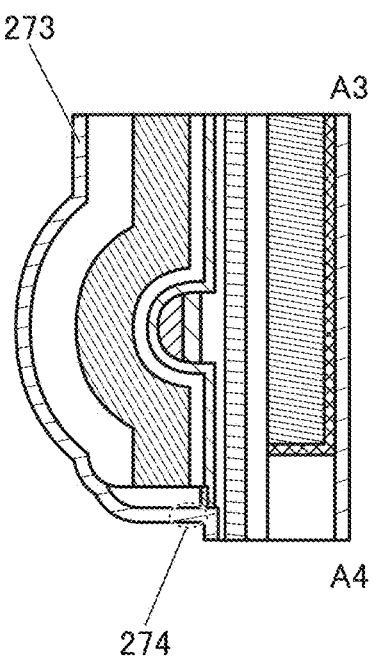
Figure 10B:
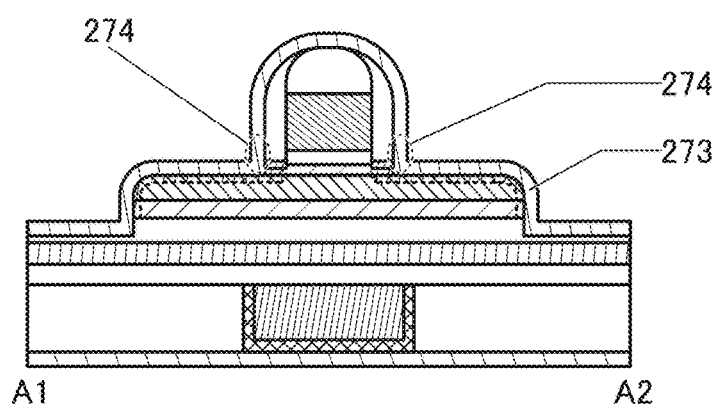

Next, the insulator 273 is formed over the insulator 275 and the oxide 230 (see FIGS. 10A to 10C). The insulator 273 is preferably formed using a method with relatively high deposition rate and low step coverage, and can be formed by a sputtering method, a CVD method, or the like. For example, the insulator 273 is preferably formed by a sputtering method. When the insulator 273 is formed in this manner, the region 274 illustrated in FIG. 2B or FIG. 2C can be formed in the vicinity of the step portion formed by the insulator 277 and the insulator 275.

The insulator 273 is preferably thicker than the insulator 277. Thus, the insulator 273 can be inhibited from including poor coverage in a region other than the region 274, so that a barrier property against oxygen and impurities such as hydrogen can be increased in the region other than the region 274.

Furthermore, when the insulator 273 is formed by a sputtering method, oxygen vacancies can be generated in the region 242, so that the carrier density of the region 242 can be increased.

Figure 11A:
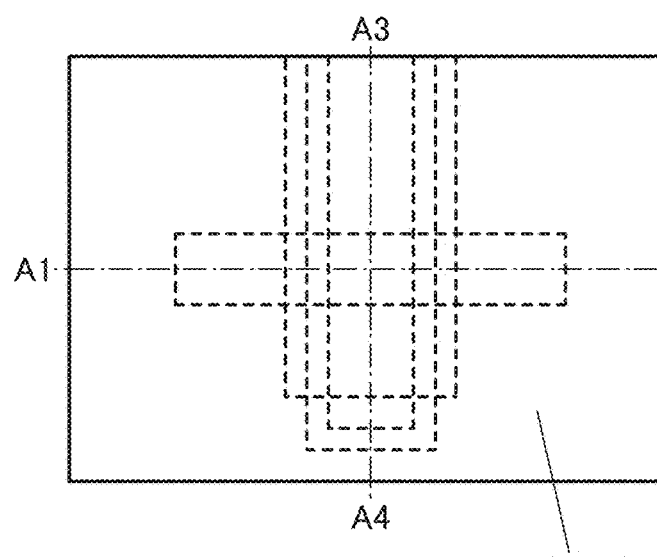
FIGS. 11A to 11C are a top view and cross-sectional views illustrating a manufacturing method of a semiconductor device of one embodiment of the present invention.
Figure 11C:
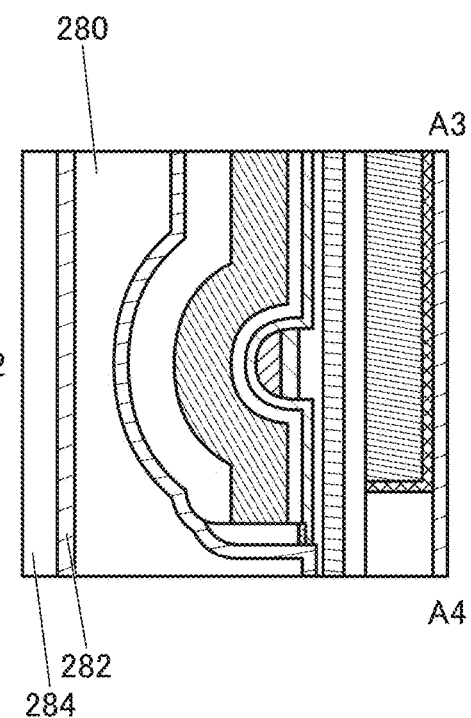
Figure 11B:
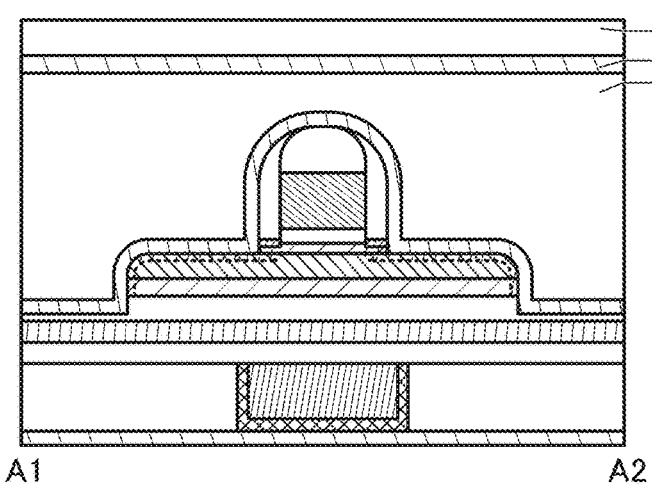

Then, the insulator 280 is formed over the insulator 273 (see FIGS. 11A to 11C). The insulator 280 can be formed by a sputtering method, a CVD method, an MBE method, a PLD method, an ALD method, or the like. Alternatively, the insulator 280 can be formed by a spin coating method, a dipping method, a droplet discharging method (such as an ink-jet method), a printing method (such as screen printing or offset printing), a doctor knife method, a roll coater method, a curtain coater method, or the like. For example, silicon oxynitride may be used for the insulator 280.

Next, the insulator 280 is partly removed. The insulator 280 is preferably formed to have a planar top surface. For example, the insulator 280 may have a planar top surface right after the formation. Alternatively, the insulator 280 may be planarized by removing the insulator or the like from the top surface after the formation so that the top surface becomes parallel to a reference surface such as a rear surface of the substrate. Such treatment is referred to as planarization treatment. As the planarization treatment, CMP treatment, dry etching treatment, or the like can be performed. In this embodiment, CMP treatment is used as the planarization treatment. Note that the top surface of the insulator 280 does not necessarily have such planarity.

Then, the insulator 282 is formed over the insulator 280 (see FIGS. 11A to 11C). The insulator 282 is preferably formed in an atmosphere containing oxygen by a sputtering method. The insulator 282 is preferably formed using an insulating material that is less likely to transmit impurities such as water or hydrogen. For example, the insulator 282 is preferably formed using an oxide of one or both of aluminum and hafnium having a barrier property. In this embodiment, as the insulator 282, an aluminum oxide film is formed in an atmosphere containing oxygen by a sputtering method.

When the insulator 282 is formed in an atmosphere containing oxygen by a sputtering method, oxygen (at least including any of oxygen radicals, oxygen atoms, and oxygen ions) can be introduced into the insulator 280 during the formation. Heat treatment in a later step can diffuse oxygen so that oxygen can be supplied to the oxide 230 effectively.

The insulator 282 is preferably formed while the substrate is being heated. The substrate is preferably heated at higher than 100° C. and lower than or equal to 300° C. The substrate is heated further preferably at higher than or equal to 120° C. and lower than or equal to 250° C. When the substrate is heated at higher than 100° C., water in the oxide 230 can be removed. Furthermore, water can be inhibited from adsorbing on the surface of the formed film. Moreover, when the insulator 282 is formed while the substrate is being heated in this manner, oxygen can be diffused into the insulator 275 and the oxide 230 from the insulator 280 during the film formation.

When the insulator 280 is positioned between the insulators 282 and 273, a large amount of oxygen can be contained in the insulator 280 without being diffused outward.

Note that the method for providing an excess oxygen region in the insulator 280 is not limited to the above. In order to provide the excess oxygen region in the insulator 280, oxygen (at least including any of oxygen radicals, oxygen atoms, and oxygen ions) may be introduced into the insulator 280, so that a region containing excess oxygen is formed.

Then, heat treatment is performed. The heat treatment may be performed at a temperature higher than or equal to 250° C. and lower than or equal to 650° C., preferably higher than or equal to 300° C. and lower than or equal to 500° C. The heat treatment may be performed in an oxygen atmosphere. Alternatively, the heat treatment may be performed in an inert gas atmosphere or an atmosphere containing an oxidizing gas at higher than or equal to 10 ppm, higher than or equal to 1%, or higher than or equal to 10%. Here, as the inert gas, for example, a nitrogen gas or a rare gas can be used. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at higher than or equal to 10 ppm, higher than or equal to 1%, or higher than or equal to 10% in order to compensate for released oxygen. In this embodiment, the heat treatment is performed at 400° C. in an oxygen gas atmosphere for one hour.

As described above, the insulator 273 is provided to cover the conductor 260, the insulator 250, and the oxide 230 in this embodiment. Therefore, as illustrated in FIGS. 2A to 2C, oxygen added to the insulator 280 by the heat treatment does not directly enter the conductor 260, the insulator 250, and the oxide 230, but diffused into the insulator 275 and the insulator 250 through the region 274. The oxygen contained in the insulator 250 is supplied to the oxide 230. In this manner, oxygen is supplied to the oxide 230, particularly to the region 234 functioning as the channel formation region, whereby oxygen vacancies therein can be reduced. Note that since the insulator 277 is provided in contact with the bottom surface of the insulator 275, the region 242 with high carrier density can be maintained in a portion of the oxide 230 that overlaps with the insulator 275 and the insulator 277 while oxygen is supplied to the region 234.

Furthermore, by the heat treatment, impurities such as a metal element added to the vicinity of the surface of the oxide 230 can be diffused, so that the resistance of the region 242 can be reduced in some cases.

Then, the insulator 284 is formed over the insulator 282 (see FIGS. 11A to 11C). As the insulator 284, an insulator containing oxygen, such as a silicon oxide film or a silicon oxynitride film, is formed by a CVD method, for example. The insulator 284 preferably has a lower permittivity than the insulator 282. In the case where a material having a low permittivity is used for an interlayer film, the parasitic capacitance between wirings can be reduced.

Next, openings reaching the oxide 230 are formed in the insulators 284, 282, 280, and 273. The openings may be formed by a lithography method. Note that in order that the conductors 240s and 240d are provided in contact with the top surface and the side surface of the oxide 230, the openings may be formed to reach the oxide 230 such that the top surface and the side surface of the oxide 230 are exposed in the openings.

Next, a conductive film to be the first conductor of the conductor 240 and a conductive film to be the second conductor of the conductor 240 are formed. The conductive films can be formed by a sputtering method, a CVD method, an MBE method, a PLD method, an ALD method, or the like.

Here, part of the region 242 whose resistance is reduced might be removed when the openings are formed in the insulators 284, 282, 280, and 273. In that case, the first conductor of the conductor 240 may be formed using a metal film, a nitride film containing a metal element, or an oxide film containing a metal element. Since the oxide 230 has a region in contact with the first conductor of the conductor 240, a metal compound or an oxygen vacancy is formed in the region, whereby the resistance of the contact area between the oxide 230 and the conductor 240 can be reduced. When the resistance of the oxide 230 that is in contact with the first conductor of the conductor 240 is reduced, the contact resistance between the oxide 230 and the conductor 240 can be reduced. Therefore, the first conductor of the conductor 240 preferably contains a metal element such as aluminum, ruthenium, titanium, tantalum, tungsten, or chromium.

Next, the conductive films to be the conductors 240s and 240d are partly removed by CMP treatment to expose the insulator 284. As a result, the conductive films remain only in the openings, so that the conductors 240s and 240d having flat top surfaces can be formed (see FIGS. 1A to 1C).

Through the above process, the semiconductor device including the transistor 200 can be manufactured. By the manufacturing method of a semiconductor device which is described in this embodiment and illustrated in FIGS. 4A to 4C to FIGS. 11A to 11C, the transistor 200 can be formed.

According to one embodiment of the present invention, a semiconductor device with a high on-state current can be provided. According to one embodiment of the present invention, a semiconductor device with a favorable S-value can be provided. According to one embodiment of the present invention, a semiconductor device with high frequency characteristics can be provided. According to one embodiment of the present invention, a highly reliable semiconductor device can be provided. According to one embodiment of the present invention, a semiconductor device that can be miniaturized or highly integrated can be provided. According to one embodiment of the present invention, a semiconductor device with favorable electrical characteristics can be provided. According to one embodiment of the present invention, a semiconductor device that can be manufactured with high productivity can be provided.

The structures, methods, and the like described in this embodiment can be used in an appropriate combination with any of the structures, methods, and the like described in the other embodiments.

<Modification Example of Semiconductor Device>

An example of a semiconductor device including the transistor 200 of one embodiment of the present invention which is different from the semiconductor device described in <Structure example of semiconductor device> will be described below with reference to FIGS. 12A to 12C and FIGS. 13A to 13C.

Figure 12A:
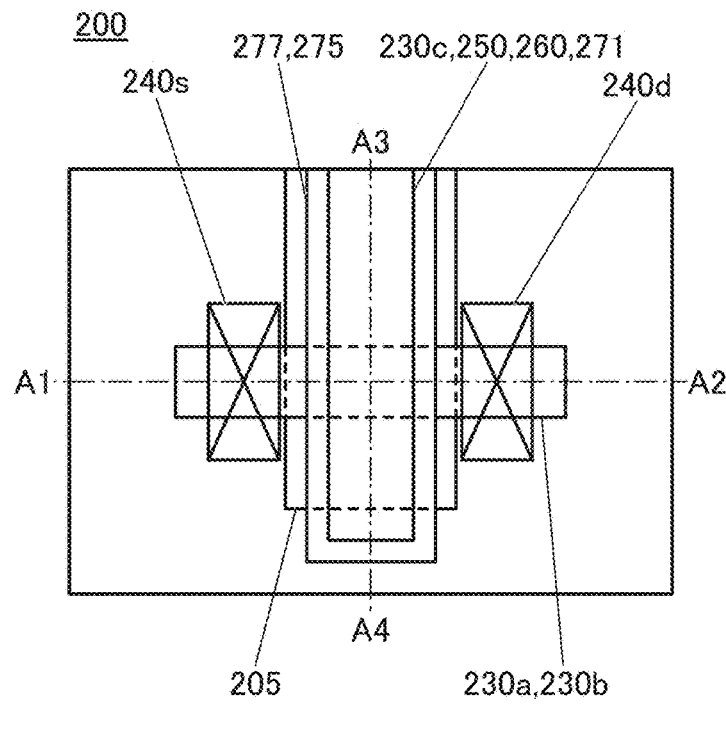
FIGS. 12A to 12C are a top view and cross-sectional views illustrating a semiconductor device of one embodiment of the present invention.
Figure 12C:
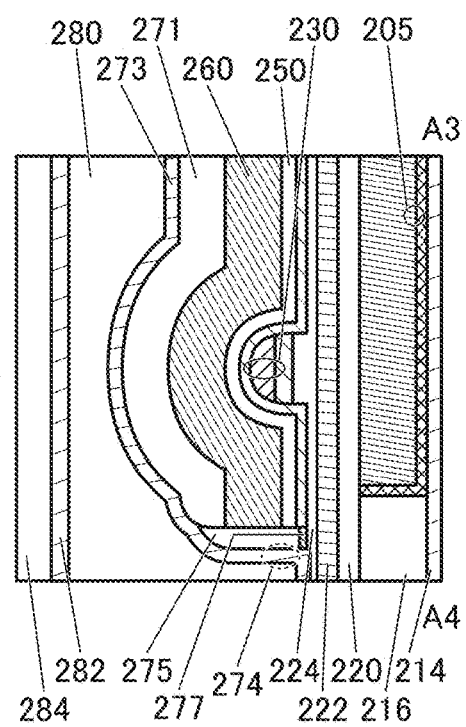
Figure 12B:
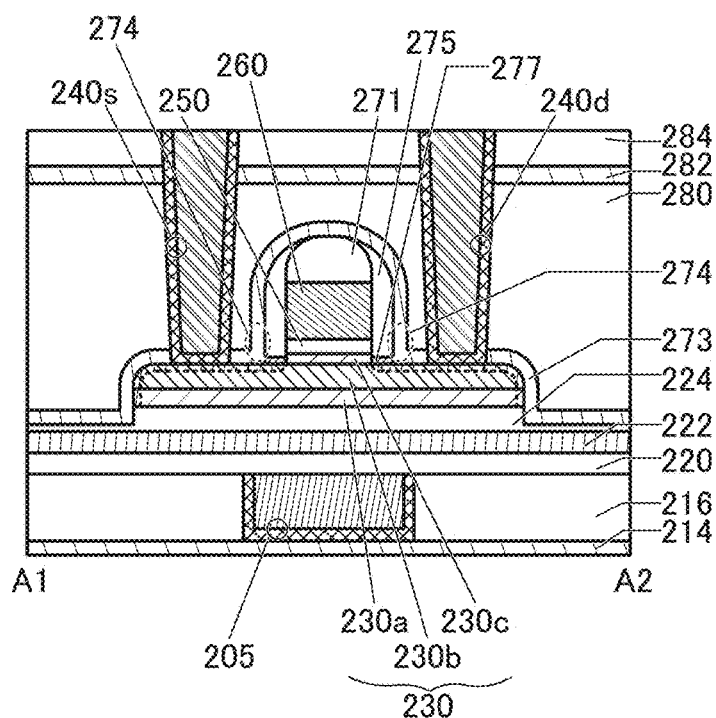
Figure 13A:
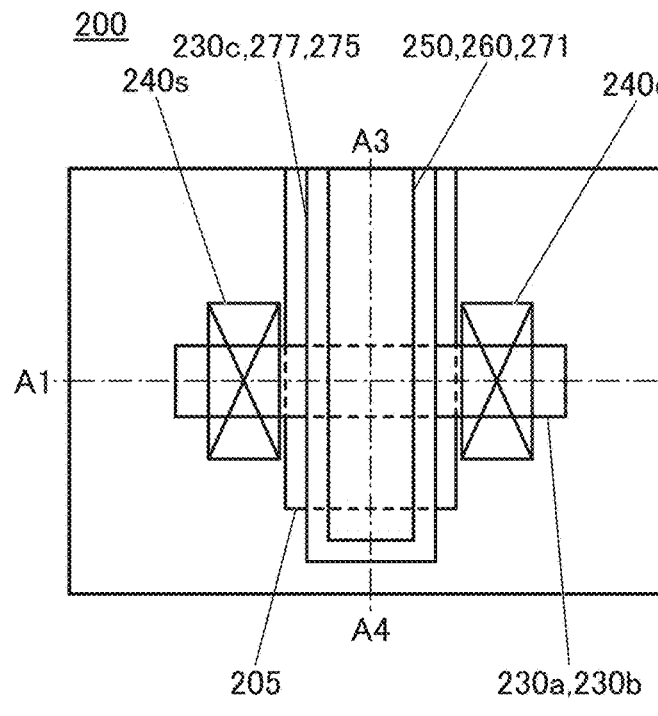
FIGS. 13A to 13C are a top view and cross-sectional views illustrating a semiconductor device of one embodiment of the present invention.
Figure 13C:
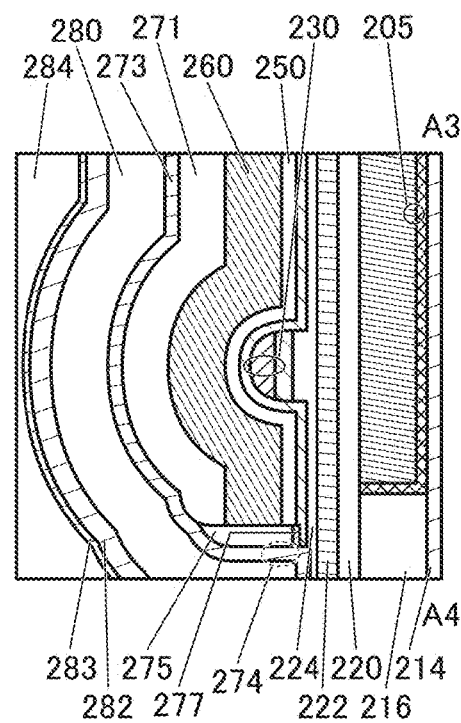
Figure 13B:
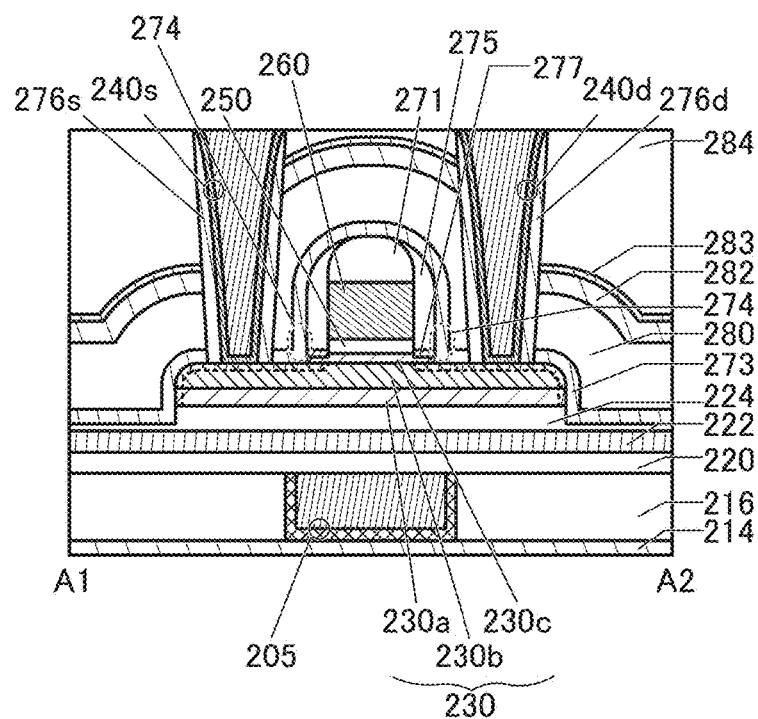

Here, FIG. 12A and FIG. 13A are top views. FIG. 12B and FIG. 13B are cross-sectional views taken along dashed-dotted lines A1-A2 in FIG. 12A and FIG. 13A. FIG. 12C and FIG. 13C are cross-sectional views taken along dashed-dotted lines A3-A4 in FIG. 12A and FIG. 13A. Note that in the top views in FIG. 12A and FIG. 13A, some components are not illustrated for simplification of the drawings.

Note that in the semiconductor device illustrated in FIGS. 12A to 12C and FIGS. 13A to 13C, components having the same functions as the components in the semiconductor device described in <Structure example of semiconductor device> (see FIGS. 1A to 1C) are denoted by the same reference numerals. Note that in this section, the materials described in detail in <Structure example of semiconductor device> can be used as materials for the transistor 200.

The semiconductor device in FIGS. 12A to 12C is different from the semiconductor device in <Structure example of semiconductor device> in that the side surface of the oxide 230c is aligned with the insulator 250 and the conductor 260 in the top view. Thus, the insulator 277 is provided in contact with the top surface of the oxide 230b and the side surface of the oxide 230c. Therefore, when the thickness of the insulator 277 is smaller than the sum of the thicknesses of the oxide 230c and the insulator 250, oxygen can be diffused from the insulator 275 into the insulator 250. Therefore, in the transistor 200 in FIGS. 12A to 12 C, oxygen can be supplied to the oxide 230 more efficiently than in the transistor in FIGS. 1A to 1C.

The semiconductor device in FIGS. 13A to 13C is different from the semiconductor device in <Structure example of semiconductor device> in that an insulator 276 (an insulator 276a and an insulator 276b) functioning as a barrier layer is provided between the conductor 240 and the insulators 280, 282, and 284 functioning as an interlayer film. Note that in the case of this structure, the insulator 276 and the insulator 282 preferably have a barrier property against oxygen, hydrogen, and water.

Specifically, as illustrated in FIGS. 13A to 13C, the insulator 276 is preferably provided between the conductor 240 and the insulator 280 and between the conductor 240 and the insulator 282 having a barrier property. It is particularly preferable that the insulator 276 be provided in contact with the insulator 282 having a barrier property. When the insulator 276 is provided in contact with the insulator 282, the insulator 276 can be extended to the insulator 284 and diffusion of oxygen and impurities can be further inhibited.

That is, with the insulator 276, impurities contained in the insulator 280 can be inhibited from being diffused into the transistor 200 through the conductor 240, so that a decrease in reliability of the semiconductor device can be inhibited. Furthermore, with the insulator 276, the range of choices for the materials for the conductor used as the plug or the wiring can be expanded.

For the insulator 276, for example, a metal oxide can be used. In particular, an insulating film having a barrier property against oxygen or hydrogen such as an aluminum oxide film, a hafnium oxide film, or a gallium oxide film, is preferably used. Alternatively, silicon nitride deposited by a chemical vapor deposition (CVD) method may be used.

The insulator 280 covering the transistor 200 is not necessarily planarized. Since the coverage with the insulator 282 is reduced in the case where the insulator 280 is not planarized, an insulator 283 may be additionally provided. Note that like the insulator 282, the insulator 283 preferably has a function of inhibiting diffusion of oxygen. The insulator 283 is preferably formed by an ALD method. This is because an ALD method enables excellent step coverage and excellent thickness uniformity almost regardless of the shape of an object.

Alternatively, in the case where the insulator 280 is not planarized, the insulator 284 may function as a planarization film that covers a roughness thereunder. This structure makes it easy to form another structure body over the transistor 200, which enables high integration.

Note that the amount of excess oxygen contained in the insulator 280 can be easily derived when the insulator 280 is not planarized. That is, the volume of the insulator 280 affects the amount of excess oxygen that can be contained in the insulator 280. When the insulator 280 is not planarized, the volume of the insulator 280 can be roughly estimated by the thickness of the insulator 280, so that the transistor and the circuit are easily designed.

The structures, the methods, and the like described in this embodiment can be used in an appropriate combination with any of the structures, the methods, and the like described in the other embodiments.

Embodiment 2

In this embodiment, one embodiment of a semiconductor device is described with reference to FIG. 14 and FIG. 15.

[Memory Device 1]

Figure 14:
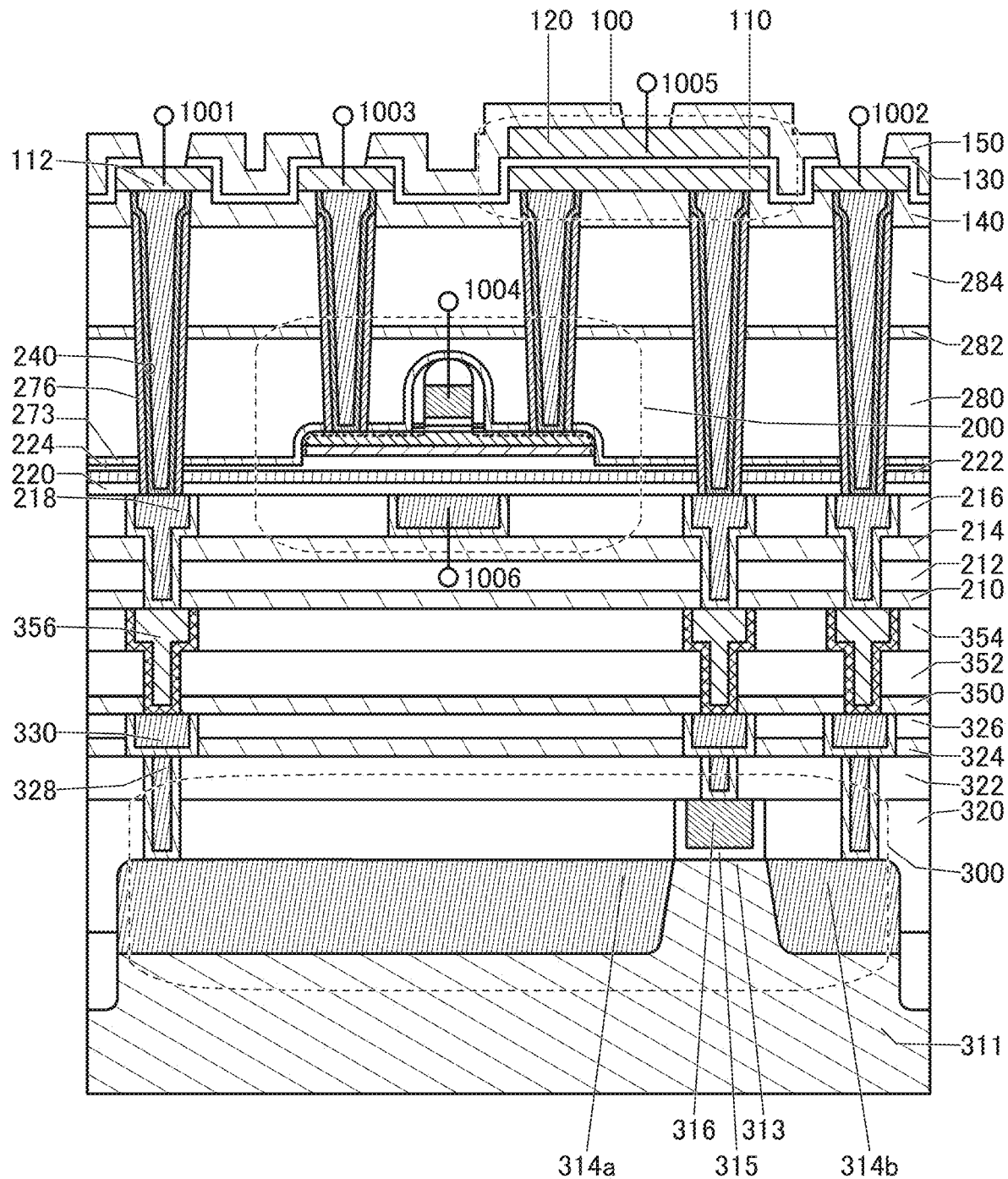
FIG. 14 is a cross-sectional view illustrating a structure of a memory device of one embodiment of the present invention.

FIG. 14 illustrates an example of a semiconductor device (memory device) in which the capacitor of one embodiment of the present invention is used. In the semiconductor device of one embodiment of the present invention, the transistor 200 is provided above a transistor 300, and a capacitor 100 is provided above the transistor 300 and the transistor 200. The transistor 200 described in the above embodiment can be used as the transistor 200.

The transistor 200 is a transistor whose channel is formed in a semiconductor layer containing an oxide semiconductor. Since the transistor 200 has a low off-state current, a memory device including the transistor 200 can retain stored data for a long time. In other words, such a memory device does not require refresh operation or has an extremely low frequency of the refresh operation, which leads to a sufficient reduction in power consumption of the memory device.

In the semiconductor device illustrated in FIG. 14, a wiring 1001 is electrically connected to a source of the transistor 300, and a wiring 1002 is electrically connected to a drain of the transistor 300. A wiring 1003 is electrically connected to one of the source and the drain of the transistor 200. A wiring 1004 is electrically connected to a first gate of the transistor 200. A wiring 1006 is electrically connected to a second gate of the transistor 200. A gate of the transistor 300 and the other of the source and the drain of the transistor 200 are electrically connected to one electrode of the capacitor 100. A wiring 1005 is electrically connected to the other electrode of the capacitor 100.

By arranging the memory devices illustrated in FIG. 14 in a matrix, a memory cell array can be formed.

<Transistor 300>

The transistor 300 is provided in and on a substrate 311 and includes a conductor 316 functioning as a gate electrode, an insulator 315 functioning as a gate insulator, a semiconductor region 313 that is a part of the substrate 311, and a low-resistance region 314a and a low-resistance region 314b functioning as the source region and the drain region. The transistor 300 may be a p-channel transistor or an n-channel transistor.

In the transistor 300 illustrated in FIG. 14, the semiconductor region 313 (part of the substrate 311) in which a channel is formed has a projecting portion. Furthermore, the conductor 316 is provided to cover the top and side surfaces of the semiconductor region 313 with the insulator 315 positioned therebetween. Note that the conductor 316 may be formed using a material for adjusting the work function. The transistor 300 having such a structure is also referred to as a FIN transistor because the projecting portion of the semiconductor substrate is utilized. An insulator functioning as a mask for forming the projecting portion may be provided in contact with the top surface of the projecting portion. Although the case where the projecting portion is formed by processing part of the semiconductor substrate is described here, a semiconductor film having a projecting shape may be formed by processing an SOI substrate.

Note that the transistor 300 illustrated in FIG. 14 is just an example and the structure of the transistor 300 is not limited to that illustrated therein; an appropriate transistor may be used in accordance with a circuit configuration or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, a conductor 112 and the conductor 110 over the conductor 240 can be formed at the same time. Note that the conductor 112 functions as a plug or a wiring that is electrically connected to the capacitor 100, the transistor 200, or the transistor 300.

The conductor 112 and the conductor 110 each have a single-layer structure in FIG. 14; however, one embodiment of the present invention is not limited thereto, and a stacked-layer structure of two or more layers may be used. For example, between a conductor having a barrier property and a conductor having high conductivity, a conductor which is highly adhesive to the conductor having a barrier property and the conductor having high conductivity may be formed.

The insulator 130 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, the insulator 130 preferably has a stacked-layer structure using a material with high dielectric strength such as silicon oxynitride and a high dielectric constant (high-k) material. In the capacitor 100 having such a structure, a sufficient capacitance can be provided owing to the high dielectric constant (high-k) insulator, and the dielectric strength can be increased owing to the insulator with high dielectric strength, so that the electrostatic breakdown of the capacitor 100 can be prevented.

As the insulator using a high dielectric constant (high-k) material (a material having a high dielectric constant), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

As the material having a high dielectric strength (a material having a low dielectric constant), silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

<Wiring Layers>

Wiring layers provided with an interlayer film, a wiring, a plug, and the like may be provided between the structure bodies. A plurality of wiring layers can be provided in accordance with the design. Note that a plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases and part of a conductor functions as a plug in other cases.

For example, an insulator 320, an insulator 322, an insulator 324, and an insulator 326 are stacked over the transistor 300 in this order as interlayer films. A conductor 328, a conductor 330, and the like that are electrically connected to the capacitor 100 or the transistor 200 are provided in the insulators 320, 322, 324, and 326. Note that the conductor 328 and the conductor 330 each function as a plug or a wiring.

The insulator functioning as an interlayer film may function as a planarization film that covers a roughness thereunder. For example, the top surface of the insulator 322 may be planarized by planarization treatment using a chemical mechanical polishing (CMP) method or the like to improve planarity.

A wiring layer may be provided over the insulator 326 and the conductor 330. For example, in FIG. 14, an insulator 350, an insulator 352, and an insulator 354 are stacked in this order. Furthermore, a conductor 356 is formed in the insulators 350, 352, and 354. The conductor 356 functions as a plug or a wiring.

Similarly, a conductor 218, a conductor (the conductor 205) included in the transistor 200, and the like are provided in the insulators 210, 212, 214, and 216. Note that the conductor 218 functions as a plug or a wiring that is electrically connected to the capacitor 100 or the transistor 300. In addition, an insulator 150 is provided over the conductor 120 and the insulator 130.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having a low dielectric constant is used for the insulator functioning as an interlayer film, the parasitic capacitance between wirings can be reduced. Accordingly, a material is preferably selected in accordance with the function of an insulator.

For example, the insulators 150, 212, 352, and 354 and the like preferably include an insulator having a low dielectric constant. For example, the insulator preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Because silicon oxide and silicon oxynitride have thermal stability, a combination of silicon oxide or silicon oxynitride with a resin allows the stacked-layer structure to be thermally stable and have a low dielectric constant. Examples of the resin include polyester, polyolefin, polyamide (e.g., nylon and aramid), polyimide, polycarbonate, and acrylic.

It is preferable that one or both of the insulator 130 over the conductor 112 and the insulator 150 over the conductor 120 have a resistivity of higher than or equal to $1.0 \times 10^{12}$ Ωcm and lower than or equal to $1.0 \times 10^{15}$ Ωcm, preferably higher than or equal to $5.0 \times 10^{12}$ Ωcm and lower than or equal to $1.0 \times 10^{14}$ Ωcm, further preferably higher than or equal to $1.0 \times 10^{13}$ Ωcm and lower than or equal to $5.0 \times 10^{13}$ Ωcm. One or both of the insulator 130 and the insulator 150 preferably have the above-described resistivity because the insulator can disperse charges accumulated between wirings such as the transistor 200, the transistor 300, the capacitor 100, the conductor 112, and the conductor 120, while keeping its insulating property; thus, characteristics defects and electrostatic breakdown can be inhibited from being caused in a transistor or a memory device including the transistor. As such an insulator, a silicon nitride or a silicon nitride oxide can be used.

As the insulator having the above-described resistivity, an insulator 140 may be provided under the conductor 112. In that case, the insulator 140 is formed over the insulator 284, and an opening is formed in the insulators 140, 284, 282, 280, 273, and the like, and then the insulator 276 or the conductor 240 that is electrically connected to the transistor 200, the conductor 218, and the like can be formed in the opening. The insulator 140 can be formed using a material similar to that for the insulator 130 or the insulator 150.

Note that when the transistor including an oxide semiconductor is surrounded by an insulator having a function of inhibiting the passage of oxygen and impurities such as hydrogen, the electrical characteristics of the transistor can be stabilized. Thus, the insulator having a function of inhibiting the passage of oxygen and impurities such as hydrogen is preferably used for the insulator 210, the insulator 350, and the like.

The insulator having a function of inhibiting the passage of oxygen and impurities such as hydrogen can have, for example, a single-layer structure or a stacked-layer structure of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

The conductors that can be used for wirings or plugs can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having a high electric conductivity typified by polycrystalline silicon containing an impurity element such as phosphorus, or silicide such as nickel silicide may be used.

For example, the conductors 328, 330, 356, 218, 112, and the like may have a single-layer structure or a stacked-layer structure using a conductive material such as a metal material, an alloy material, a metal nitride material, or a metal oxide material which is formed using the above materials. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<<Wirings or Plugs in a Layer Provided with an Oxide Semiconductor>>

In the case where an oxide semiconductor is used in the transistor 200, an insulator including excess oxygen region is provided in the vicinity of the oxide semiconductor in some cases. In that case, an insulator having a barrier property is preferably provided between the insulator including the excess oxygen region and the conductor provided in the insulator including the excess oxygen region.

For example, the insulator 276 is preferably provided between the insulator 224 and the conductor 240 in FIG. 14. In particular, the insulator 276 is preferably provided in contact with the insulator 273 and the insulator 222 which sandwich the insulator 224 containing oxygen therebetween. Since the insulator 276 is provided in contact with the insulator 222 and the insulator 273, the insulator 224 and the transistor 200 can be sealed by the insulators having a barrier property. It is also preferable that the insulator 276 be in contact with part of the insulator 280. When the insulator 276 extends to the insulator 280, diffusion of oxygen and impurities can be further inhibited.

That is, the insulator 276 can inhibit oxygen contained in the insulator 224 from being absorbed by the conductor 240. In addition, the insulator 276 can inhibit diffusion of hydrogen, which is an impurity, into the transistor 200 through the conductor 240.

The insulator 276 is preferably formed using an insulating material having a function of inhibiting diffusion of oxygen and impurities such as water or hydrogen. For example, aluminum oxide or hafnium oxide is preferably used. Alternatively, for example, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride can be used.

The above is the description of the structure example. With the use of the structure, a semiconductor device using a transistor including an oxide semiconductor can have a small variation in electrical characteristics and higher reliability. Alternatively, a transistor including an oxide semiconductor with a high on-state current can be provided. Alternatively, a transistor including an oxide semiconductor with low off-state current can be provided. Alternatively, a semiconductor device with low power consumption can be provided.

[Memory Device 2]

Figure 15:
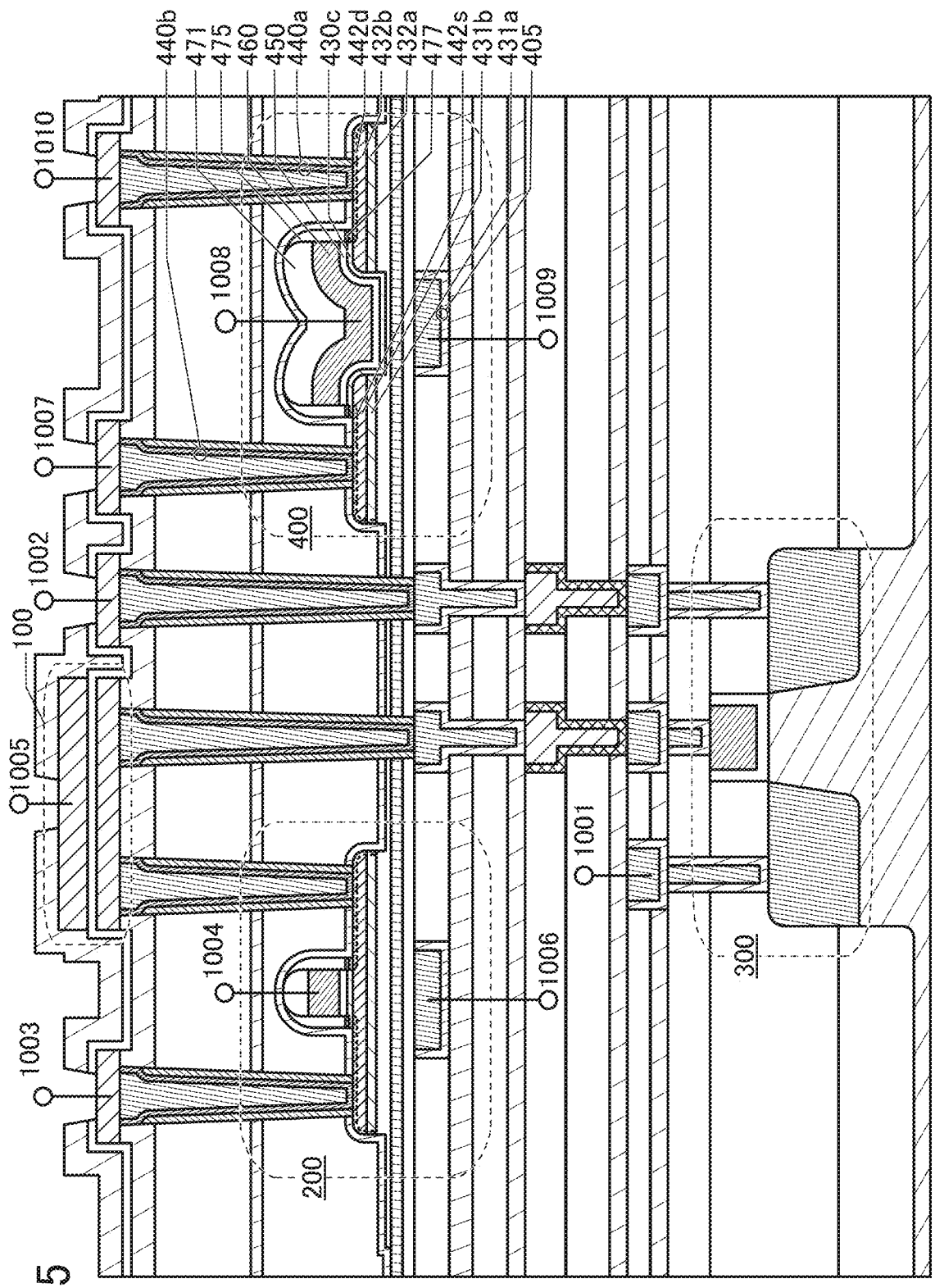
FIG. 15 is a cross-sectional view illustrating a structure of a memory device of one embodiment of the present invention.

FIG. 15 illustrates an example of a memory device using the semiconductor device of one embodiment of the present invention. The memory device illustrated in FIG. 15 includes a transistor 400 in addition to the transistor 200, the transistor 300, and the capacitor 100 illustrated in FIG. 14.

The transistor 400 can control a second gate voltage of the transistor 200. For example, a first gate and a second gate of the transistor 400 are diode-connected to a source of the transistor 400, and the source thereof is connected to the second gate of the transistor 200. When a negative potential of the second gate of the transistor 200 is held in this structure, a first gate-source voltage and a second gate-source voltage of the transistor 400 are 0 V. In the transistor 400, a drain current when the second gate voltage and the first gate voltage are 0 V is extremely low; thus, the negative potential of the second gate of the transistor 200 can be held for a long time even without power supply to the transistors 200 and 400. Accordingly, the memory device including the transistors 200 and 400 can retain stored data for a long time.

In FIG. 15, the wiring 1001 is electrically connected to the source of the transistor 300. The wiring 1002 is electrically connected to the drain of the transistor 300. The wiring 1003 is electrically connected to one of the source and the drain of the transistor 200. The wiring 1004 is electrically connected to the gate of the transistor 200. The wiring 1006 is electrically connected to a back gate of the transistor 200. The gate of the transistor 300 and the other of the source and the drain of the transistor 200 are electrically connected to one electrode of the capacitor 100. The wiring 1005 is electrically connected to the other electrode of the capacitor 100. A wiring 1007 is electrically connected to the source of the transistor 400. A wiring 1008 is electrically connected to a gate of the transistor 400. A wiring 1009 is electrically connected to a back gate of the transistor 400. A wiring 1010 is electrically connected to the drain of the transistor 400. The wiring 1006, the wiring 1007, the wiring 1008, and the wiring 1009 are electrically connected to each other.

When the memory devices in FIG. 15 are arranged in a matrix like the memory devices illustrated in FIG. 14, a memory cell array can be formed. Note that one transistor 400 can control second gate voltages of the transistors 200. For this reason, the number of transistors 400 is preferably smaller than the number of transistors 200.

[Transistor 400]

The transistor 400 and the transistors 200 are formed in the same layer and thus can be fabricated in parallel. The transistor 400 includes a conductor 460 functioning as a first gate electrode; a conductor 405 functioning as a second gate electrode; the insulator 220, the insulator 222, the insulator 224, and an insulator 450 functioning as a gate insulating layer; an oxide 430*c* including a region where a channel is formed; an insulator 471; an insulator 475; an insulator 477; a region 442*s*, an oxide 431*a*, and an oxide 431*b* functioning as one of a source and a drain; a region 442*d*, an oxide 432*a*, and an oxide 432*b* functioning as the other of the source and the drain; and a conductor 440 (a conductor 440*a* and a conductor 440*b*).

In the transistor 400, the conductor 405 is in the same layer as the conductor 205. The oxides 431*a* and 432*a* are in the same layer as the oxide 230*a*, and the oxides 431*b* and 432*b* are in the same layer as the oxide 230*b*. The oxide 430*c* is in the same layer as the oxide 230*c*. The insulator 450 is in the same layer as the insulator 250. The conductor 460 is in the same layer as the conductor 260. The insulator 471 is in the same layer as the insulator 271. The insulator 475 is in the same layer as the insulator 275. The insulator 477 is in the same layer as the insulator 277.

Note that the structure body in the same layer can be formed at the same time. For example, the oxide 430c can be formed by processing an oxide film to be the oxide 230c.

In the oxide 430c functioning as an active layer of the transistor 400, oxygen vacancies and impurities such as hydrogen or water are reduced, as in the oxide 230 or the like. Accordingly, the threshold voltage of the transistor 400 can be higher than 0 V, an off-state current can be reduced, and the drain current when the second gate voltage and the first gate voltage are 0 V can be extremely low.

<<Dicing Line>>

Here, a dicing line (also referred to as a scribe line, a dividing line, or a cutting line) that is provided when a large-sized substrate is divided into semiconductor elements so that a plurality of semiconductor devices are each formed in a chip form will be described below. In an example of a dividing method, for example, a groove (a dicing line) for separating the semiconductor elements is formed on the substrate, and then the substrate is cut along the dicing line so that a plurality of semiconductor devices that are separated are obtained.

Here, for example, as illustrated in FIG. 15, it is preferable that a region in which the insulator 273 and the insulator 222 are in contact with each other be the dicing line. That is, an opening is provided in the insulator 224 in the vicinity of the region to be the dicing line that is provided in an outer edge of the transistor 400 and the memory cell including a plurality of transistors 200. The insulator 273 is provided to cover the side surface of the insulator 224.

That is, in the opening provided in the insulator 224, the insulator 222 is in contact with the insulator 273. For example, the insulator 222 and the insulator 273 may be formed using the same material and the same method. When the insulator 222 and the insulator 273 are formed using the same material and the same method, the adhesion therebetween can be increased. For example, aluminum oxide is preferably used.

With such a structure, the insulator 224, the transistor 200 and the transistor 400 can be enclosed with the insulators 222 and 273. Since the insulators 222 and 273 have a function of inhibiting diffusion of oxygen, hydrogen, and water even when the substrate is divided into circuit regions each of which is provided with the semiconductor elements in this embodiment to form a plurality of chips, the entry and diffusion of impurities such as hydrogen or water from the direction of a side surface of the divided substrate to the transistor 200 or the transistor 400 can be inhibited.

Furthermore, in the structure, oxygen in the insulator 224 can be inhibited from being diffused into the outside of the insulators 273 and 222. Accordingly, oxygen in the insulator 224 is efficiently supplied to the oxide where the channel is formed in the transistor 200 or the transistor 400. The oxygen can reduce oxygen vacancies in the oxide where the channel is formed in the transistor 200 or the transistor 400. Thus, the oxide where the channel is formed in the transistor 200 or the transistor 400 can be an oxide semiconductor with a low density of defect states and stable characteristics. That is, the transistor 200 or the transistor 400 can have a small variation in the electrical characteristics and higher reliability.

This embodiment can be implemented in an appropriate combination with any of the structures described in the other embodiments and the like.

Embodiment 3

In this embodiment, a memory device of one embodiment of the present invention including a transistor in which an oxide is used for a semiconductor (hereinafter referred to as an OS transistor in some cases) and a capacitor (hereinafter, such a memory device is also referred to as an OS memory device in some cases), is described with reference to FIGS. 16A and 16B and FIGS. 17A to 17H. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 16A:
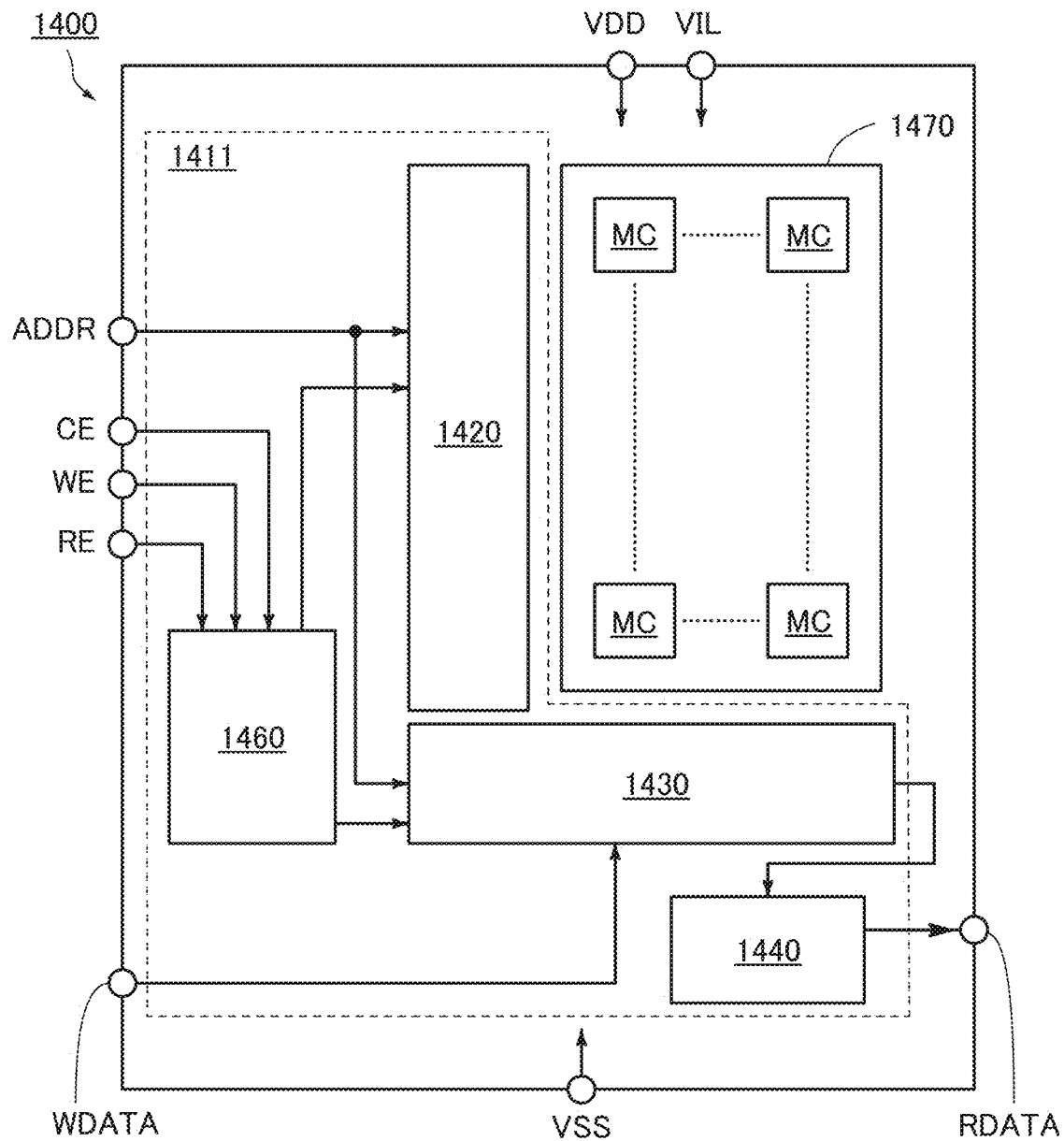
FIGS. 16A and 16B are a block diagram and a perspective view illustrating a configuration example of a memory device of one embodiment of the present invention.

FIG. 16A illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and will be described later. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the signals (CE, WE, and RE) input from the outside, and generates control signals for the row decoder and the column decoder. The signal CE is a chip enable signal, the signal WE is a write enable signal, and the signal RE is a read enable signal. Signals processed by the control logic circuit 1460 are not limited thereto, and other control signals may be input as necessary.

The memory cell array 1470 includes a plurality of memory cells MC and a plurality of wirings arranged in a matrix. Note that the number of the wirings that connect the memory cell array 1470 to the row circuit 1420 depends on the configuration of the memory cell MC, the number of the memory cells MC in a column, and the like. The number of the wirings that connect the memory cell array 1470 to the column circuit 1430 depends on the configuration of the memory cell MC, the number of the memory cells MC in a row, and the like.

Figure 16B:
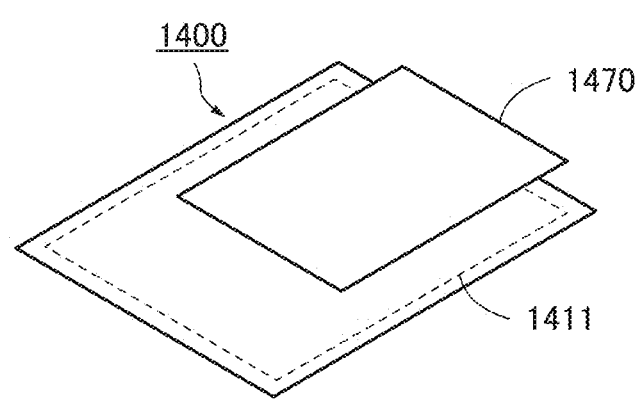

Note that FIG. 16A illustrates an example in which the peripheral circuit 1411 and the memory cell array 1470 are formed on the same plane; however, this embodiment is not limited thereto. For example, as illustrated in FIG. 16B, the memory cell array 1470 may be provided over the peripheral circuit 1411 to partly overlap with the peripheral circuit 1411. For example, the sense amplifier may be provided below the memory cell array 1470 so that they overlap with each other.

FIGS. 17A to 17H each illustrate a configuration example of a memory cell applicable to the memory cell MC.

[DOSRAM]

Figure 17A:
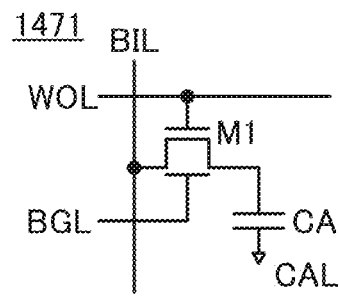
FIGS. 17A to 17H are circuit diagrams each illustrating a configuration example of a memory device of one embodiment of the present invention.
Figure 17B:
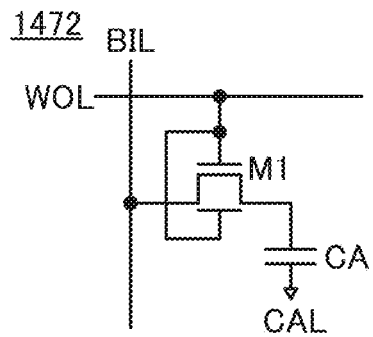
Figure 17C:
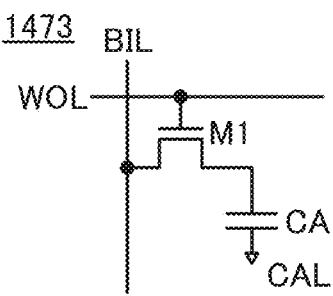
Figure 17D:
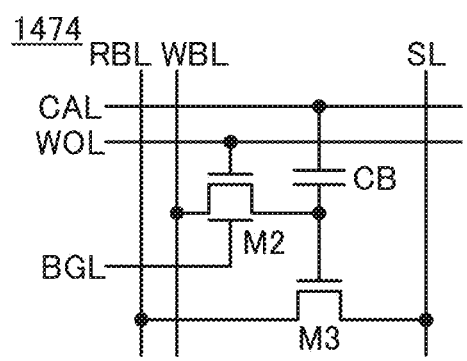
Figure 17E:
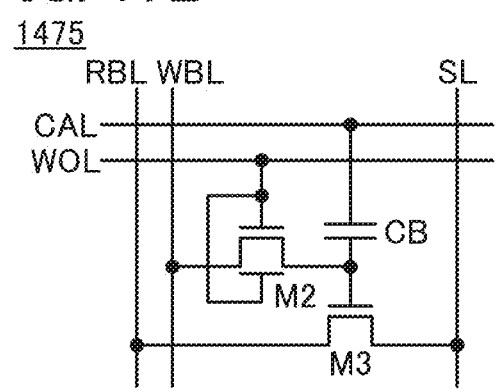
Figure 17F:
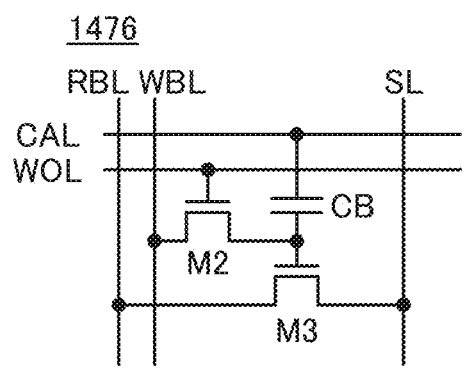
Figure 17G:
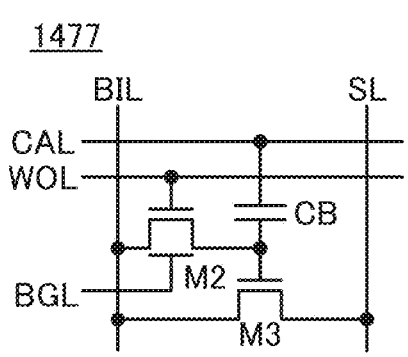

FIGS. 17A to 17C each illustrate a circuit configuration example of a memory cell of a DRAM. In this specification and the like, a DRAM using a memory cell including one OS transistor and one capacitor is referred to as a dynamic oxide semiconductor random access memory (DOSRAM) in some cases. A memory cell 1471 illustrated in FIG. 17A includes a transistor M1 and a capacitor CA. Note that the transistor M1 includes a gate (also referred to as a front gate in some cases) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. When a given potential is applied to the wiring BGL, the threshold voltage of the transistor M1 can be changed.

The circuit configuration of the memory cell MC is not limited to that of the memory cell 1471, and the circuit configuration can be changed. For example, as in a memory cell 1472 illustrated in FIG. 17B, the back gate of the transistor M1 may be connected not to the wiring BGL but to the wiring WOL in the memory cell MC. Alternatively, for example, the transistor M1 may be a single-gate transistor, that is, a transistor without a back gate in the memory cell MC as in a memory cell 1473 illustrated in FIG. 17C.

In the case where the semiconductor device described in any of the above embodiments is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of the refresh operation for the memory cell can be decreased. In addition, refresh operation for the memory cell can be omitted. In addition, since the transistor M1 has an extremely low leakage current, multi-level data or analog data can be retained in the memory cells 1471, 1472, and 1473.

In the DOSRAM, when the sense amplifier is provided below the memory cell array 1470 so that they overlap with each other as described above, the bit line can be shortened. A shorter bit line results in smaller bit line capacitance, which allows the storage capacitance of the memory cell to be reduced.

[NOSRAM]

FIGS. 17D to 17H each illustrate a circuit configuration example of a gain-cell memory cell including two transistors and one capacitor. A memory cell 1474 illustrated in FIG. 17D includes a transistor M2, a transistor M3, and a capacitor CB. Note that the transistor M2 includes a front gate (simply referred to as a gate in some cases) and a back gate. In this specification and the like, a memory device including a gain-cell memory cell using an OS transistor as the transistor M2 is referred to as a nonvolatile oxide semiconductor RAM (NOSRAM) in some cases.

A first terminal of the transistor M2 is connected to a first terminal of the capacitor CB. A second terminal of the transistor M2 is connected to a wiring WBL. A gate of the transistor M2 is connected to the wiring WOL. A back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a predetermined potential to the back gate of the transistor M2. The threshold voltage of the transistor M2 can be increased or decreased by supplying a given potential to the wiring BGL.

The circuit configuration of the memory cell MC is not limited to that of the memory cell 1474, and the circuit configuration can be changed as appropriate. For example, as in a memory cell 1475 illustrated in FIG. 17E, the back gate of the transistor M2 may be connected not to the wiring BGL but to the wiring WOL in the memory cell MC. Alternatively, for example, the transistor M2 may be a single-gate transistor, that is, a transistor without a back gate in the memory cell MC as in a memory cell 1476 illustrated in FIG. 17F. For example, the memory cell MC may have a structure in which the wirings WBL and RBL are combined into one wiring BIL as in a memory cell 1477 illustrated in FIG. 17G.

In the case where the semiconductor device described in any of the above embodiments is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. That is, with the use of the transistor M2, written data can be retained for a long time, and thus the frequency of the refresh operation for the memory cell can be decreased. In addition, refresh operation for the memory cell can be omitted. In addition, since the transistor M2 has an extremely low leakage current, multi-level data and analog data can be retained in the memory cell 1474. The same applies to the memory cells 1475 to 1477.

Note that the transistor M3 may be a transistor containing silicon in a channel formation region (hereinafter, also referred to as a Si transistor in some cases). The Si transistor may be either an n-channel transistor or a p-channel transistor. The Si transistor has higher field-effect mobility than the OS transistor in some cases. Therefore, a Si transistor may be used as the transistor M3 functioning as a reading transistor. Furthermore, the transistor M2 can be formed over the transistor M3 when a Si transistor is used as the transistor M3, in which case the area of the memory cell can be reduced, leading to high integration of the memory device.

Alternatively, the transistor M3 may be an OS transistor. When an OS transistor is used as each of the transistors M2 and M3, the memory cell array 1470 can be formed using only n-channel transistors.

Figure 17H:
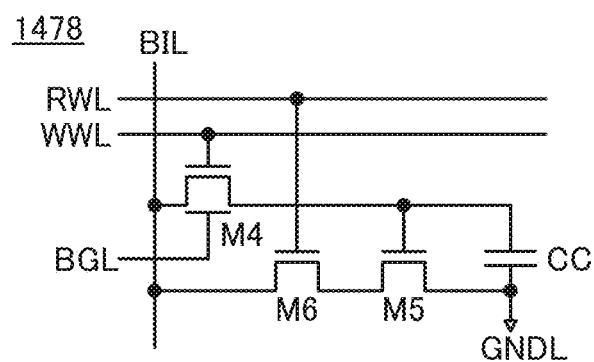

FIG. 17H illustrates an example of a gain-cell memory cell including three transistors and one capacitor. A memory cell 1478 illustrated in FIG. 17H includes transistors M4 to M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wirings RBL and WBL instead of the wiring BIL.

The transistor M4 is an OS transistor with a back gate that is electrically connected to the wiring BGL. Note that the back gate and the gate of the transistor M4 may be electrically connected to each other. Alternatively, the transistor M4 may not include the back gate.

Note that each of the transistors M5 and M6 may be an n-channel Si transistor or a p-channel Si transistor. Alternatively, the transistors M4 to M6 may be OS transistors, in which case the memory cell array 1470 can be formed using only n-channel transistors.

In the case where the semiconductor device described in any of the above embodiments is used in the memory cell 1478, the transistor 200 can be used as the transistor M4, the transistor 300 can be used as the transistors M5 and M6, and the capacitor 100 can be used as the capacitor CC. When an OS transistor is used as the transistor M4, the leakage current of the transistor M4 can be extremely low.

Note that the configurations of the peripheral circuit 1411, the memory cell array 1470, and the like described in this embodiment are not limited to those described above. These circuits, wirings connected to the circuits, circuit elements, and the like can be changed, deleted, or added as needed. In addition, positions of these circuits, wirings connected to the circuits, circuit elements, and the like can be changed and functions of these circuits, wirings connected to the circuits, and circuit elements and the like can be changed, deleted, or added.

The structures described in this embodiment can be used in appropriate combination with any of the structures described in the other embodiments.

Embodiment 4

In this embodiment, an example of a chip 1200 on which the semiconductor device of the present invention is mounted is described with reference to FIGS. 18A and 18B. A plurality of circuits (systems) are mounted on the chip 1200. The technique for integrating a plurality of circuits (systems) on one chip is referred to as system on chip (SoC) in some cases.

Figure 18A:
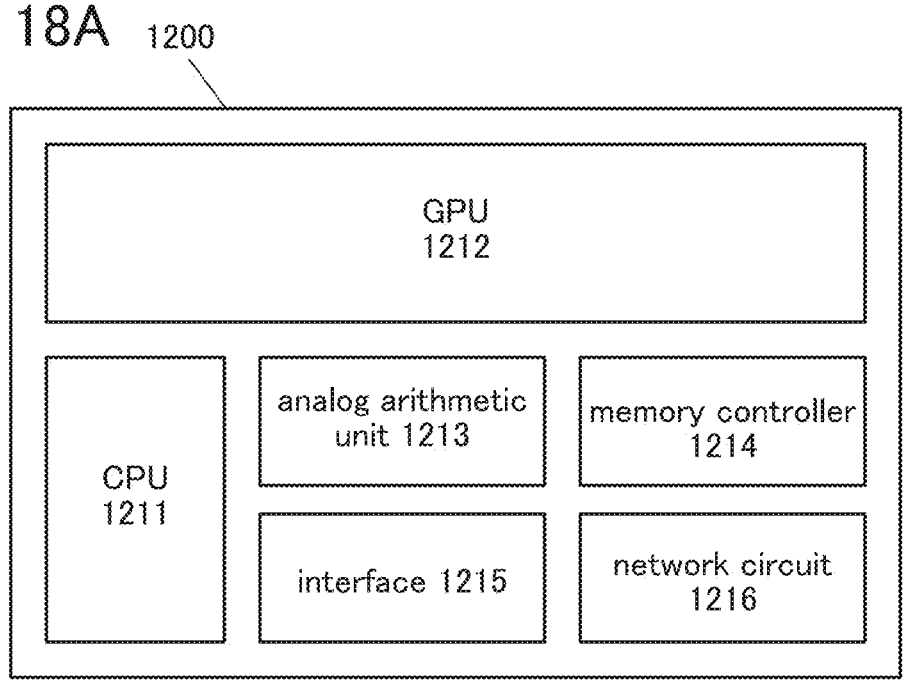
FIGS. 18A and 18B are a block diagram and a schematic view of a semiconductor device of one embodiment of the present invention.

As illustrated in FIG. 18A, the chip 1200 includes a central processing unit (CPU) 1211, a graphics processing unit (GPU) 1212, one or more of analog arithmetic units 1213, one or more of memory controllers 1214, one or more of interfaces 1215, one or more of network circuits 1216, and the like.

Figure 18B:
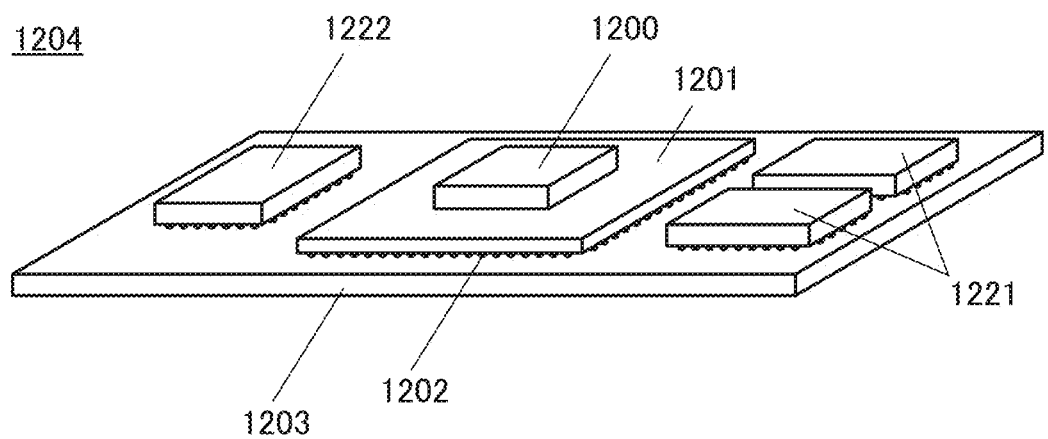

A bump (not illustrated) is provided on the chip 1200, and as illustrated in FIG. 18B, the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the common memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an analog/digital (A/D) converter circuit and a digital/analog (D/A) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for connection with an external connection device such as a display device, a speaker, a microphone, a camera, or a controller. Examples of the controller include a mouse, a keyboard, and a game controller. As such an interface, universal serial bus (USB), high-definition multimedia interface (HDMI) (registered trademark), or the like can be used.

The network circuit 1216 includes a network circuit such as a local-area network (LAN). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit in the GPU 1212 can implement the arithmetic operation in a deep neural network (DNN), a convolutional neural network (CNN), a recurrent neural network (RNN), an autoencorder, a deep Boltzmann machine (DBM), a deep belief network (DBN), or the like; thus, the chip 1200 can be used as an AI chip or the GPU module 1204 can be used as an AI system module.

The structure described in this embodiment can be used in appropriate combination with any of the structures described in the other embodiments.

Embodiment 5

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and solid state drives (SSD). FIGS. 19A to 19E schematically illustrate some structural examples of removable memory devices. A packaged memory chip including the semiconductor device described in the above embodiment is used in a variety of memory devices and removable memories, for example.

FIG. 19A is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

FIG. 19B is a schematic external view of an SD card, and FIG. 19C is a schematic view illustrating the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear side of the substrate 1113, the capacity of the SD card 1110 can be increased. In addition, a wireless chip with a radio communication function may be provided on the substrate 1113. With such a wireless chip, data can be read from and written in the memory chip 1114 by radio communication between the host device and the SD card 1110. The semiconductor device described in the above embodiment can be incorporated in the memory chip 1114 or the like on the substrate 1113.

FIG. 19D is a schematic external view of an SSD, and FIG. 19E is a schematic view illustrating the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear side of the substrate 1153, the capacity of the SSD 1150 can be increased. The semiconductor device described in the above embodiment can be incorporated in the memory chip 1154 or the like on the substrate 1153.

This embodiment can be implemented in an appropriate combination with any of the structures described in the other embodiments and the like.

Embodiment 6

The semiconductor device of one embodiment of the present invention can be used, for example, for a processor such as a CPU and a GPU, or a chip. FIGS. 20A to 20D, FIGS. 20E1 and 20E2, and FIG. 20F illustrate specific examples of an electronic device provided with the processor such as the CPU and the GPU or the chip of one embodiment of the present invention.
<Electronic Device, System>

The GPU or the chip of one embodiment of the present invention can be mounted on a variety of electronic devices. Examples of electronic devices include an electronic device with a relatively large screen, such as a television device, a desktop or laptop personal computer, a monitor of a computer or the like, digital signage, and a large game machine (e.g., a pachinko machine); a camera such as a digital camera or a digital video camera; a digital photo frame; a mobile phone; a portable game console; a portable information terminal; and an audio reproducing device. In addition, when the integrated circuit or the chip of one embodiment of the present invention is provided in an electronic device, the electronic device can include artificial intelligence.

The electronic device of one embodiment of the present invention may include an antenna. With the antenna receiving signal, the electronic device can display an image, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have various functions such as a function of displaying a variety of information (e.g., a still image, a moving image, and a text image) on the display portion, a touch panel function, a function of displaying a calendar, date, time, and the like, a function of executing various kinds of software (programs), a wireless communication function, and a function of reading out a program or data stored in a recording medium. FIGS. 20A to 20D, FIGS. 20E1 and 20E2, and FIG. 20F illustrate examples of the electronic device.
<<Mobile Phone>>

FIG. 20A illustrates a mobile phone (smartphone) which is a type of an information terminal. An information terminal 5500 includes a housing 5510 and a display portion 5511. As input interfaces, a touch panel and a button are provided in the display portion 5511 and the housing 5510, respectively.

The information terminal 5500 can execute an application utilizing artificial intelligence, with the use of the chip of one embodiment of the present invention. Examples of the application utilizing artificial intelligence include an application for interpreting a conversation and displaying its content on the display portion 5511; an application for recognizing the letters, figures, and the like input to the touch panel by a user and displaying them on the display portion 5511; and an application for biometric authentication using fingerprints, voice prints, or the like.

[Information Terminal 1]

FIG. 20B illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the chip of one embodiment of the present invention, like the information terminal 5500 described above. Examples of the application utilizing artificial intelligence include design-support software, text correction software, and menu making software. Furthermore, with the use of the desktop information terminal 5300, novel artificial intelligence can be developed.

Note that although FIGS. 20A and 20B illustrate a smartphone and a desktop information terminal, respectively, as examples of the electronic device, one embodiment of the present invention can also be applied to an information terminal other than the smartphone and the desktop information terminal. Examples of the information terminal other than the smartphone and the desktop information terminal include a personal digital assistant (PDA), a laptop information terminal, and a workstation.

[Household Appliance]

FIG. 20C illustrates an electric refrigerator-freezer 5800 which is an example of a household appliance. The electric refrigerator-freezer 5800 includes a housing 5801, a door for a refrigerator 5802, a door for a freezer 5803, and the like.

When the chip of one embodiment of the present invention is used for the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on food stuffs stored in the electric refrigerator-freezer 5800 and their "consume by" dates, a function of controlling the temperature to be appropriate for the food stuffs stored in the electric refrigerator-freezer 5800, and the like.

Although the electric refrigerator-freezer is described here as an example of a household appliance, a vacuum, a microwave oven, an electric oven, a rice cooker, a water heater, an IH cooker, a water server, a heating-cooling combination appliance such as an air conditioner, a washing machine, a drying machine, an audio visual appliance, and the like can be given as other examples of a household appliance.

[Game Machine]

FIG. 20D illustrates a portable game machine 5200 as an example of a game machine. The portable game machine 5200 includes a housing 5201, a display portion 5202, a button 5203, and the like.

With the use of the GPU or the chip of one embodiment of the present invention in the portable game machine 5200, the portable game machine 5200 with low power consumption can be obtained. Furthermore, heat generation from a circuit can be reduced owing to low power consumption; therefore, the influence of heat generation on the circuit, the peripheral circuit, and the module can be reduced.

Furthermore, when the GPU or the chip of one embodiment of the present invention is used in the portable game machine 5200, the portable game machine 5200 including artificial intelligence can be obtained.

In general, progress of a game, the actions and words of game characters, and expressions of a phenomenon in the game are programed in the game; however, the use of artificial intelligence in the portable game machine 5200 enables expression not limited by the game program. For example, questions posed by the player, progress of the game, timing when an event occurs in the game, the actions and words of the game characters, and the like can be changed for various expressions without being limited by the game program.

In addition, the artificial intelligence can construct a virtual game player and thus, a game that needs a plurality of players can be played by only one human game player with the portable game machine 5200, with the use of a virtual game player constructed by the artificial intelligence as an opponent.

Although the portable game machine is illustrated as an example of a game machine in FIG. 20D, the game machine using the GPU or the chip of one embodiment of the present invention is not limited thereto. Examples of the game machine using the GPU or the chip of one embodiment of the present invention include a home stationary game machine, an arcade game machine installed in an entertainment facility (a game center, an amusement park, or the like), and a throwing machine for batting practice installed in sports facilities.

[Moving Vehicle]

The GPU or the chip of one embodiment of the present invention can be used in an automobile, which is a moving vehicle, and around a driver's seat in the automobile.

FIG. 20E1 illustrates an automobile 5700 as an example of a moving vehicle, and FIG. 20E2 illustrates the periphery of a windshield inside the automobile. FIG. 20E1 illustrates a display panel 5701, a display panel 5702, and a display panel 5703 which are attached to a dashboard, and a display panel 5704 attached to a pillar.

The display panels 5701 to 5703 can provide various kinds of information by displaying a speedometer, a tachometer, a mileage, a fuel meter, a gearshift indicator, air-conditioning settings, and the like. Items displayed on the display panel, their layout, and the like can be changed as appropriate to suit the user's preferences, in which allows more sophisticated design. The display panels 5701 to 5703 can also be used as lighting devices.

The display panel 5704 can compensate for the view obstructed by the pillar (blind areas) by displaying an image taken by an imaging device (not illustrated) provided on the exterior of the automobile 5700. That is, displaying an image taken by the imaging device provided on the exterior of the automobile 5700 eliminates blind areas and enhances of safety. Moreover, displaying an image to compensate for the area that a driver cannot see makes it possible for the driver to confirm safety more easily and comfortably. The display panel 5704 can also be used as a lighting device.

Because the GPU or the chip of one embodiment of the present invention can be used as a component of artificial intelligence, the chip can be used in the automatic driving system of the automobile 5700, for example. The chip can also be used in a system for navigation, risk prediction, or the like. The display panels 5701 to 5704 may display information regarding navigation risk prediction, and the like.

Although the automobile is described as an example of a moving vehicle in the above, the moving vehicle is not limited to the automobile. For example, examples of the moving vehicle include a train, a monorail train, a ship, a flying object (a helicopter, an unmanned aircraft (a drone), an airplane, or a rocket), and these moving vehicles can include a system utilizing artificial intelligence when equipped with the chip of one embodiment of the present invention.

[Broadcasting System]

The GPU or the chip of one embodiment of the present invention can be used in a broadcasting system.

FIG. 20F schematically illustrates data transmission in a broadcasting system. Specifically, FIG. 20F illustrates a path in which a radio wave (a broadcast signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although an ultra-high frequency (UHF) antenna is illustrated as the antenna 5650 in FIG. 20F, a BS/110° CS antenna, a CS antenna, or the like can also be used.

A radio wave 5675A and a radio wave 5675B are broadcast signals for terrestrial broadcasting, and a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 20F and may be satellite broadcasting using an artificial satellite, data broadcasting using an optical line, or the like.

The above-described broadcasting system may utilize artificial intelligence by including the chip of one embodiment of the present invention. When the broadcast data is transmitted from the broadcast station 5680 to the TV 5600 of each household, the broadcast data is compressed by an encoder. The antenna 5650 receives the compressed broadcast data, and then the compressed broadcast data is decompressed by a decoder in the receiving device in the TV 5600. With the use of the artificial intelligence, for example, display pattern included in the image can be recognized in motion compensation prediction, which is one of the compressing methods of the encoder. In addition, in-frame prediction can also be performed utilizing artificial intelligence and the like. Furthermore, for example, when the broadcast data with low resolution is received and displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K, 8K) broadcasting which needs a large amount of broadcast data.

As an application of artificial intelligence in the TV 5600, a recording device including artificial intelligence may be provided in the TV 5600. With such a structure, the artificial intelligence in the recording device can learn the user's preference, so that TV programs that suit for the user's preference can be recorded automatically.

The electronic devices the functions thereof, application examples of the artificial intelligence, their effects, and the like described in this embodiment can be combined with descriptions on the other electronic devices, as appropriate.

This embodiment can be implemented in an appropriate combination with any of the structures described in the other embodiments and the like.

Example

In this example, a transistor having a structure similar to that of the transistor 200 illustrated in FIGS. 1A to 1C was fabricated as the semiconductor device of one embodiment of the present invention. Described here are results of observation of the semiconductor device with a scanning transmission electron microscope (STEM) and measurement of electrical characteristics of the semiconductor device.

Sample 1 of this example has a structure similar to that of the transistor 200. That is, as illustrated in FIGS. 1A to 1C, Sample 1 includes the insulator 214 over a substrate (not illustrated); the insulator 216 over the insulator 214; the conductor 205 embedded in the insulator 216; the insulator 220 over the insulator 216 and the conductor 205; the insulator 222 over the insulator 220; the insulator 224 over the insulator 222; the oxide 230a over the insulator 224; the oxide 230b over the oxide 230a; the oxide 230c over the oxide 230b; the insulator 250 over the oxide 230c; the conductor 260 overlapping with the oxide 230 with the insulator 250 therebetween; the insulator 271 over the conductor 260; the insulator 277 in contact with the top surface of the oxide 230c; the insulator 275 in contact with the top surface of the insulator 277, the side surface of the insulator 250, and the side surface of the conductor 260; the insulator 273 in contact with the top surface of the insulator 271, the side surface of the insulator 275, the side surface of the insulator 277, and the top surface of the oxide 230; the insulator 280 over the insulator 273; and the insulator 282 over the insulator 280.

A manufacturing process of Sample 1 of this example will be described below. Note that the description of FIGS. 4A to 4C, FIGS. 5A to 5C, FIGS. 6A to 6C, FIGS. 7A to 7C, FIGS. 8A to 8C, FIGS. 9A to 9C, FIGS. 10A to 10C, and FIGS. 11A to 11C can be referred to for the details of the manufacturing method of the transistor 200.

As the substrate, a silicon substrate over which a 400-nm-thick thermal oxidation film had been formed was prepared.

Next, as the insulator 214, a 40-nm-thick aluminum oxide film was formed by an RF sputtering method.

Then, as the insulator 216, a silicon oxynitride film was formed by a PECVD method. Then, an opening was formed in the insulator 216 and a stacked-layer film in which tantalum nitride, titanium nitride, and tungsten were stacked in this order was formed as the conductor 205 to be embedded in the opening.

Next, as the insulator 220, a 10-nm-thick silicon oxynitride film was formed by a PECVD method. Then, as the insulator 222, a 10-nm-thick hafnium oxide film was formed by an ALD method.

Next, heat treatment was performed at 400° C. in a nitrogen atmosphere for one hour. In addition, another heat treatment was performed at 400° C. in an oxygen atmosphere for one hour.

Then, as the insulator 224, a 10-nm-thick silicon oxynitride film was deposited by a PECVD method.

Next, the oxide 230a and the oxide 230b were formed. As the oxide 230a, a 5-nm-thick In—Ga—Zn oxide film was formed by a DC sputtering method. The deposition of the oxide 230a was performed under the following conditions: a target having an atomic ratio of In:Ga:Zn=1:3:4 was used, an oxygen gas at 45 sccm was used as the deposition gas, the deposition pressure was 0.7 Pa (measured by Miniature Gauge MG-2 manufactured by CANON ANELVA CORPORATION), the deposition power was 500 W, the substrate temperature was 200° C., and the target-substrate distance was 60 mm.

Next, as the oxide 230b, a 20-nm-thick In—Ga—Zn oxide film was formed by a DC sputtering method. The deposition of the oxide 230b was performed under the following conditions: a target having an atomic ratio of In:Ga:Zn=4:2:4.1 was used, an argon gas at 40 sccm and an oxygen gas at 5 sccm were used as the deposition gases, the deposition pressure was 0.7 Pa (measured by Miniature Gauge MG-2 manufactured by CANON ANELVA CORPORATION), the deposition power was 500 W, the substrate temperature was 130° C., and the target-substrate distance was 60 mm.

Note that heat treatment was performed at 400° C. in a nitrogen atmosphere for one hour just after the deposition of the oxides 230a and 230b. In addition, heat treatment was performed at 400° C. in an oxygen atmosphere for one hour.

Next, the oxide 230c was formed. As the oxide 230c, a 5-nm-thick In—Ga—Zn oxide film was formed by a DC sputtering method. The deposition of the oxide 230c was performed under the following conditions: a target having an atomic ratio of In:Ga:Zn=4:2:4.1 was used, an oxygen gas at 45 sccm was used as the deposition gas, the deposition pressure was 0.7 Pa (measured by Miniature Gauge MG-2 manufactured by CANON ANELVA CORPORATION), the deposition power was 500 W, the substrate temperature was 130° C., and the target-substrate distance was 60 mm.

Next, the insulator 250, the conductor 260, and the insulator 271 were formed. As the insulator 250, a 10-nm-thick silicon oxynitride film was formed by a PECVD method. As the conductor 260, a 10-nm-thick titanium nitride film was formed by an ALD method and a 30-nm-thick tungsten film was formed thereover by a metal CVD method. As the insulator 271, a 5-nm-thick aluminum oxide film was formed by an ALD method and a 100-nm-thick silicon oxynitride film was formed thereover by a PECVD method.

Next, heat treatment was performed at 400° C. in a nitrogen atmosphere for one hour.

Next, the insulator 277A to be the insulator 277 and the insulator 277B were formed. As each of the insulators 277A and 277B, a 2-nm-thick aluminum oxide film was formed by an RF sputtering method. The deposition of the insulators 277A and 277B was performed under the following conditions: an $Al_2O_3$ target was used, an argon gas at 25 sccm and an oxygen gas at 25 sccm were used as the deposition gases, the deposition pressure was 0.4 Pa (measured by B-A Gauge BRG-1B manufactured by CANON ANELVA CORPORATION), the deposition power was 2500 W, the substrate temperature was 250° C., and the target-substrate distance was 60 mm.

Next, the insulating film 275A to be the insulator 275 was formed. As the insulating film 275A, a 15-nm-thick silicon oxynitride film was formed by a PECVD method.

Next, dry etching was performed on the insulating film 275A, the insulator 277A, and the insulator 277B, so that the insulators 275 and 277 were formed.

Next, heat treatment was performed at 400° C. in a nitrogen atmosphere for one hour.

Next, the insulator 273 was formed. As the insulator 273, a 20-nm-thick aluminum oxide film was formed by an RF sputtering method. Note that the deposition conditions of the insulator 273 were similar to those of the insulator 277.

Next, heat treatment was performed at 350° C. in an oxygen atmosphere for one hour.

Next, the insulator 280 was formed. As the insulator 280, a 500-nm-thick silicon oxynitride film was formed by a PECVD method. Then, CMP treatment was performed on the insulator 280 until the thickness of the insulator 280 overlapping with the conductor 260 became 120 nm.

Next, the insulator 282 was formed. As the insulator 282, a 40-nm-thick aluminum oxide film was formed by an RF sputtering method. Note that the deposition conditions of the insulator 282 were similar to those of the insulator 277.

Next, heat treatment was performed at 350° C. in an oxygen atmosphere for one hour.

In the above manner, Sample 1 with a channel length of 60 nm and a channel width of 60 nm was fabricated. Note that an insulating film functioning as an interlayer film, a conductive film functioning as a wiring, and the like were further provided over the insulator 282.

Figure 21A:
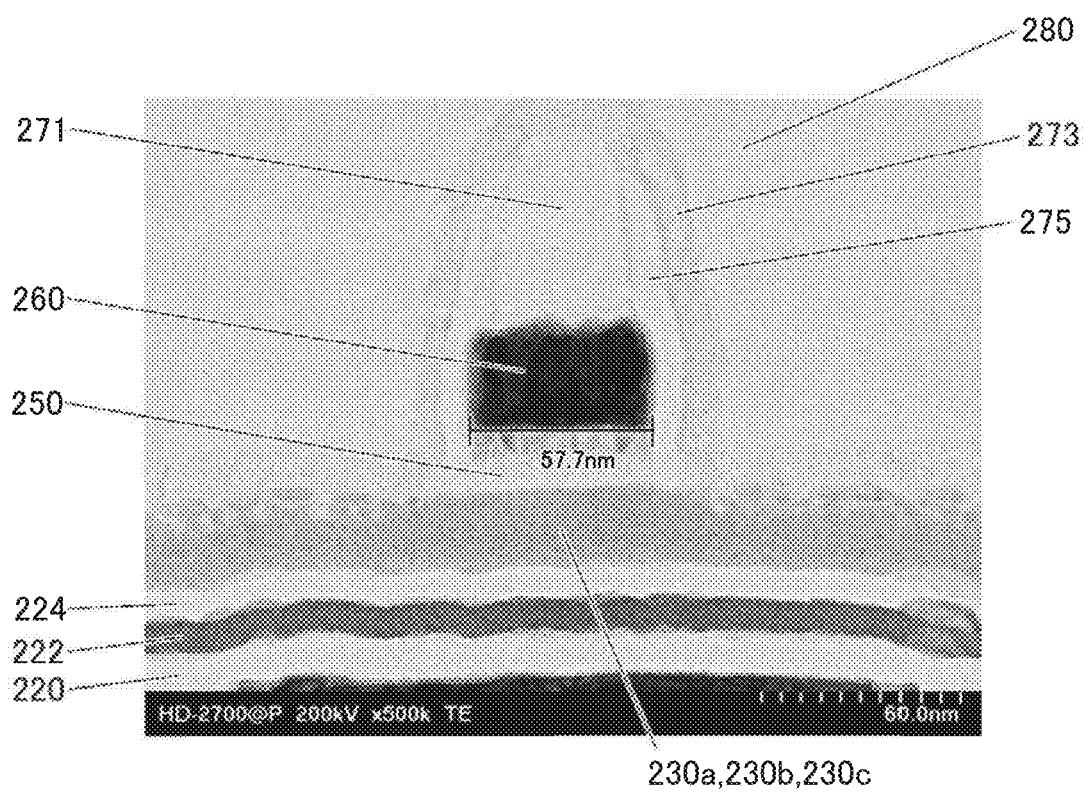
FIGS. 21A and 21B are a cross-sectional TEM image and an EDX mapping image of an example of the present invention.

A cross-sectional STEM image of Sample 1 was taken by HD-2700 manufactured by Hitachi High Technologies Corporation at an accelerating voltage of 200 kV and an analysis by energy dispersive X-ray spectroscopy (EDX) was performed. FIG. 21A is a cross-sectional STEM image taken at a magnification of 0.5 million times and FIG. 21B is a mapping image obtained by observing the Al—K ray in the EDX analysis taken at a magnification of 0.4 million times.

Figure 21B:
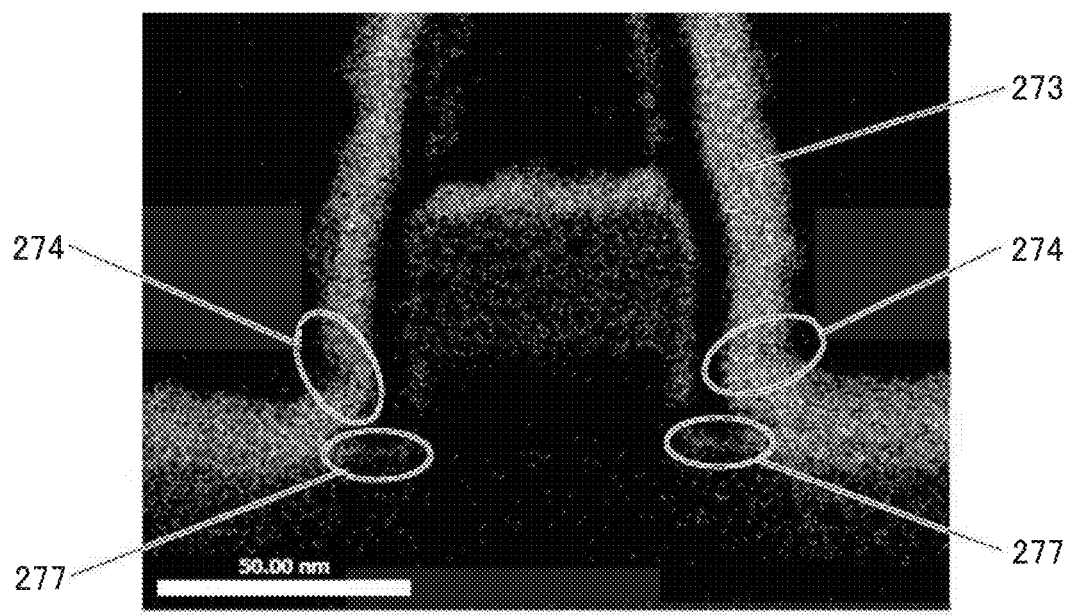

Although the insulator 277 is difficult to observe in the STEM image of FIG. 21A, the mapping image of FIG. 21B shows that the insulator 277 containing aluminum oxide lies under the insulator 275. As illustrated in FIG. 21B, part of the aluminum oxide is left on the side surface of the conductor 260; however, the side surface of the insulator 250 is not fully covered with the aluminum oxide, and thus the side surface of the insulator 250 is in contact with the insulator 275. This indicates that an oxygen diffusion path is secured between the insulator 275 and the insulator 250. In addition, in FIG. 21B, the region 274 in which the insulator 273 is locally thin is observed in the vicinity of the insulator 277.

The $I_d$-$V_g$ characteristics (drain current-gate voltage characteristics) of Sample 1 having the above structure were measured using a semiconductor parameter analyzer manufactured by Keysight Technologies. The $I_d$-$V_g$ characteristics were measured under the following conditions: the drain voltage ($V_d$) was 0.1 V or 1.2 V; the back gate voltage ($V_{bg}$) was 0 V or −3 V; and the gate voltage was swept from −4.0 V to 4.0 V in increments of 0.1 V.

Figure 22A:
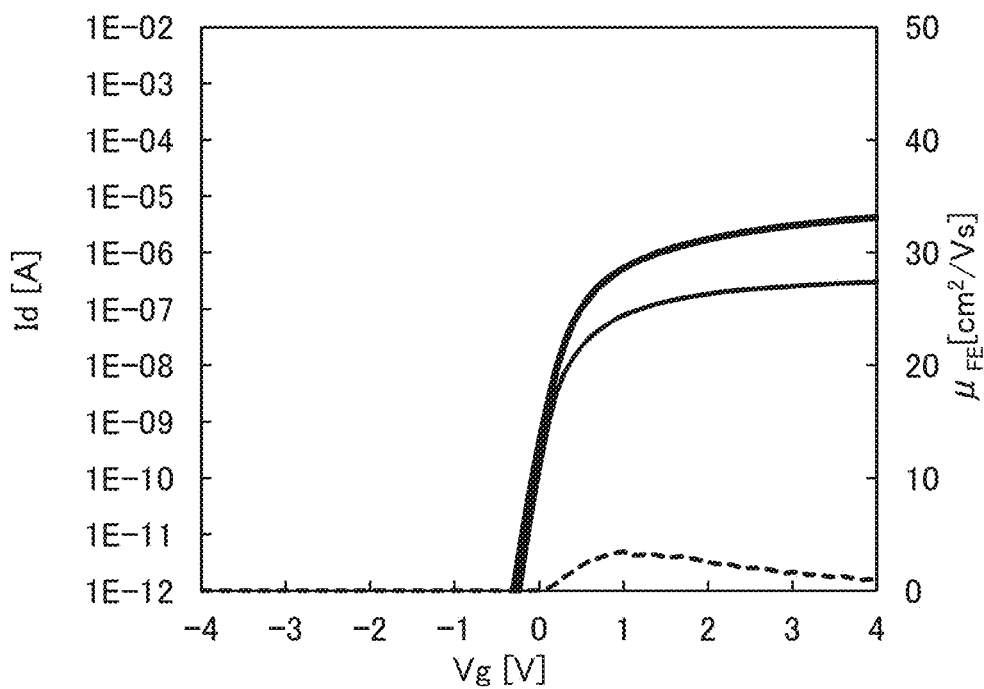
FIGS. 22A and 22B each show electrical characteristics of an example of the present invention.
Figure 22B:
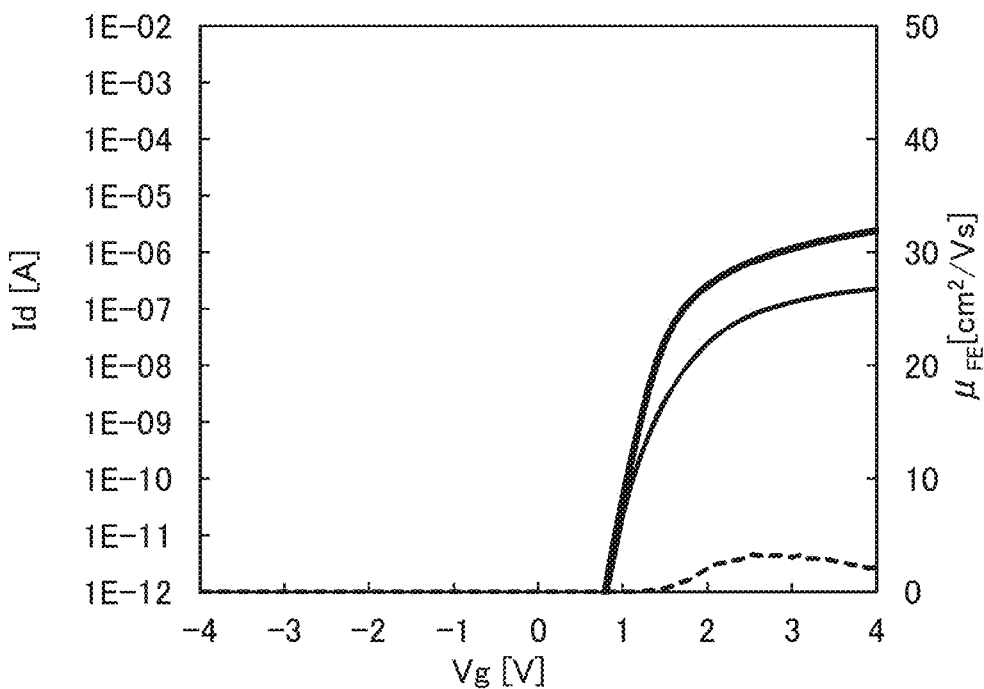

FIG. 22A shows the measurement results of the $I_d$-$V_g$ characteristics at $V_{bg}$ of 0 V, and FIG. 22B shows the measurement results of the $I_d$-$V_g$ characteristics at $V_{bg}$ of −3 V. In each graph, the horizontal axis represents gate voltage $V_g$ [V], the first vertical axis represents drain current $I_d$ [A], and the second vertical axis represents field effect mobility $\mu_{FE}$ [cm$^2$/Vs] at $V_d$ of 1.2 V. The drain current at $V_d$ of 0.1 V is shown by a fine solid line, and the drain current at $V_d$ of 1.2 V is shown by a thick solid line.

Table 1 shows the on-state current $I_{on}$ at $V_d$ of 1.2 V and $V_g$ of 3.3 V, the field-effect mobility $\mu_{FE}$ at $V_d$ of 0.1 V, and the S-value at $V_d$ of 1.2 V in the $I_d$-$V_g$ characteristics shown in FIGS. 22A and 22B.

TABLE 1

| | $V_{bg}$ = 0 V | $V_{bg}$ = −3 V |
|---|---|---|
| $I_{on}$ [μA] ($V_d$ = 1.2 [V], $V_g$ = 3.3 [V]) | 3.38 | 1.51 |
| $\mu_{FE}$ [cm$^2$/Vs] ($V_d$ = 0.1 [V]) | 3.47 | 3.32 |
| S-value [mV/dec.] ($V_d$ = 1.2 [V]) | 114.12 | 125.76 |

From FIGS. 22A and 22B and Table 1, it is found that the on-state current, the S-value, and the field-effect mobility are favorable in Sample 1 both at $V_{bg}$ of 0 V and $V_{bg}$ of −3 V. Furthermore, Sample 1 has normally-off electrical characteristics at $V_{bg}$ of −3 V. In particular, the S-value at $V_{bg}$ of −3 V is substantially the same as the S-value at $V_{bg}$ of 0 V.

Figure 23A:
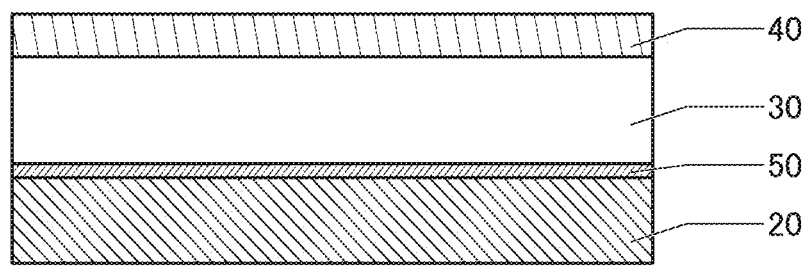
FIGS. 23A and 23B each illustrate Sample 2A and Sample 2B of an example of the present invention.
Figure 23B:
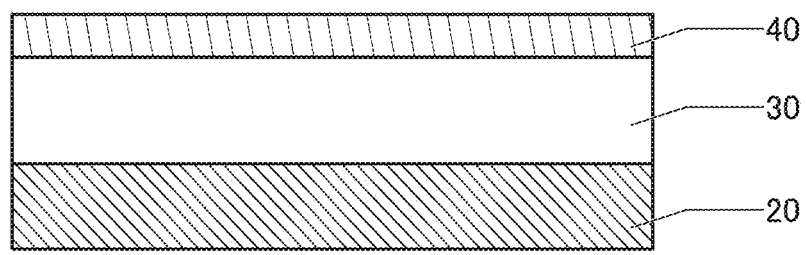

Next, the sheet resistances of Sample 2A and Sample 2B were measured to confirm that the carrier density of a portion of the low-resistance region 242 of Sample 1 that overlaps with the insulator 277 is maintained by the insulator 277. Here, FIGS. 23A and 23B illustrate the structures of Sample 2A and Sample 2B, respectively.

Sample 2A includes a silicon substrate (not illustrated) over which a 400-nm-thick thermal oxidation film had been formed, a 40-nm-thick oxide 20 over the silicon substrate, a 2-nm-thick insulator 50 over the oxide 20, a 50-nm-thick insulator 30 over the insulator 50, and a 20-nm-thick insulator 40 over the insulator 30. Here, the oxide 20, the insulator 50, the insulator 30, and the insulator 40 correspond to the oxide 230b of the transistor 200, the insulator 277 of the transistor 200, the insulator 275 of the transistor 200, and the insulators 273 and 282 of the transistor 200, respectively.

The oxide 20 was formed by a DC sputtering method. The deposition of the oxide 20 was performed under the following conditions: a target having an atomic ratio of In:Ga:Zn=4:2:4.1 was used, an argon gas at 40 sccm and an oxygen gas at 5 sccm were used as the deposition gases, the deposition pressure was 0.4 Pa (measured by Baratron vacuum gauge manufactured by MKS Japan, Inc.), the deposition power was 500 W, the substrate temperature was room temperature, and the target-substrate distance was 60 mm.

The insulator 50, the insulator 30, and the insulator 40 were formed under the same conditions as the insulator 277, the insulators 275 and 280, and the insulators 273 and 282, respectively.

After the formation of the oxide 20, heat treatment was performed at 400° C. in a nitrogen atmosphere for one hour. In addition, another heat treatment was performed at 400° C. in an oxygen atmosphere for one hour. After the formation of the insulator 30, heat treatment was performed at 400° C. in a nitrogen atmosphere for one hour. After the formation of the insulator 40, heat treatment was performed at 400° C. in a nitrogen atmosphere for one hour. In addition, another heat treatment was performed at 400° C. in an oxygen atmosphere for one hour.

Note that the structure of Sample 2B is the same as that of Sample 2A except that Sample 2A does not include the insulator 50.

In Sample 2A and Sample 2B formed in the above manner, the surface of the oxide 20 was exposed and the sheet resistance and the carrier density of the oxide 20 were measured.

As a result, the sheet resistance of the oxide 20 of Sample 2A was 8316Ω/□ and the sheet resistance of the oxide 20 of Sample 2B was 56252Ω/□. This indicates that, with the insulator 50, a decrease in the carrier density of the oxide 20 due to oxygen addition can be suppressed. Thus, this suggests that the carrier density of the portion of the oxide 230 of Sample 1 that overlaps with the insulator 277 is sufficiently higher than that of the channel formation region, whereby the region 242 is formed.

At least part of the structure, the method, and the like described in this example can be implemented in appropriate combination with any of the embodiments described in this specification.

This application is based on Japanese Patent Application Serial No. 2018-006870 filed with Japan Patent Office on Jan. 19, 2018, the entire contents of which are hereby incorporated by reference.

What is claimed is:

1. A semiconductor device comprising:
a first insulator over a substrate;
an oxide semiconductor over the first insulator;
a second insulator over the oxide semiconductor, the second insulator functioning as a gate insulator;
a conductor over and in contact with the second insulator, the conductor functioning as a gate electrode;
a third insulator over and in contact with a top surface of the oxide semiconductor;
a fourth insulator over and in contact with a top surface of the third insulator, wherein the fourth insulator is in contact with side surfaces of the second insulator and the conductor; and
a fifth insulator over and in contact with the top surface of the oxide semiconductor, wherein the fifth insulator is in contact with side surfaces of the third insulator and the fourth insulator,
wherein the third insulator has a lower oxygen permeability than the fourth insulator.

2. The semiconductor device according to claim 1,
wherein the oxide semiconductor comprises In, an element M, and Zn, and
wherein the element M is Al, Ga, Y, or Sn.

3. The semiconductor device according to claim 1, wherein each of the third insulator and the fifth insulator comprises aluminum oxide.

4. The semiconductor device according to claim 1, wherein a thickness of the third insulator is thinner than a thickness of the second insulator.

5. The semiconductor device according to claim 1, wherein a thickness of the third insulator is thinner than a thickness of the fifth insulator.

6. The semiconductor device according to claim 1, wherein at least part of a region of the oxide semiconductor that overlaps with the third insulator has a higher carrier density than a region of the oxide semiconductor that overlaps with the conductor.

7. A semiconductor device comprising:
a first insulator over a substrate;
a first oxide semiconductor over the first insulator;
a second oxide semiconductor over and in contact with the first oxide semiconductor;
a second insulator over and in contact with the second oxide semiconductor, the second insulator functioning as a gate insulator;
a conductor over and in contact with the second insulator, the conductor functioning as a gate electrode;
a third insulator over and in contact with a top surface of the second oxide semiconductor;
a fourth insulator over and in contact with a top surface of the third insulator, wherein the fourth insulator is in contact with side surfaces of the second insulator and the conductor; and
a fifth insulator over and in contact with a top surface of the first oxide semiconductor, wherein the fifth insulator is in contact with side surfaces of the third insulator and the fourth insulator,
wherein the third insulator has a lower oxygen permeability than the fourth insulator, and
wherein the fourth insulator is a sidewall.

8. The semiconductor device according to claim 7,
wherein each of the first oxide semiconductor and the second oxide semiconductor comprises In, an element M, and Zn, and
wherein the element M is Al, Ga, Y, or Sn.

9. The semiconductor device according to claim 7, wherein each of the third insulator and the fifth insulator comprises aluminum oxide.

10. The semiconductor device according to claim 7, wherein a thickness of the third insulator is thinner than a thickness of the second insulator.

11. The semiconductor device according to claim 7, wherein a thickness of the third insulator is thinner than a thickness of the fifth insulator.

12. The semiconductor device according to claim 7,
wherein the fifth insulator comprises a first region and a second region,
wherein the first region is in contact with the fourth insulator, and
wherein the first region has a higher oxygen permeability than the second region.

13. The semiconductor device according to claim 12, wherein a thickness of the first region is thinner than a thickness of the second region.

14. The semiconductor device according to claim 12, wherein the first region has a lower density than the second region.

15. The semiconductor device according to claim 12, wherein the first region comprises an opening reaching the third insulator.

* * * * *